US008629729B2

(12) United States Patent
Hoppensteadt et al.

(10) Patent No.: US 8,629,729 B2
(45) Date of Patent: Jan. 14, 2014

(54) AGGREGATED SPIN-TORQUE NANO-OSCILLATORS

(75) Inventors: Frank C. Hoppensteadt, Carefree, AZ (US); Andrew D. Kent, New York, NY (US); Ferran Macià Bros, New York, NY (US)

(73) Assignee: New York University, New York, NY (US)

( * ) Notice: Subject to any disclaimer, the term of this patent is extended or adjusted under 35 U.S.C. 154(b) by 277 days.

(21) Appl. No.: 13/187,724

(22) Filed: Jul. 21, 2011

(65) Prior Publication Data

US 2012/0062220 A1 Mar. 15, 2012

Related U.S. Application Data

(60) Provisional application No. 61/381,301, filed on Sep. 9, 2010.

(51) Int. Cl.
*H03L 7/26* (2006.01)
(52) U.S. Cl.
USPC ....... 331/94.1; 257/414; 257/421; 360/324.1; 335/296; 438/3
(58) Field of Classification Search
USPC .................. 360/110; 257/414, 421; 335/296; 331/94.1, 107 DP
See application file for complete search history.

(56) References Cited

U.S. PATENT DOCUMENTS

| 5,695,864 | A | 12/1997 | Slonczewski |
| 7,859,349 | B2 * | 12/2010 | Eyckmans et al. ........... 331/94.1 |
| 8,227,099 | B2 * | 7/2012 | Dieny et al. ................ 428/811.2 |
| 2006/0221507 | A1 | 10/2006 | Sato et al. |
| 2009/0080106 | A1 | 3/2009 | Shimizu et al. |
| 2010/0142088 | A1 | 6/2010 | Iwasaki et al. |

FOREIGN PATENT DOCUMENTS

WO 2009050945 A1 4/2009

OTHER PUBLICATIONS

International Search Report for PCT/US2011/044790 mailed Feb. 9, 2012, 8 pages.
Izhikevich, E. et al., "Polychronous wavefront computations," International Journal of Bifurcation and Chaos, vol. 19 No. 5, 2009, pp. 1733-1739, World Scientific Publishing Co.
Izhikevich, E., "Polychronization: Computation with Spikes," Neural Computation, vol. 18, 2006, pp. 245-282, Massachusetts Institute of Technology.

(Continued)

*Primary Examiner* — Arnold Kinkead
(74) *Attorney, Agent, or Firm* — Withrow & Terranova, P.L.L.C.

(57) ABSTRACT

A nano-oscillator magnetic wave propagation system has a group of aggregated spin-torque nano-oscillators (ASTNOs), which share a magnetic propagation material. Each of the group of ASTNOs is disposed about an emanating point in the magnetic propagation material. During a non-wave propagation state of the nano-oscillator magnetic wave propagation system, the magnetic propagation material receives a polarizing magnetic field. During a wave propagation state of the nano-oscillator magnetic wave propagation system, each of the group of ASTNOs initiates spin waves through the magnetic propagation material, such that a portion of the spin waves initiated from each of the group of ASTNOs combine to produce an aggregation of spin waves emanating from the emanating point. The aggregation of spin waves may provide a sharper wave front than wave fronts of the individual spin waves initiated from each of the group of ASTNOs.

22 Claims, 31 Drawing Sheets

(56) References Cited

OTHER PUBLICATIONS

Narendra, V. et al., "Methods for polychronous wavefront computation," Draft copy, Jun. 11, 2009, 37 pages, New York University School of Medicine.

Baibich, M. N. et al., Giant magnetoresistance of (001)Fe/(001)Cr Magnetic Superlattices, Physical Review Letters, vol. 61, No. 21, Nov. 21, 1988, pp. 2472-2475, The American Physical Society.

Binasch, G. et al., "Enhanced magnetoresistance in layered magnetic structures with antiferromagnetic interlayer exchange," Physical Review B, vol. 39, No. 7, Mar. 1, 1989, pp. 4828-4830, The American Physical Society.

Slonczewski, J. C., "Current driven excitation of magnetic multilayers," Journal of Magnetism and Magnetic Materials, vol. 159, 1996, pp. L1-L7, Elsevier Science B.V.

Berger, L., "Emission of spin waves by a magnetic multilayer traversed by a current," Physical Review B, vol. 54, No. 13, Oct. 1, 1996, pp. 9353-9358, The American Physical Society.

Slonczewski, J. C., "Excitation of spin waves by an electric current," Journal of Magnetism and Magnetic Materials, vol. 195, 1999, pp. L261-L268, Elsevier Science B.V.

Tsoi, M. et al., "Generation and detection of phase-coherent current-driven magnons in magnetic multilayers," Nature, vol. 406, Jul. 6, 2000, pp. 46-48, Macmillan Magazines Ltd.

Kiselev, S. I. et al., "Microwave oscillations of a nanomagnet driven by a spin-polarized current," Nature, vol. 435, Sep. 25, 2005, pp. 380-383, Mature Publishing Group.

Rippard, W. H. et al., "Direct-current induced dynamics in Co90Fe10/Ni80Fe20 point contacts," Physical Review Letters, vol. 92, No. 2, Jan. 16, 2004, pp. 027201-1-027201-4, The American Physical Society.

Kent, A. D. et al., "Spin-transfer-induced precessional magnetization reversal," Applied Physics Letters, vol. 84, No. 19, May 10, 2004, pp. 3897-3899, American Institute of Physics.

Kaka, S. et al., "Mutual phase-locking of microwave spin torque nano-oscillators," Nature, vol. 437, Sep. 15, 2005, pp. 389-399, Nature Publishing Group.

Mancoff, F. B. et al., "Phase-locking in double-point-contact spin-transfer devices," Nature, vol. 437, Sep. 15, 2005, pp. 393-395, Nature Publishing Group.

Grollier, J. et al., "Field dependence of magnetization reversal by spin transfer," Physical Review B, vol. 67, 2003, 8 pages, The American Physical Society.

Choi, S. et al., "Spin-wave interference," Applied Physics Letters, vol. 89, 2006, 3 pages, American Institute of Physics.

Choi, S. et al., "Double-contact spin-torque nano-oscillator with optimized spin-wave coupling: Micromagnetic modeling," Applied Physics Letters, vol. 90, 2007, 3 pages, American Institute of Phsyics.

Lee, K. et al., "Conceptual design of spin wave logic gates based on a Mach-Zehnder-type spin wave interferometer for universal logic functions," Journal of Applied Physics, vol. 104, 2008, 4 pages, American Institute of Phsyics.

Bance, S. et al., "Micromagnetic calculation of spin wave propagation for magnetologic devices," Journal of Applied Physics, vol. 103, 2008, 3 pages, American Institute of Physics.

Rippard, W. H. et al., "Injection locking and phase control of spin transfer nano-oscillators," Physical Review Letters, vol. 95, Aug. 5, 2005, 4 pages, The American Physical Society.

Pufall, M. R. et al., "Electrical measurement of spin-wave interactions of proximate spin transfer nanooscillators," Physical Review Letters, vol. 97, 2006, 4 pages, The American Physical Society.

Bonin, R. et al., "Analytical treatment of synchronization of spin-torque oscillators by microwave magnetic fields," The European Physical Journal B, vol. 68, 2009, pp. 221-231.

Zhou, Y. et al., "Intrinsic phase shift between a spin torque oscillator and an alternating current," Journal of Applied Physics, vol. 101, 2007, 3 pages, American Institute of Physics.

Rezende, S. M. et al., "Spin-wave theory for the dynamics induced by direct currents in magnetic multilayers," Physical Review Letters, vol. 94, Jan. 28, 2005, 4 pages, The American Physical Society.

Slavin, A. et al., "Approximate theory of microwave generation in a current-driven magnetic nanocontact magnetized in an arbitrary direction," IEEE Transactions on Magnetics, vol. 41, No. 4, Apr. 2005, pp. 1264-1273, IEEE.

Slavin, A. et al., "Theory of mutual phase locking of spin-torque nanosized oscillators," Physical Review B, vol. 74, 2006, 4 pages, The American Physical Society.

Hoppensteadt, F., "Activity patterns in networks stabilized by background oscillators," Biological Cybernetics, May 1, 2009, 5 pages.

Izhikevich, E., "Dynamical systems in neuroscience: the geometry of excitability and bursting," MIT Press, 2007, pp. 37-38.

Hoppensteadt, F. et al., "Weakly connected neural networks," Springer 1997, 1 page.

Carrillo, H. et al., "Unfolding an electronic integrate-and-fire circuit," Biological Cybernetics, vol. 102, 2010, pp. 1-8.

Chua, L., "Memristor—the missing circuit element," Proceedings of IEEE, vol. 18, No. 5, Sep. 1971, pp. 507-519, IEEE.

Chua, L. et al., "Memristive devices and systems," Proceedings of IEEE, vol. 64 No. 2, Feb. 1976, pp. 209-223, IEEE.

Strukov, D. et al., "The missing memristor found," Nature, vol. 453, May 1, 2008, pp. 80-83, Nature Publishing Group.

Yang, J. et al., "Memristive switching mechanism for metal/oxide/metal nanodevices," Nanotechnology, vol. 3, Jul. 2008, pp. 429-433, Macmillan Publishers Limited.

Borghetti, J. et al., "Electrical transport and thermometry of electroformed titanium dioxide memristive switches," Journal of Applied Physics, vol. 106, 2009, pp. 5 pages, American Institute of Physics.

Borghetti, J. et al., "A hybrid nanomemristor/transistor logic circuit capable of self-programming," PNAS, vol. 106, No. 6, Feb. 10, 2009, pp. 1699-1703, The National Academy of Sciences of the USA.

Ruotolo, A. et al., "Phase-locking of magnetic vortices mediated by antivortices," Nature Nanotechnology, vol. 4, Aug. 2009, pp. 528-532, Macmillan Publishers Limited.

Likharev, K. K., "Superconducting weak links," Reviews of Modern Physics, vol. 51, No. 1, Jan. 1979, pp. 101-159, American Physical Society.

Hoppensteadt, F., "An introduction to the mathematics of neurons," Cambridge University Press, 1997, pp. 59-61.

Likharev, K. K. et al., "RSFQ logic/ memory family: a new Josephson-Junction Technology for sub-terahertz-clock-frequency digital systems," IEEE Transaction on Applied Superconductivity, vol. 1 No. 1, Mar. 1991, pp. 3-28, IEEE.

Bellman, R. et al.,"Differential-difference equations," Academic Press, 1963, pp. 98.

Cheng, X. et al., "Switching characteristics of phase change memory cell integrated with metal-oxide semiconductor field effect transistor," Chinese Phys. Lett., vol. 25, No. 5, 2008, pp. 1848-1849, Chinese Physical Society and IOP Publishing Ltd.

International Preliminary Report on Patentability for PCT/US2011/044790 mailed Mar. 21, 2013, 5 pages.

* cited by examiner

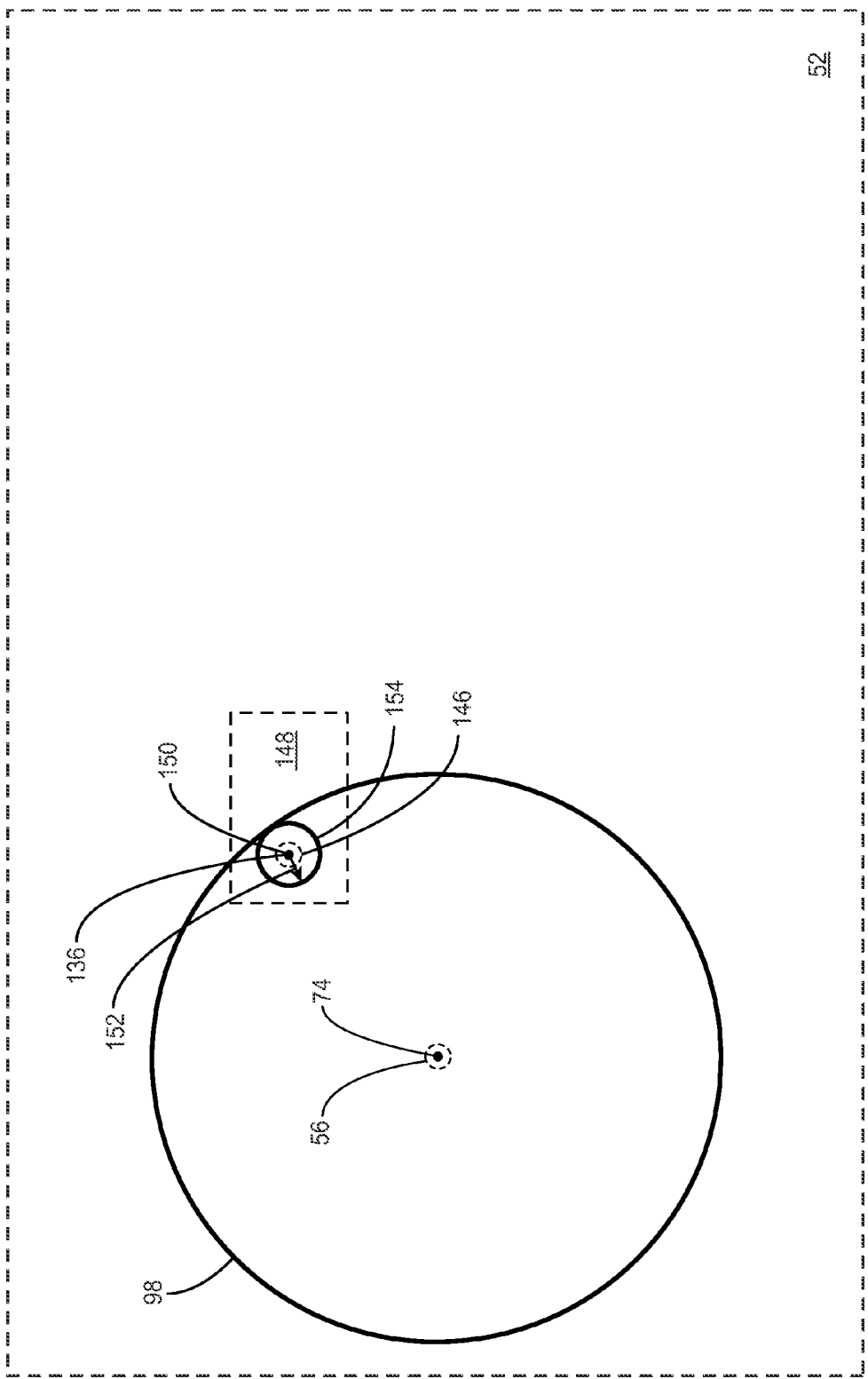

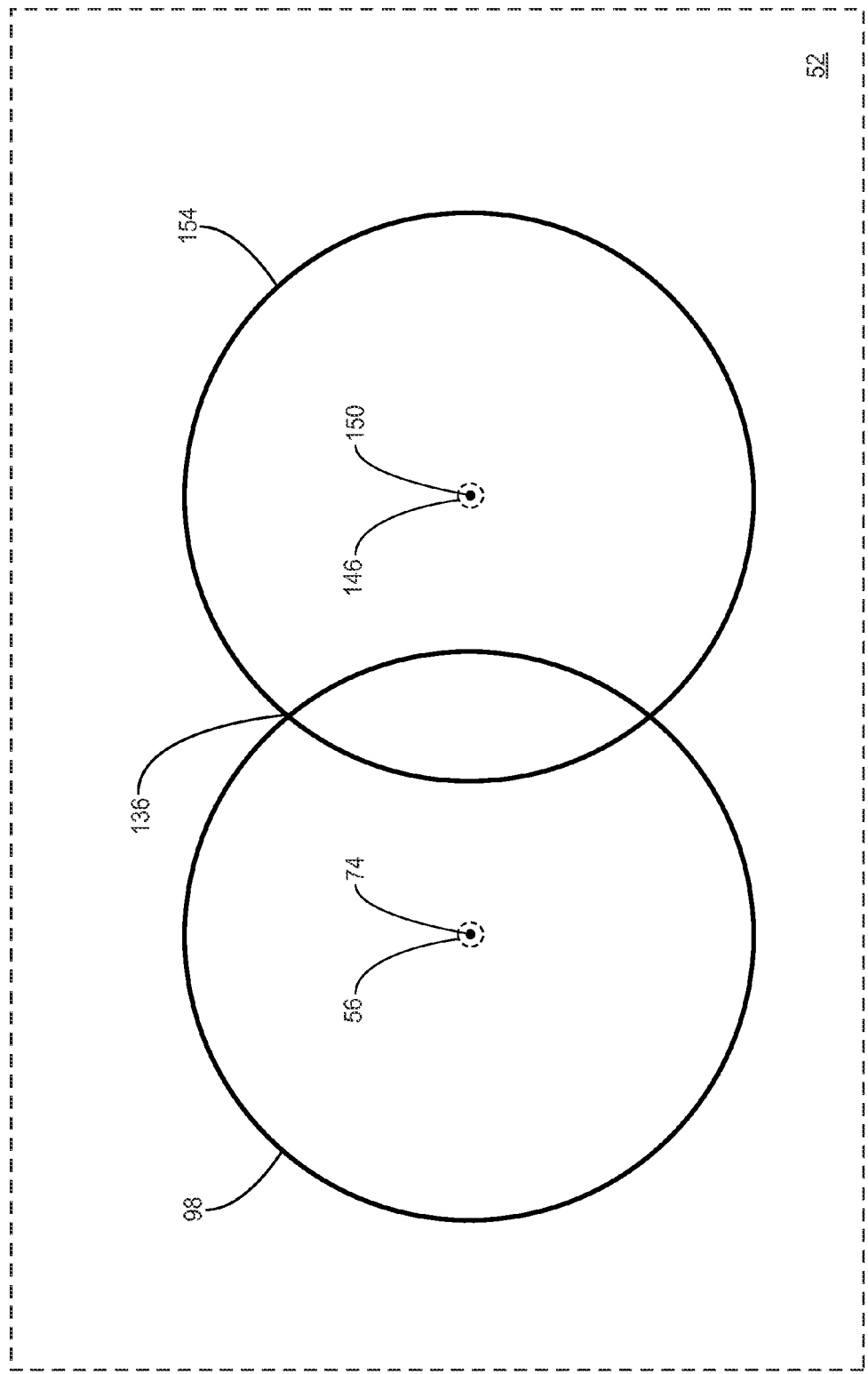

AGGREGATED SPIN-TORQUE NANO-OSCILLATORS

This application claims the benefit of provisional patent application Ser. No. 61/381,301, filed Sep. 9, 2010, the disclosure of which is hereby incorporated herein by reference in its entirety.

GOVERNMENT SUPPORT

This invention was made with government funds under DARPA contract No. HR0011-07-3-0002 and ARO contract No. W911NF-08-1-0317. The U.S. government has certain rights in this invention.

FIELD OF THE DISCLOSURE

Embodiments of the present disclosure relate to spin-torque nano-oscillators, which may be used to generate spin waves that propagate through magnetic propagation materials.

BACKGROUND OF THE DISCLOSURE

A spin-torque nano-oscillator (STNO) is based on an interaction of a spin-polarized current with a magnetic film. The interaction results in two effects, which are giant magnetoresistance (GMR) and spin-transfer torque. FIG. 1 shows a frontwise cross-section of an STNO 10 according to the prior art. The STNO 10 includes a spin polarizing layer 12, a conductive spacer layer 14 over the spin polarizing layer 12, and a magnetic film 16 over the conductive spacer layer 14. Both the spin polarizing layer 12 and the magnetic film 16 are magnetic materials, such as ferromagnetic materials. As such, the spin polarizing layer 12 has a net polarizing magnetic moment 18, which may be based on permanent magnetization of the spin polarizing layer 12 or from external magnetization (not shown) of the spin polarizing layer 12. The magnetic film 16 has small magnetic elements having magnetic moments 20. In the absence of other influences, the magnetic moments 20 may be approximately aligned with a polarizing magnetic field 22, which may be applied to the magnetic film 16 from an external source (not shown).

FIG. 2 shows details of the STNO 10 illustrated in FIG. 1 according to the prior art. During operation, the STNO 10 receives an entering excitation current EDI. The entering excitation current EDI includes electrons, which are used as charge carriers. Each of the charge carriers has a property known as spin, which is a small quantity of angular momentum intrinsic to the charge carrier. The entering excitation current EDI is normally un-polarized, such that orientation of the spin of the charge carriers is random. However, by passing the entering excitation current EDI through the spin polarizing layer 12 and since the spin polarizing layer 12 has the net polarizing magnetic moment 18, the current inside the spin polarizing layer 12 becomes spin-polarized to provide a spin-polarized excitation current SDI to the conductive spacer layer 14. The conductive spacer layer 14 substantially magnetically isolates the magnetic film 16 from the spin polarizing layer 12, such that the net polarizing magnetic moment 18 does not significantly magnetically influence the magnetic moments 20 of the small magnetic elements in the magnetic film 16.

The spin-polarized excitation current SDI is forwarded through the conductive spacer layer 14 into the magnetic film 16. In an STNO, polarization of the charge carriers in the spin-polarized excitation current SDI produces an excitation of the magnetic moments 20 of the small magnetic elements in the magnetic film 16, such that the spin-polarized excitation current SDI causes the magnetic moments 20 to precess. As such, a spin-transfer torque effect is exerted by the spin-polarized excitation current SDI on the magnetic film 16. Specifically, when the polarization of the charge carriers and magnetization of the film are not parallel, a spin-transfer torque will be exerted to alter the direction of the magnetic moments 20 of the small magnetic elements in the magnetic film 16. This spin-transfer torque is propagated to adjacent small magnetic elements in the magnetic film 16, thereby altering the directions of the magnetic moments 20 of the adjacent small magnetic elements in the magnetic film 16. In this regard, the propagation of the spin-transfer torque drives oscillations in the directions of the magnetic moments 20 of the small magnetic elements in the magnetic film 16. These oscillations are called spin waves 24 and propagate out from the spin-polarized excitation current SDI with declining amplitudes 26. The spin-polarized excitation current SDI flows through the magnetic film 16 and exits as an exiting excitation current XDI. The directions of the excitation currents EDI, SDI, XDI illustrated in FIG. 2 are indicative of the direction of electron flow, which is the direction of charge carrier flow.

FIG. 3 illustrates behavior of a magnetic moment 20 of a single small magnetic element in the magnetic film 16 illustrated in FIG. 2 according to the prior art. The magnetic moments 20 of the small magnetic elements in the magnetic film 16 (FIG. 2) collectively have an overall magnetization direction 28, which may be substantially based on the polarizing magnetic field 22 (FIG. 2). However, when the single small magnetic element is subjected to spin-transfer torque, the direction of its magnetic moment 20 is altered, as shown in FIG. 3. The spin-transfer torque imparts a spin 30 to the magnetic moment 20 that traces an orbit around the magnetization direction 28. The orbit may be approximately elliptical in shape. The orbit may be described as an orbit of precession. A spin-torque force 32 of the spin-transfer torque drives the magnetic moment 20 away from the magnetization direction 28 and a damping force 34 associated with the magnetization direction 28 drives the magnetic moment 20 toward the magnetization direction 28. When an average spin-torque force 32 is equal to an average damping force 34, the spin 30 will have an approximate fixed orbit.

SUMMARY OF THE EMBODIMENTS

The present disclosure relates to a nano-oscillator magnetic wave propagation system having a group of aggregated spin-torque nano-oscillators (ASTNOs), which share a magnetic propagation material. Each of the group of ASTNOs is disposed about an emanating point in the magnetic propagation material. During a non-wave propagation state of the nano-oscillator magnetic wave propagation system, the magnetic propagation material receives a polarizing magnetic field. During a wave propagation state of the nano-oscillator magnetic wave propagation system, each of the group of ASTNOs initiates spin waves through the magnetic propagation material, such that a portion of the spin waves initiated from each of the group of ASTNOs combine to produce an aggregation of spin waves emanating from the emanating point. The aggregation of spin waves may provide a sharper wave-front and a larger wave-front amplitude than wave-fronts and wave-front amplitudes of the individual spin waves initiated from each of the group of ASTNOs. The sharper wave-front and larger wave-front amplitude of the aggregation of spin waves may enhance detection of the spin waves.

In one embodiment of the nano-oscillator magnetic wave propagation system, the nano-oscillator magnetic wave propagation system is a spin-wave wave-front based system, which detects and responds to certain wave-fronts of spin waves propagating through the magnetic propagation material. Such a system may be used in a spin-wave based polychronous wave propagation system, which may provide polychronous activity that is analogous to polychronous activity in a brain. In an alternate embodiment of the nano-oscillator magnetic wave propagation system, the nano-oscillator magnetic wave propagation system is a spin-wave based communications system, which uses spin waves propagating through the magnetic propagation material to convey information. In an additional embodiment of the nano-oscillator magnetic wave propagation system, the nano-oscillator magnetic wave propagation system is a spin-wave based measurement system, which measures the effects of one or more physical entities upon spin waves propagating through the magnetic propagation material. Examples of the physical entities include radio frequency (RF) energy, light, vibration, sound waves, temperature, radiation, and the like. As such, the spin-wave based measurement system may be used as a sensor or transducer.

In another embodiment of the nano-oscillator magnetic wave propagation system, the nano-oscillator magnetic wave propagation system is an energy capturing system, which uses spin waves propagating through the magnetic propagation material to capture energy, direct energy, or both. In a further embodiment of the nano-oscillator magnetic wave propagation system, the nano-oscillator magnetic wave propagation system is a spin-wave locking system, which phase locks or frequency locks a spin-torque nano-oscillator (STNO) to spin waves propagating through the magnetic propagation material. In a supplemental embodiment of the nano-oscillator magnetic wave propagation system, the nano-oscillator magnetic wave propagation system is a data memory storage system, which uses the magnetic propagation material to store information, such that the spin waves propagating through the magnetic propagation material directly, indirectly, or both store and retrieve the information.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 3 illustrates behavior of a magnetic moment illustrated in

Figure 1:
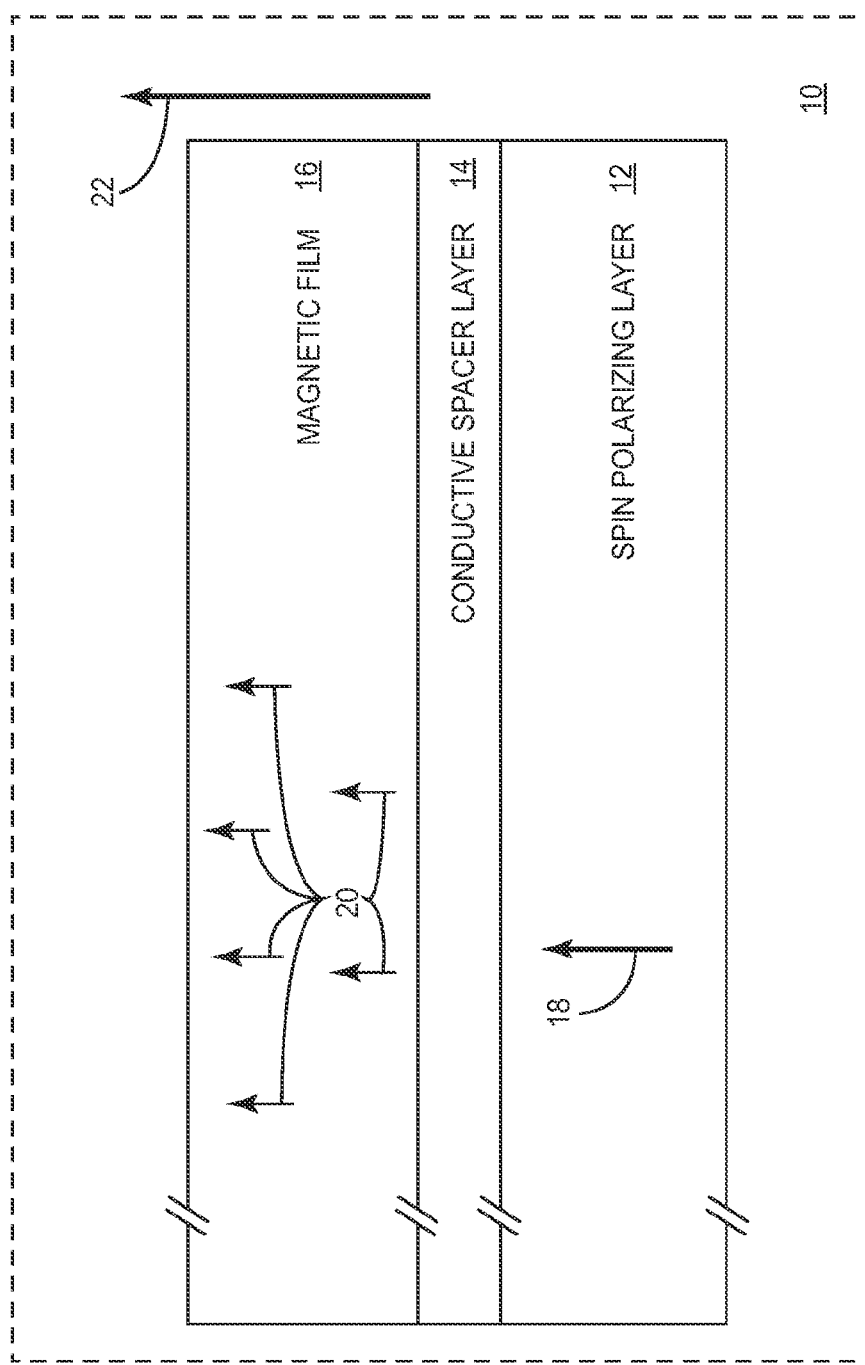
FIG. 1 shows a frontwise cross-section of a spin-torque nano-oscillator (STNO) according to the prior art.
Figure 2:
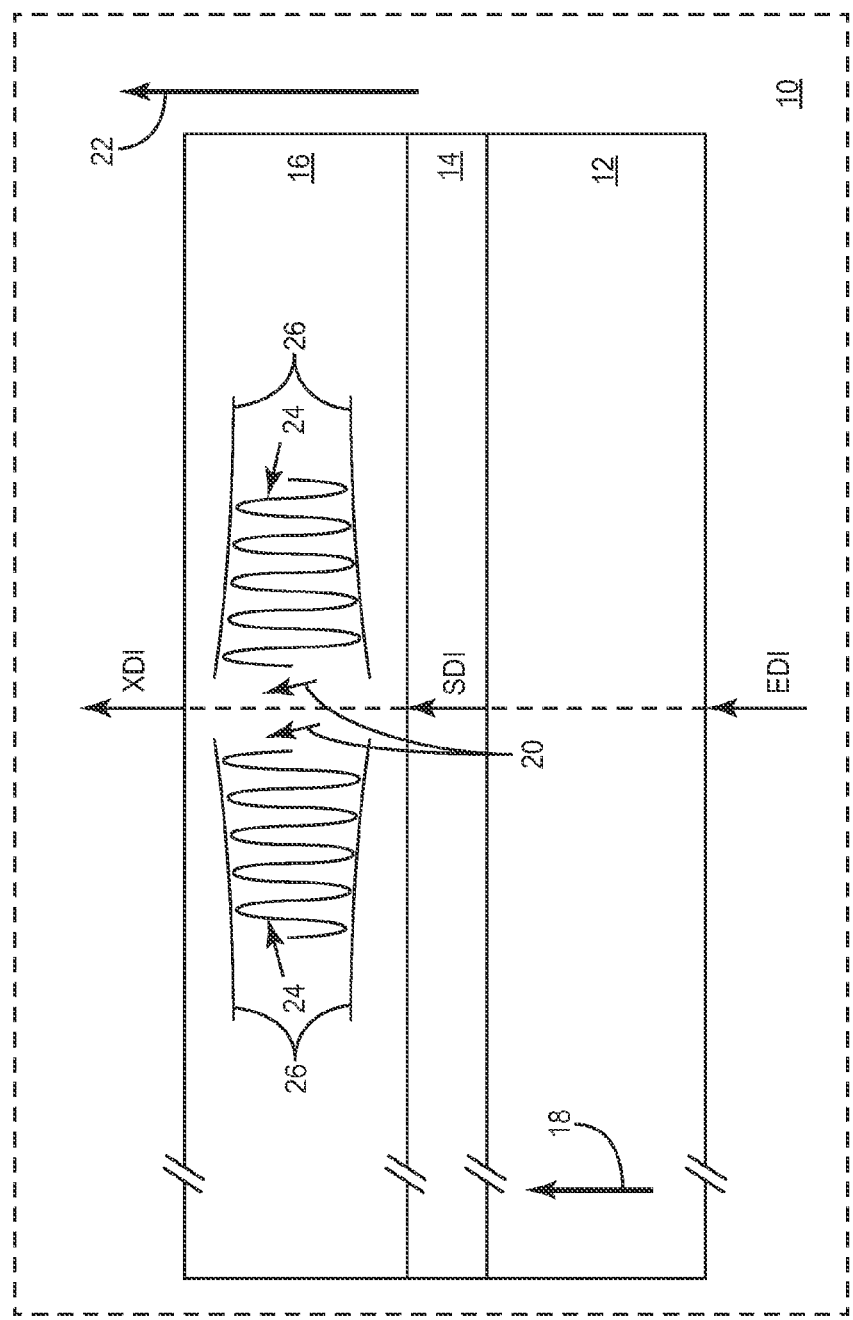
FIG. 2 shows details of the STNO illustrated in FIG. 1 according to the prior art.
Figure 3:
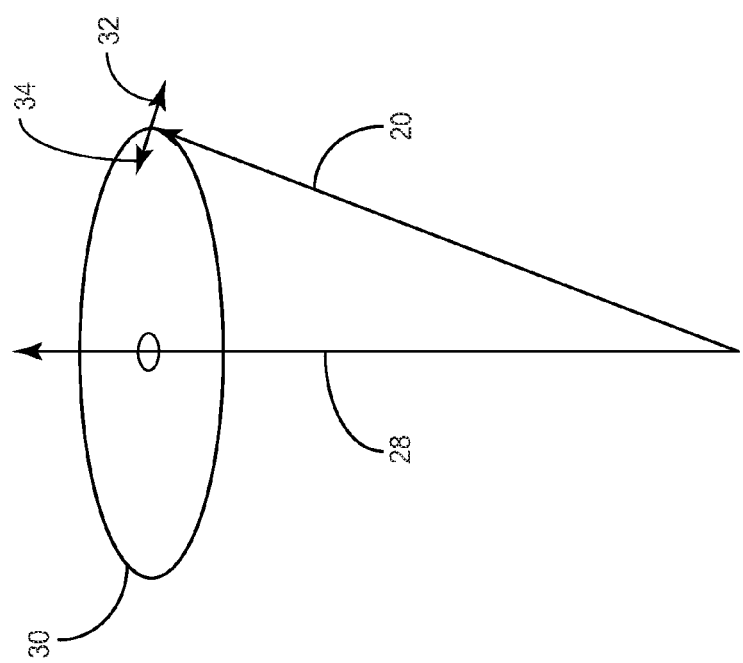

FIG. 2 according to the prior art.

Figure 4:
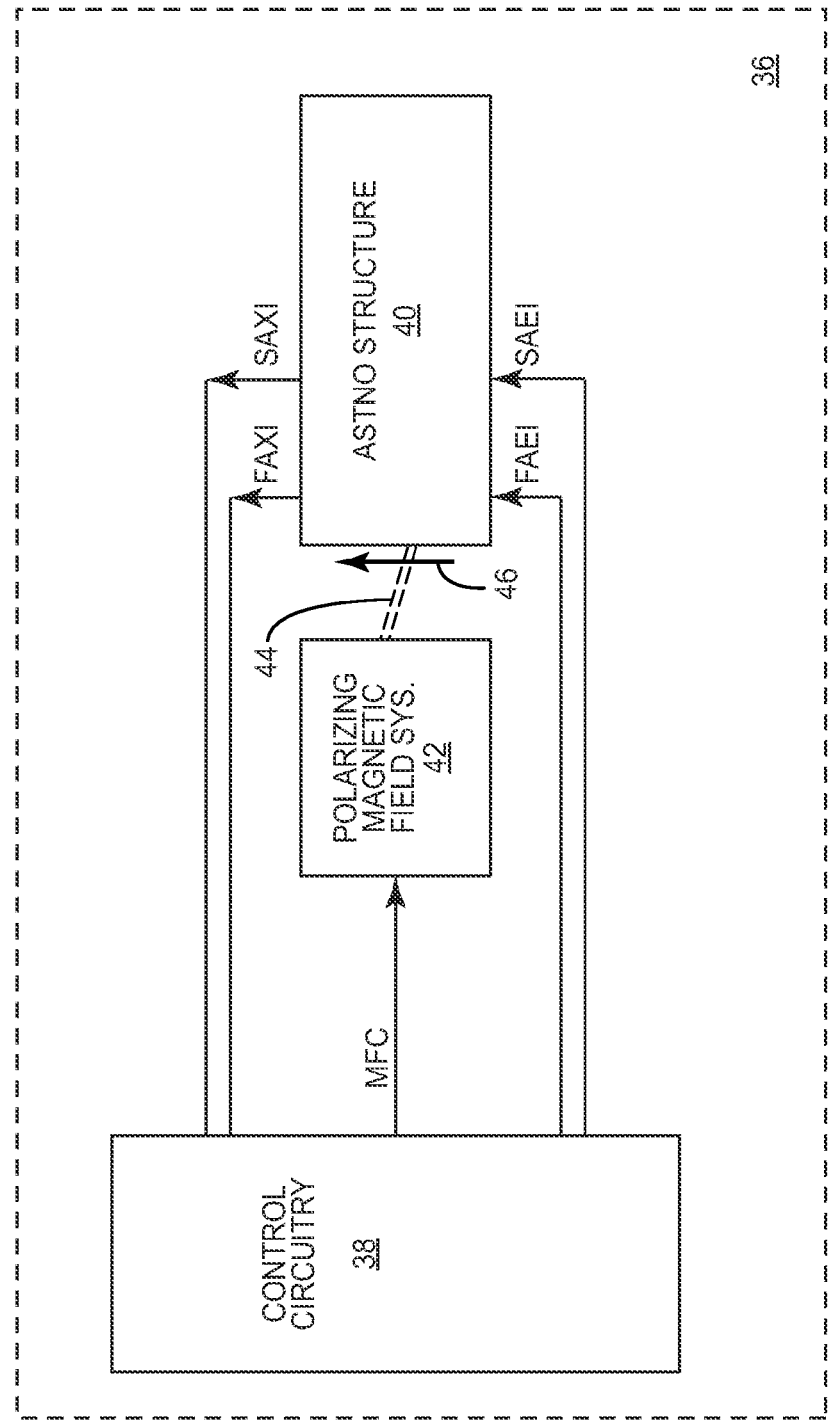

FIG. 4 shows details of a nano-oscillator magnetic wave propagation system according to one embodiment of the nano-oscillator magnetic wave propagation system.

Figure 5:
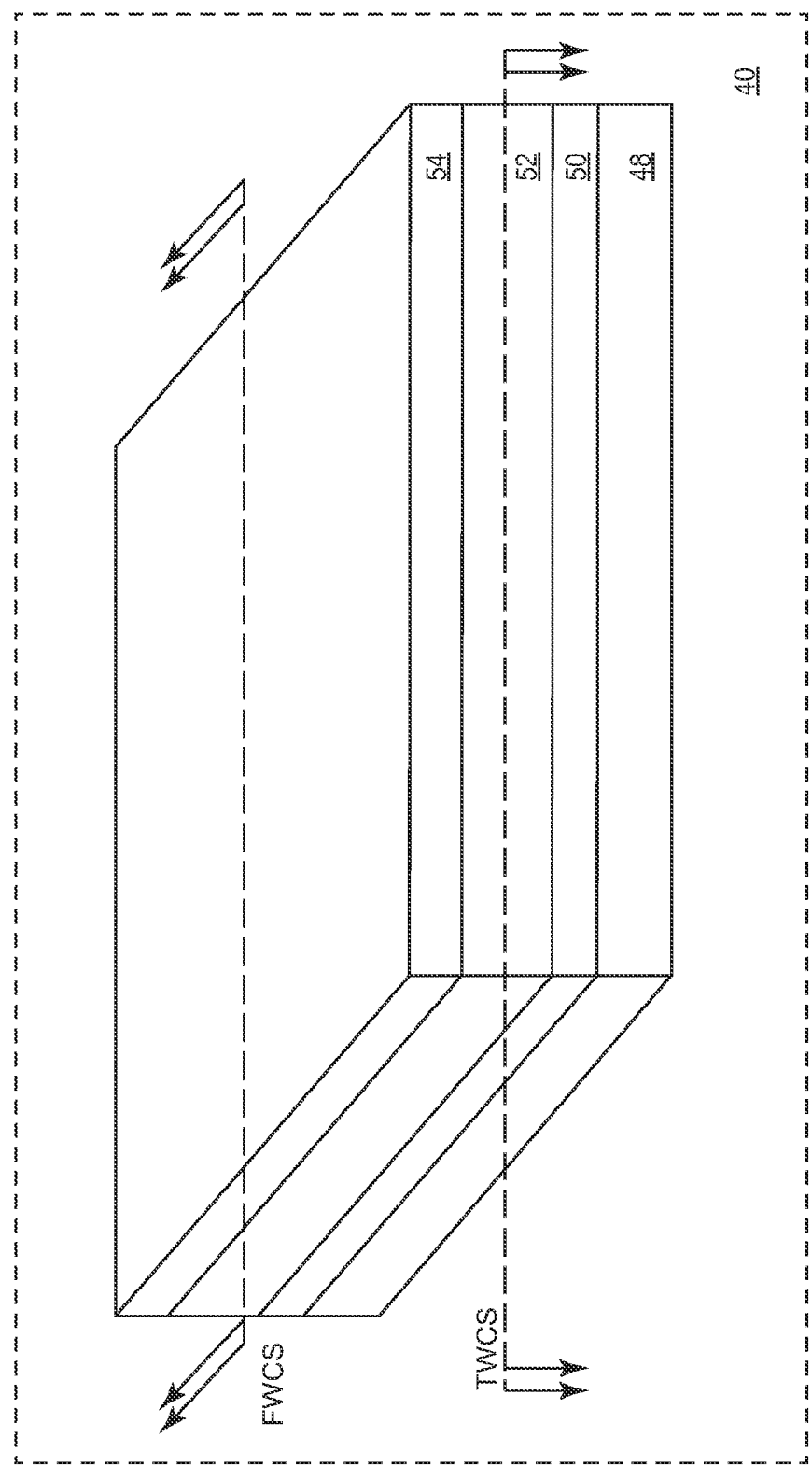

FIG. 5 shows an aggregated STNO (ASTNO) structure illustrated in FIG. 4 according to one embodiment of the ASTNO structure.

Figure 6:
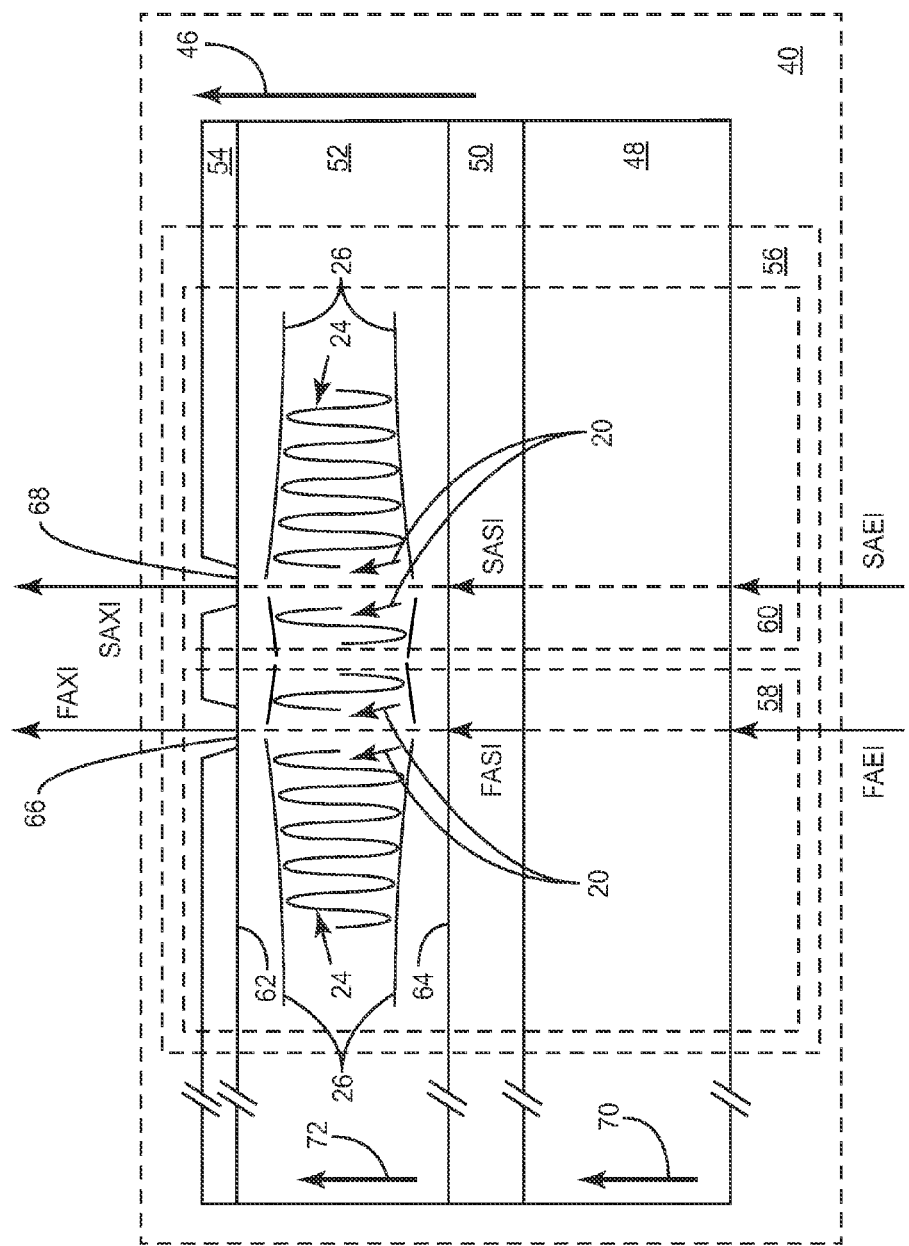

FIG. 6 shows a frontwise cross-section of the ASTNO structure illustrated in FIG. 5 according to one embodiment of the ASTNO structure.

Figure 7:
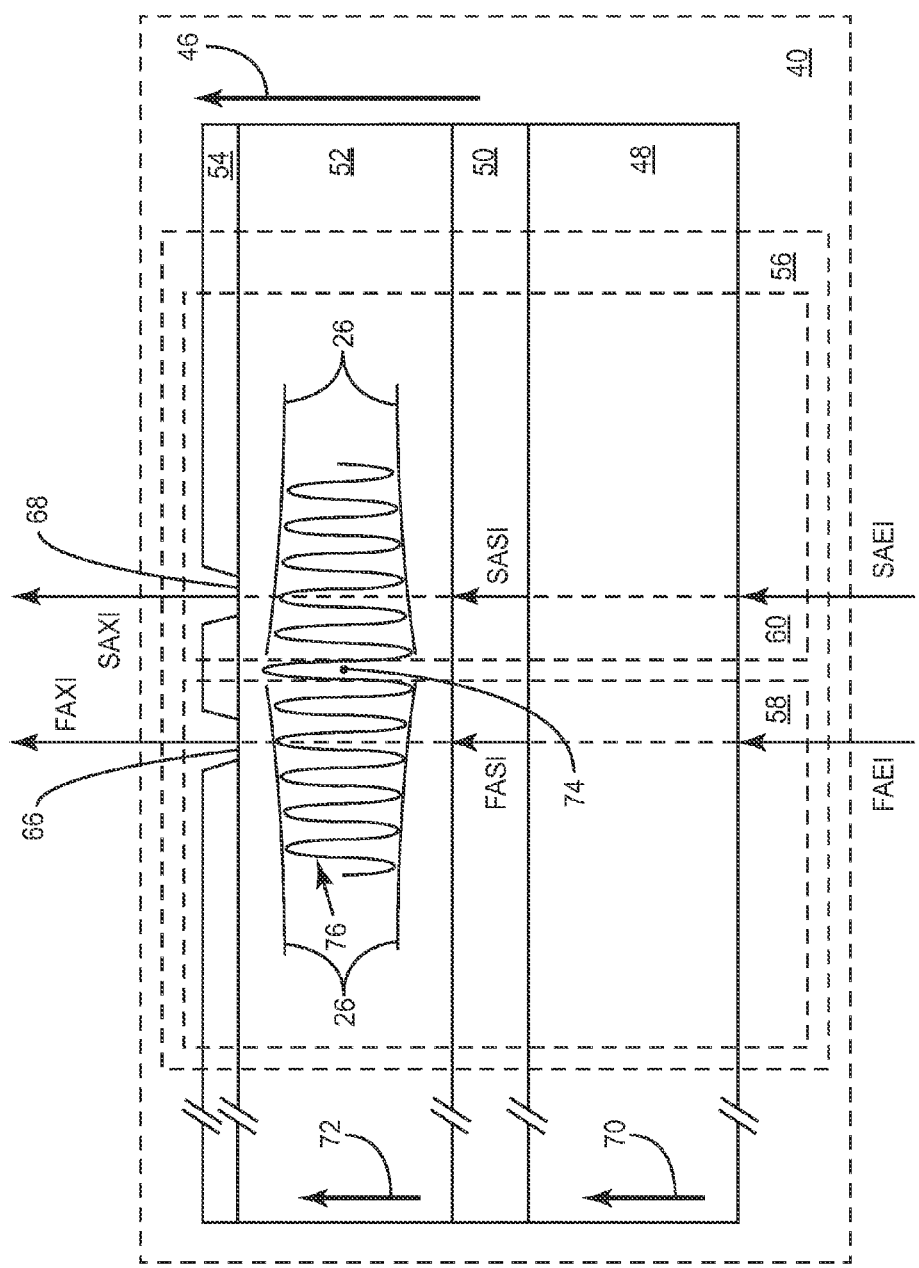

FIG. 7 shows further details of the ASTNO structure illustrated in FIG. 6 according to one embodiment of the ASTNO structure.

Figure 8:
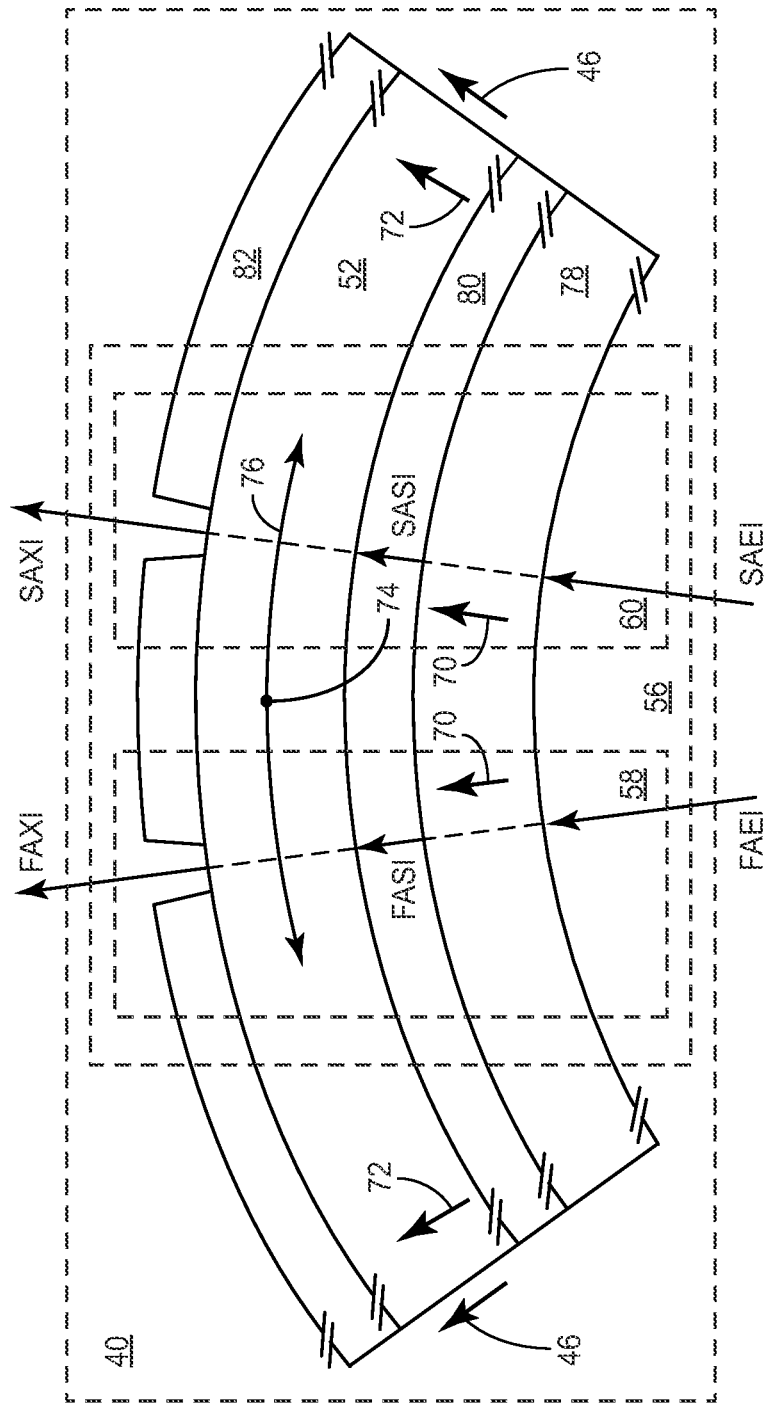

FIG. 8 shows a frontwise cross-section of the ASTNO structure illustrated in FIG. 4 according to an alternate embodiment of the ASTNO structure.

FIGS. 9A, 9B, 9C, and 9D show a topwise cross-section of the ASTNO structure illustrated in FIG. 5 according to an additional embodiment of the ASTNO structure.

Figure 10:
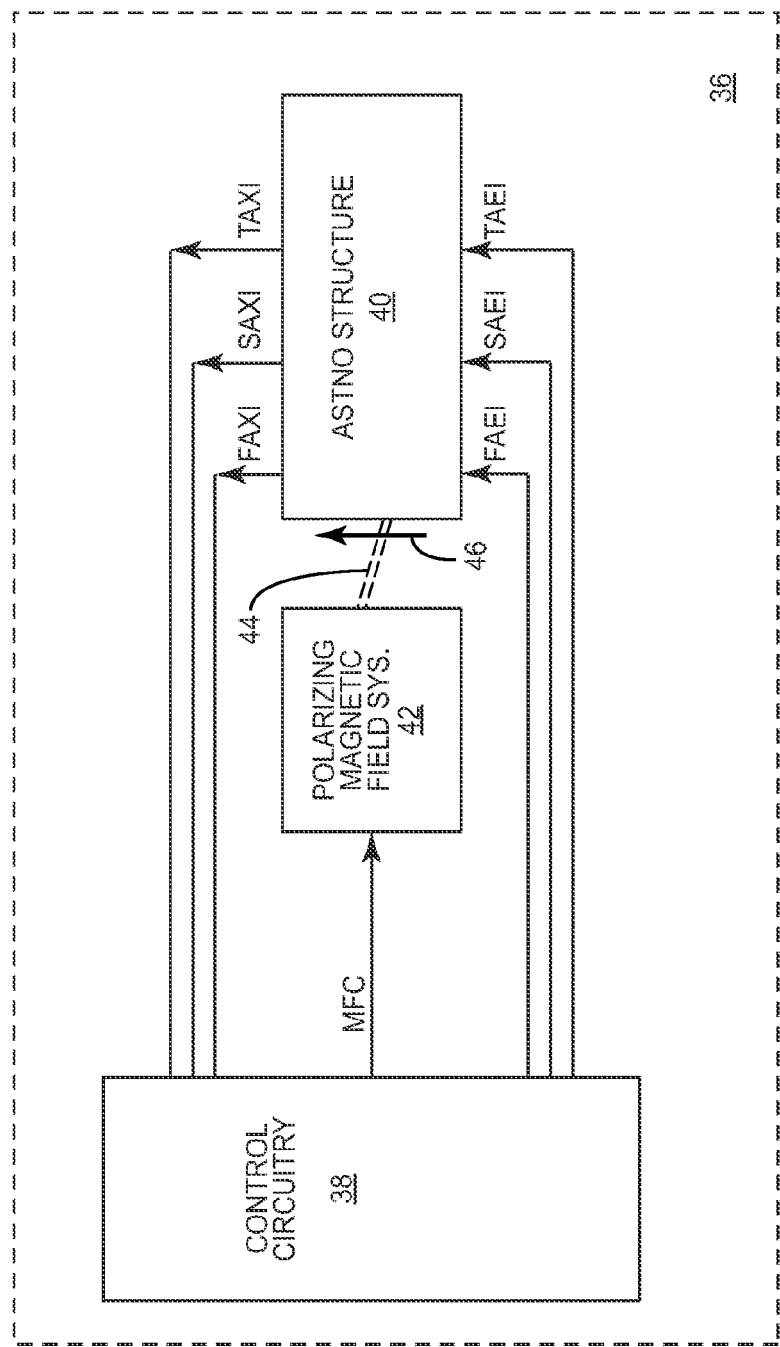

FIG. 10 shows details of the nano-oscillator magnetic wave propagation system according to an additional embodiment of the nano-oscillator magnetic wave propagation system.

Figure 11:
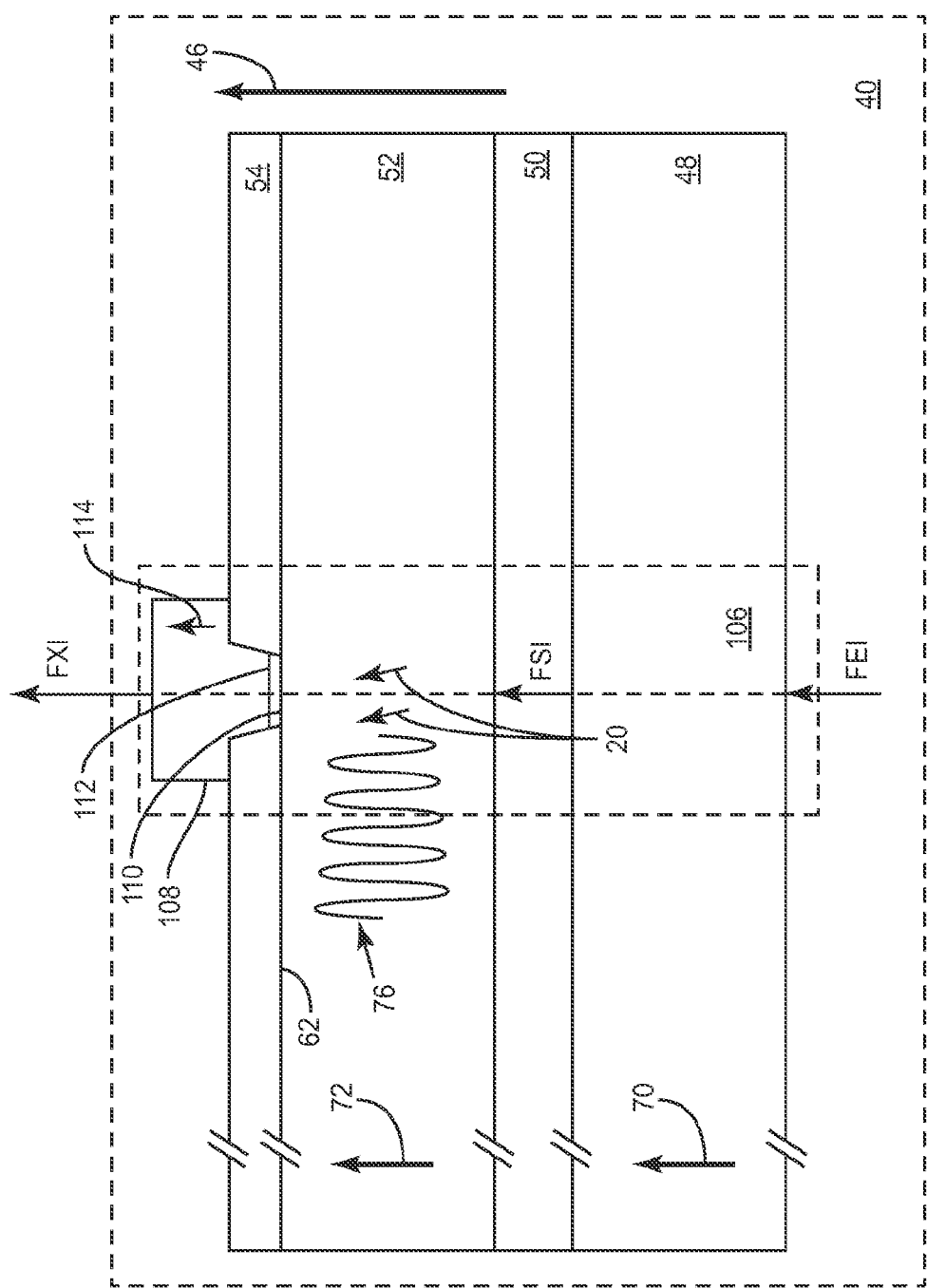

FIG. 11 shows the frontwise cross-section of the ASTNO structure illustrated in FIG. 5 according to an alternate embodiment of the ASTNO structure.

Figure 12:
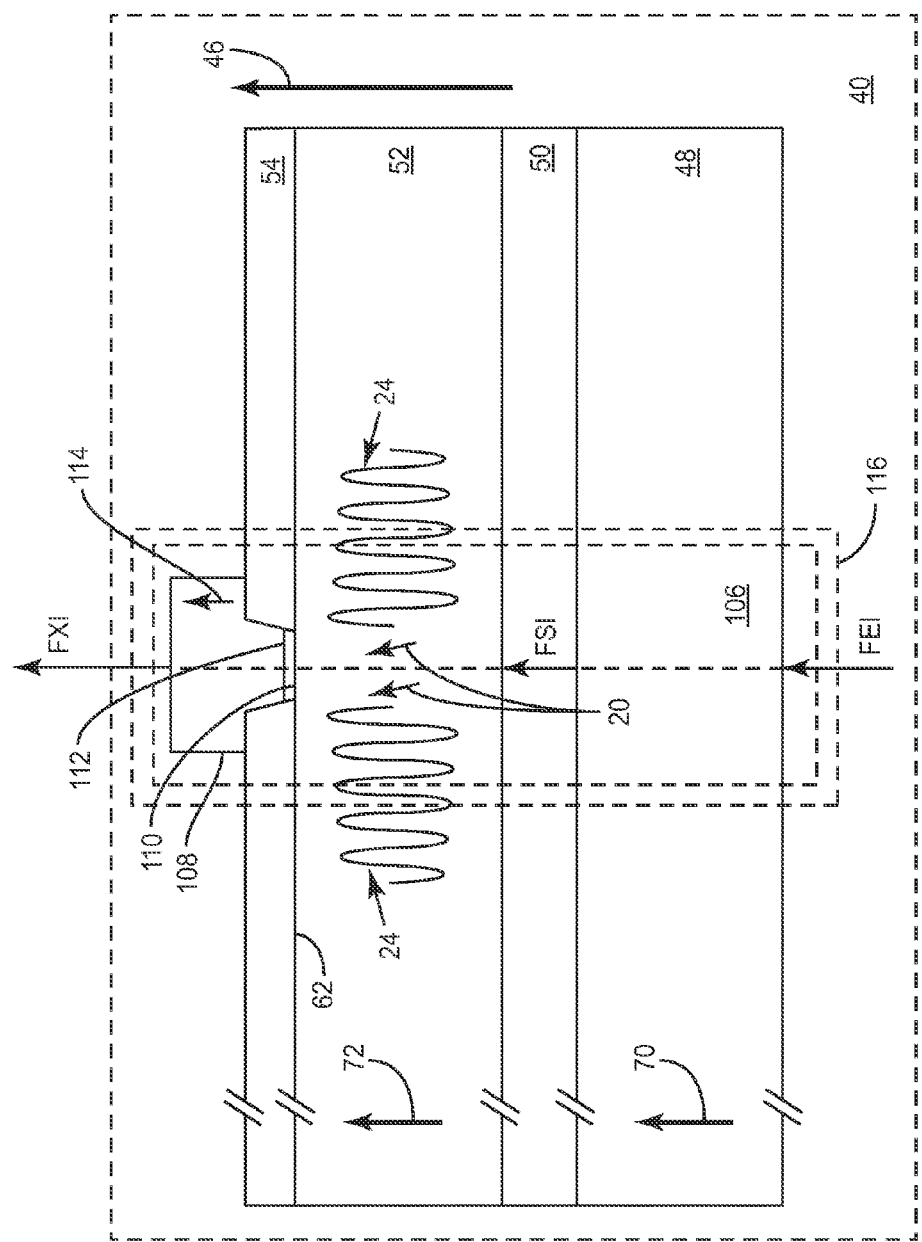

FIG. 12 shows the frontwise cross-section of the ASTNO structure illustrated in FIG. 5 according to another embodiment of the ASTNO structure.

Figure 13:
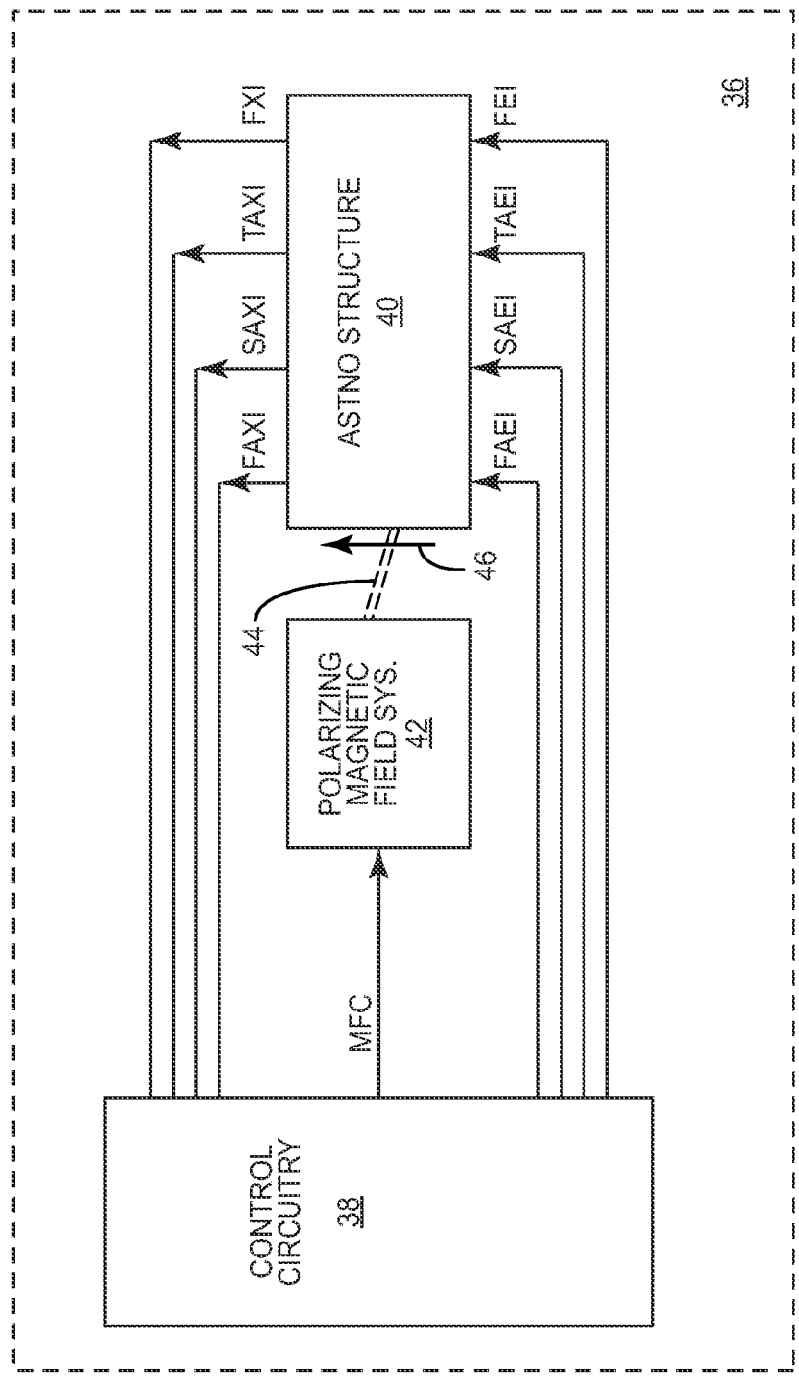

FIG. 13 shows details of the nano-oscillator magnetic wave propagation system according to another embodiment of the nano-oscillator magnetic wave propagation system.

Figure 14:
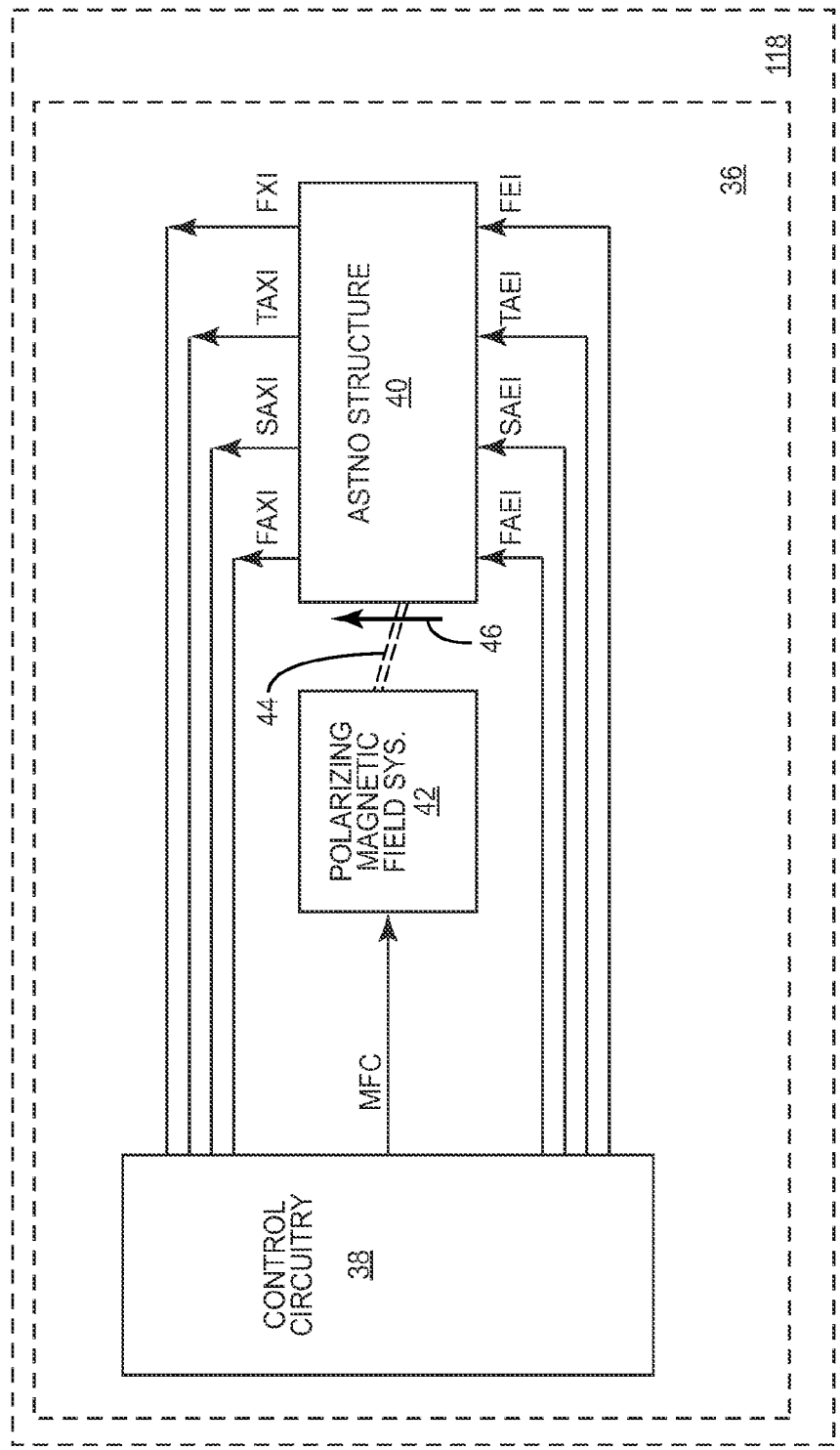

FIG. 14 shows details of the nano-oscillator magnetic wave propagation system according to one embodiment of the nano-oscillator magnetic wave propagation system.

Figure 15:
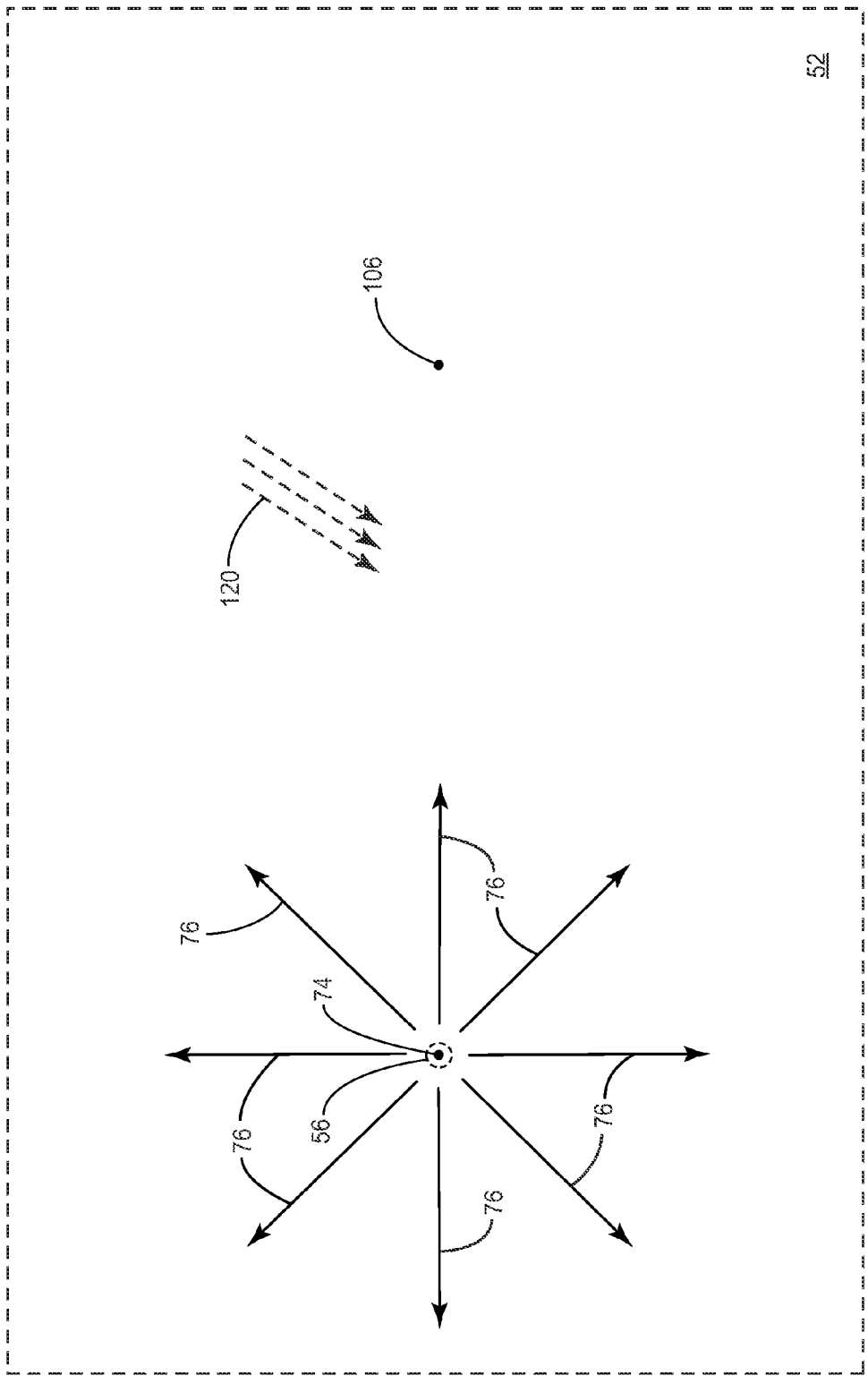

FIG. 15 shows the topwise cross-section of the ASTNO structure illustrated in FIG. 5 and FIG. 14 according to one embodiment of the ASTNO structure.

Figure 16:
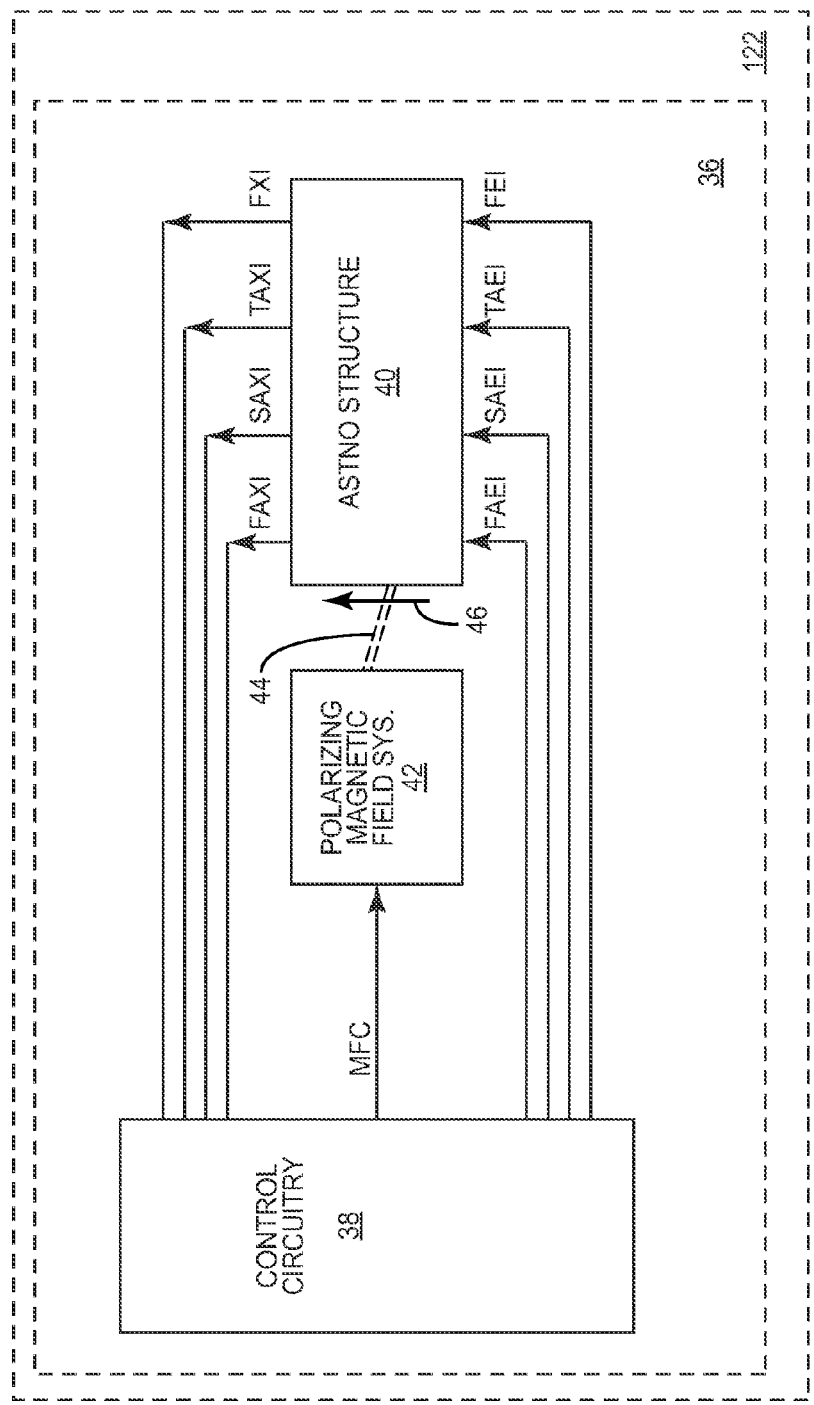

FIG. 16 shows details of the nano-oscillator magnetic wave propagation system according to an alternate embodiment of the nano-oscillator magnetic wave propagation system.

Figure 17:
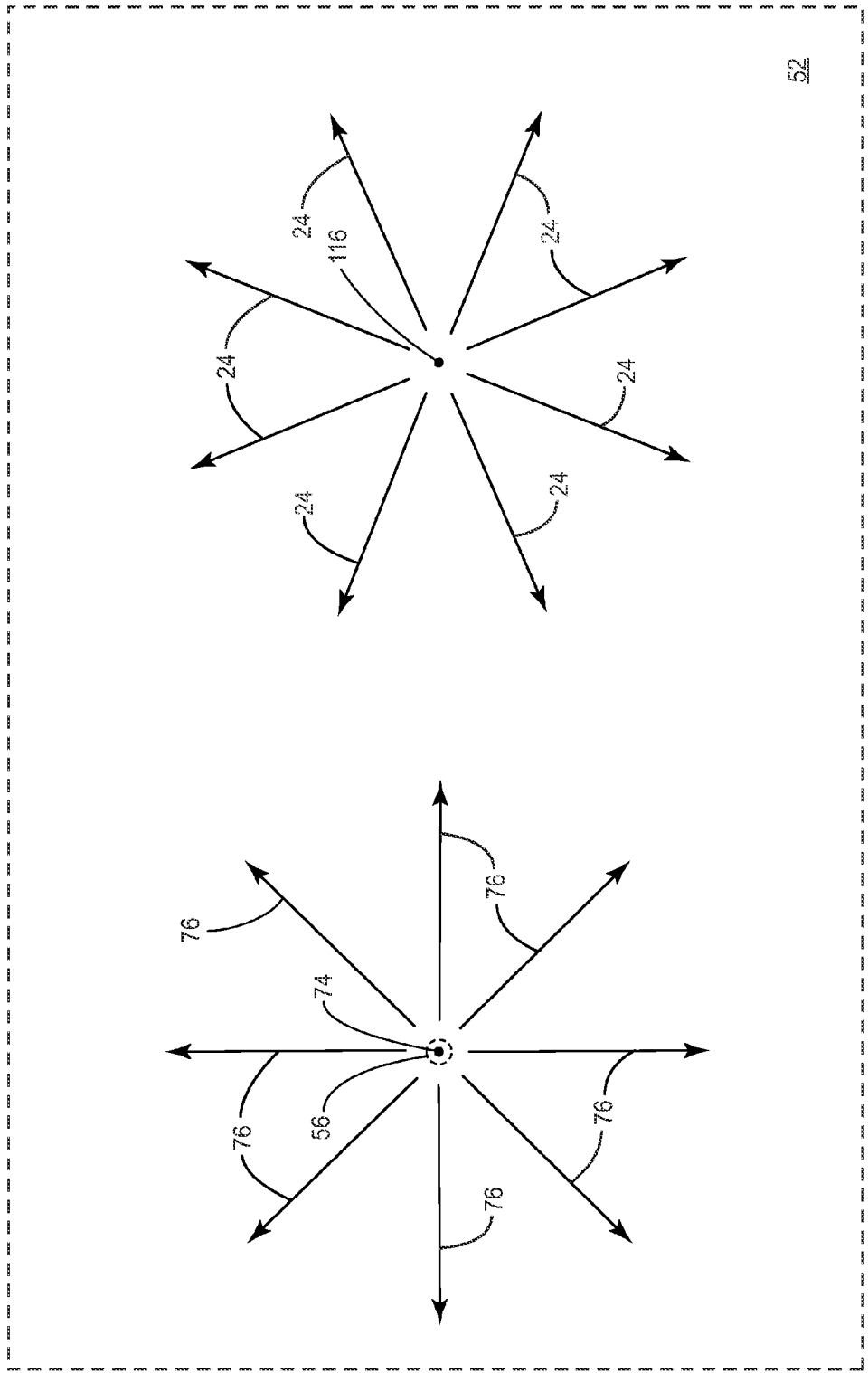

FIG. 17 shows the topwise cross-section of the ASTNO structure illustrated in FIG. 5 and FIG. 16 according to an alternate embodiment of the ASTNO structure.

Figure 18:
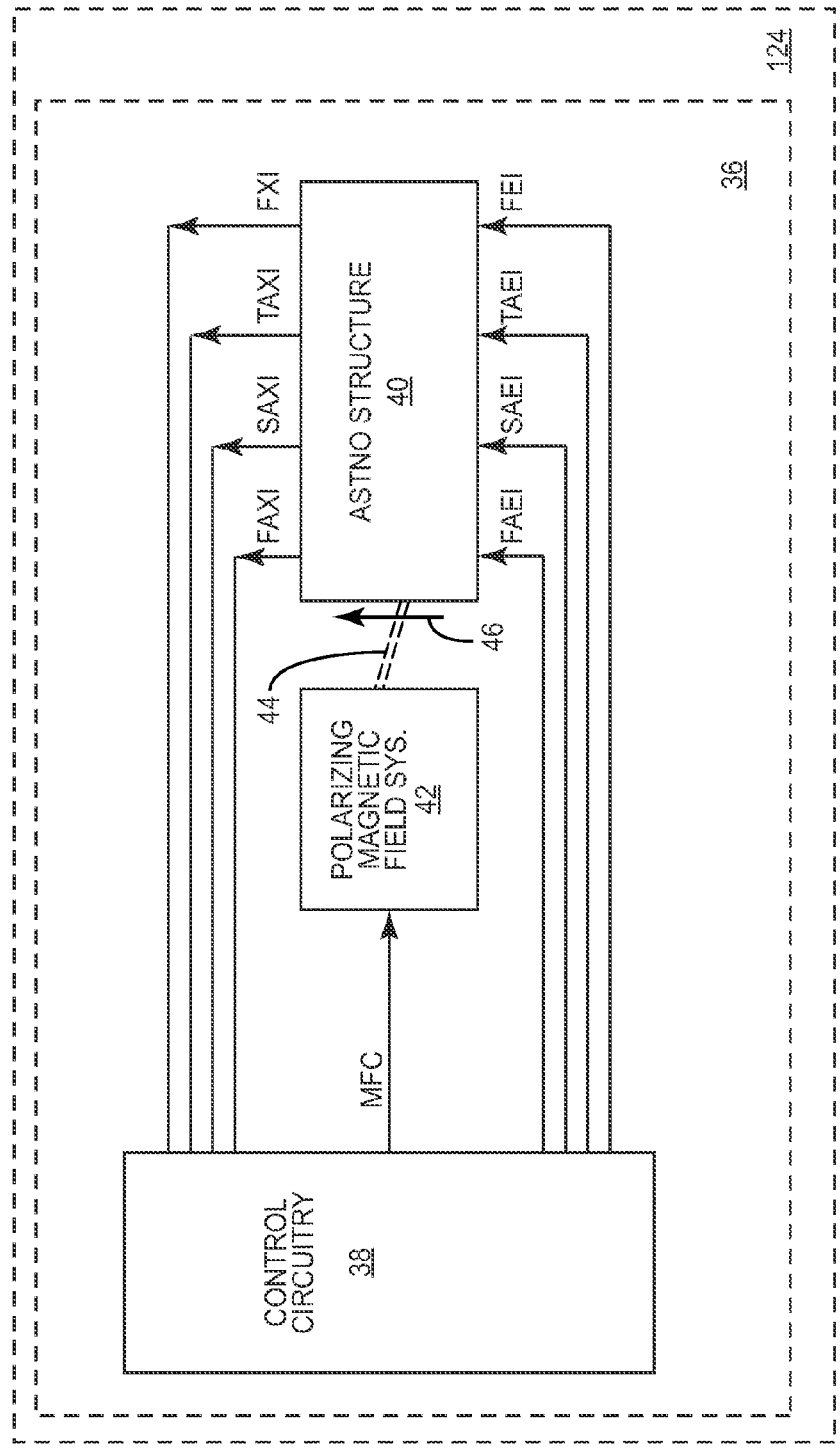

FIG. 18 shows details of the nano-oscillator magnetic wave propagation system according to an additional embodiment of the nano-oscillator magnetic wave propagation system.

Figure 19:
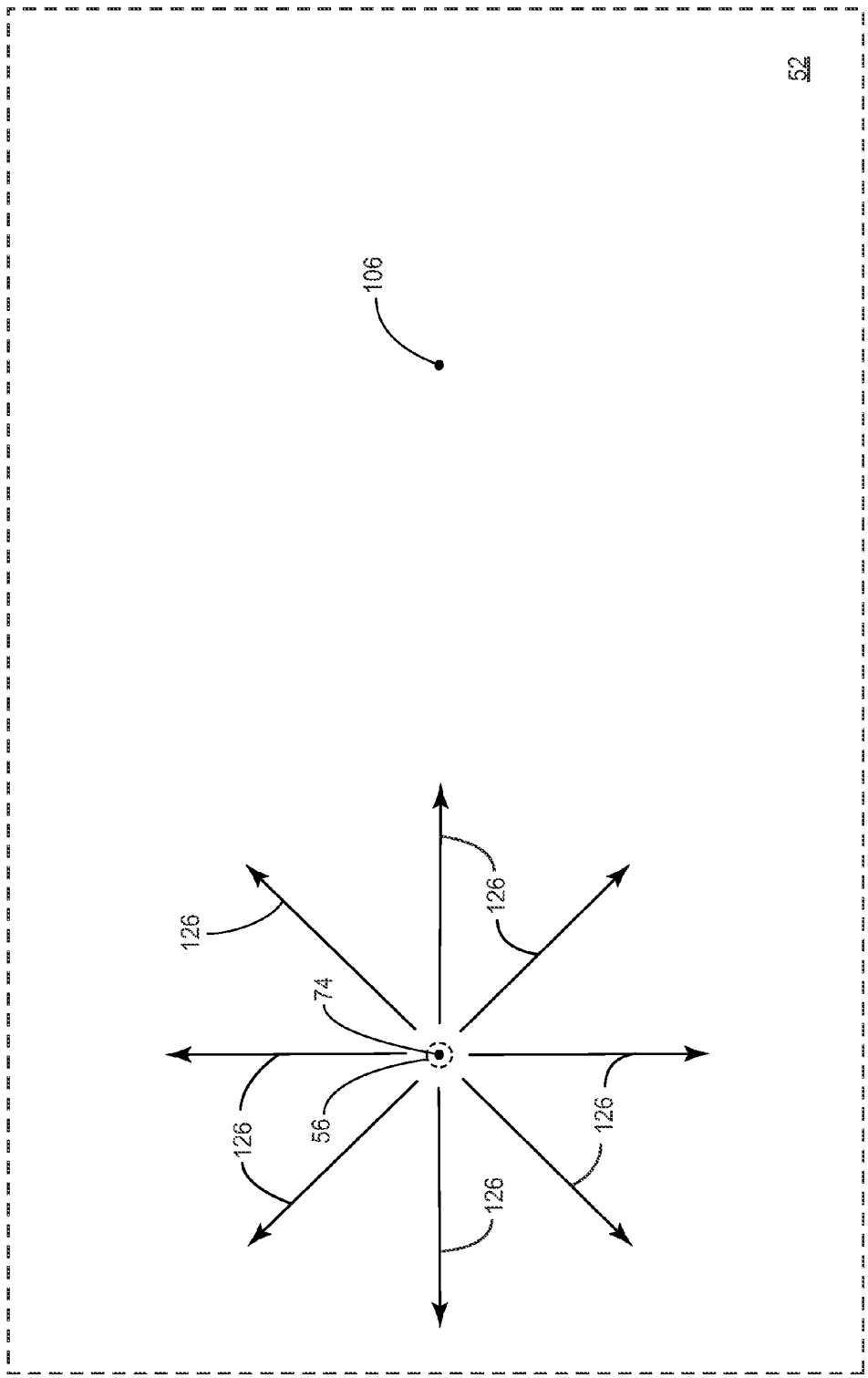

FIG. 19 shows the topwise cross-section of the ASTNO structure illustrated in FIG. 5 and FIG. 18 according to an additional embodiment of the ASTNO structure.

Figure 20:
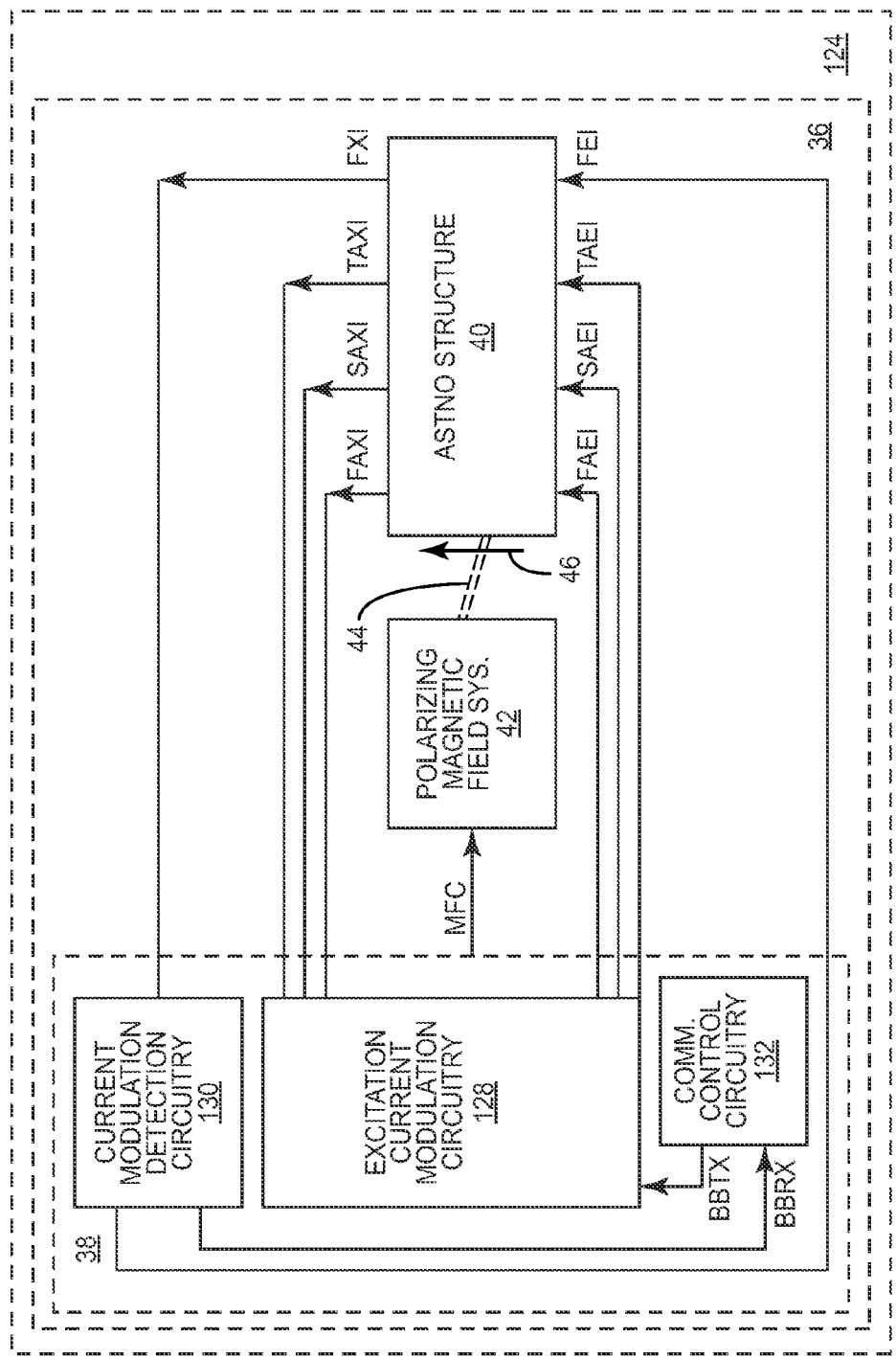

FIG. 20 shows details of the control circuitry illustrated in FIG. 18 according to one embodiment of the control circuitry.

Figure 21:
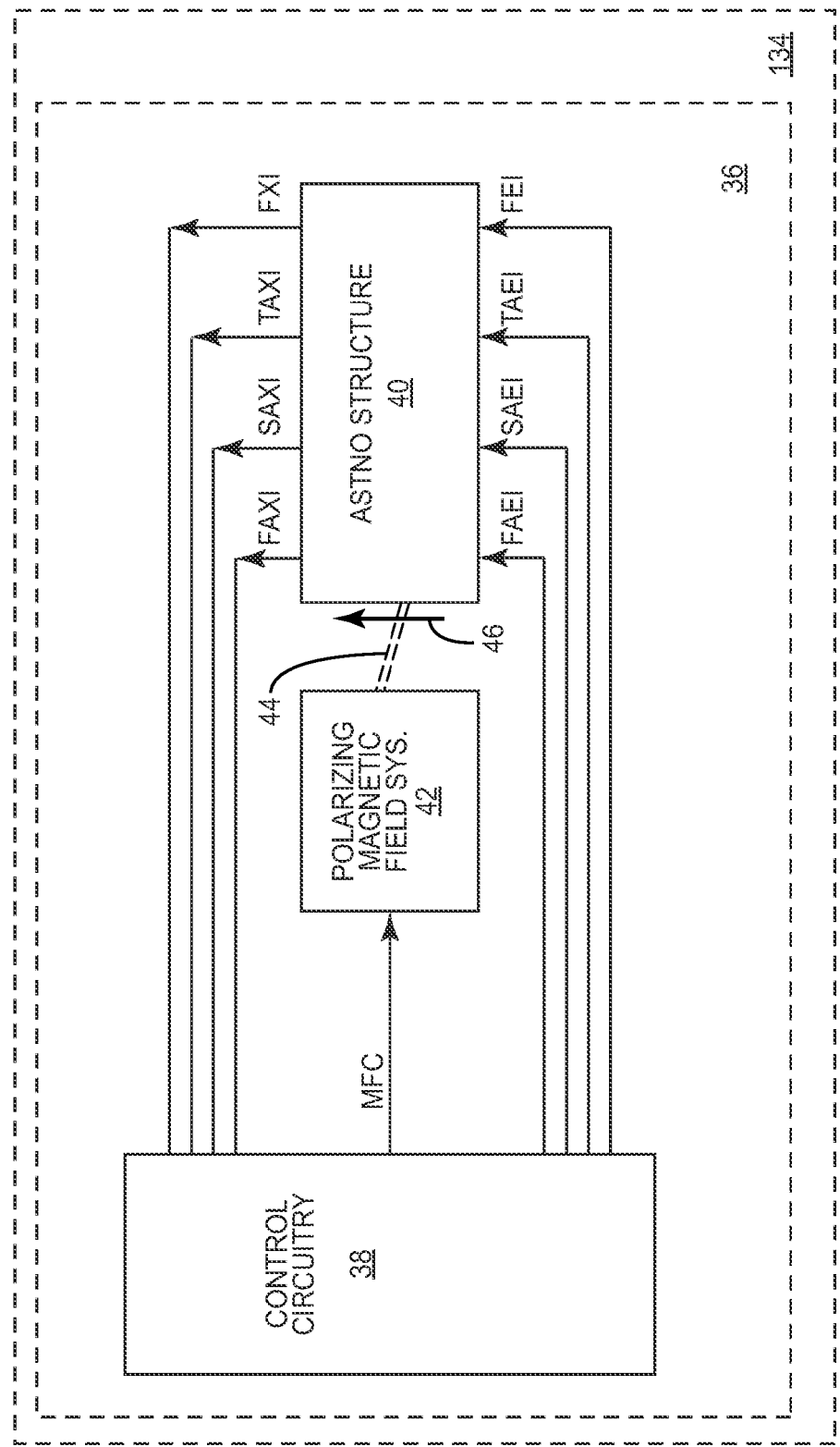

FIG. 21 shows details of the nano-oscillator magnetic wave propagation system according to another embodiment of the nano-oscillator magnetic wave propagation system.

Figure 22:
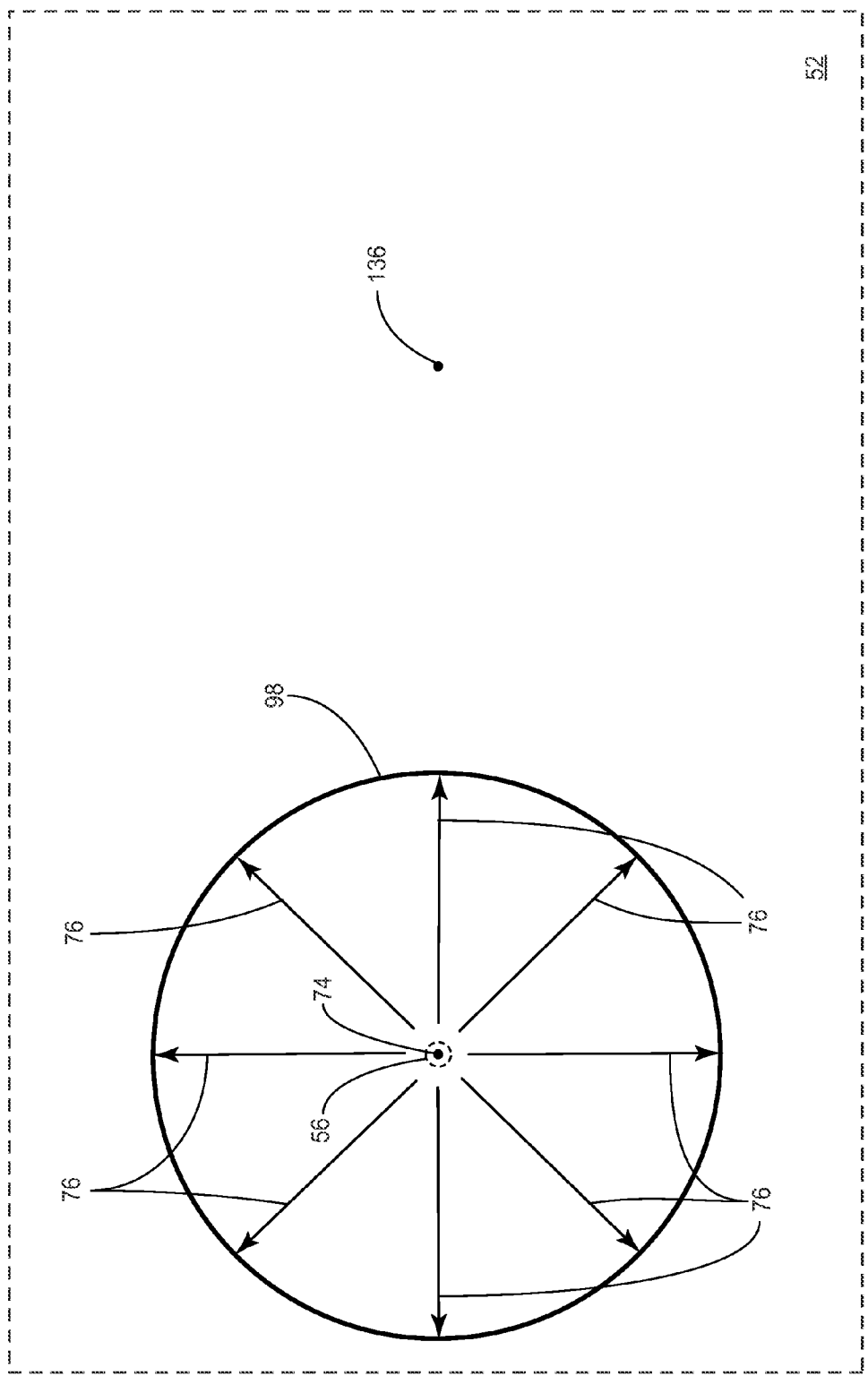

FIG. 22 shows the topwise cross-section of the ASTNO structure illustrated in FIG. 5 and FIG. 21 according to one embodiment of the ASTNO structure.

Figure 23:
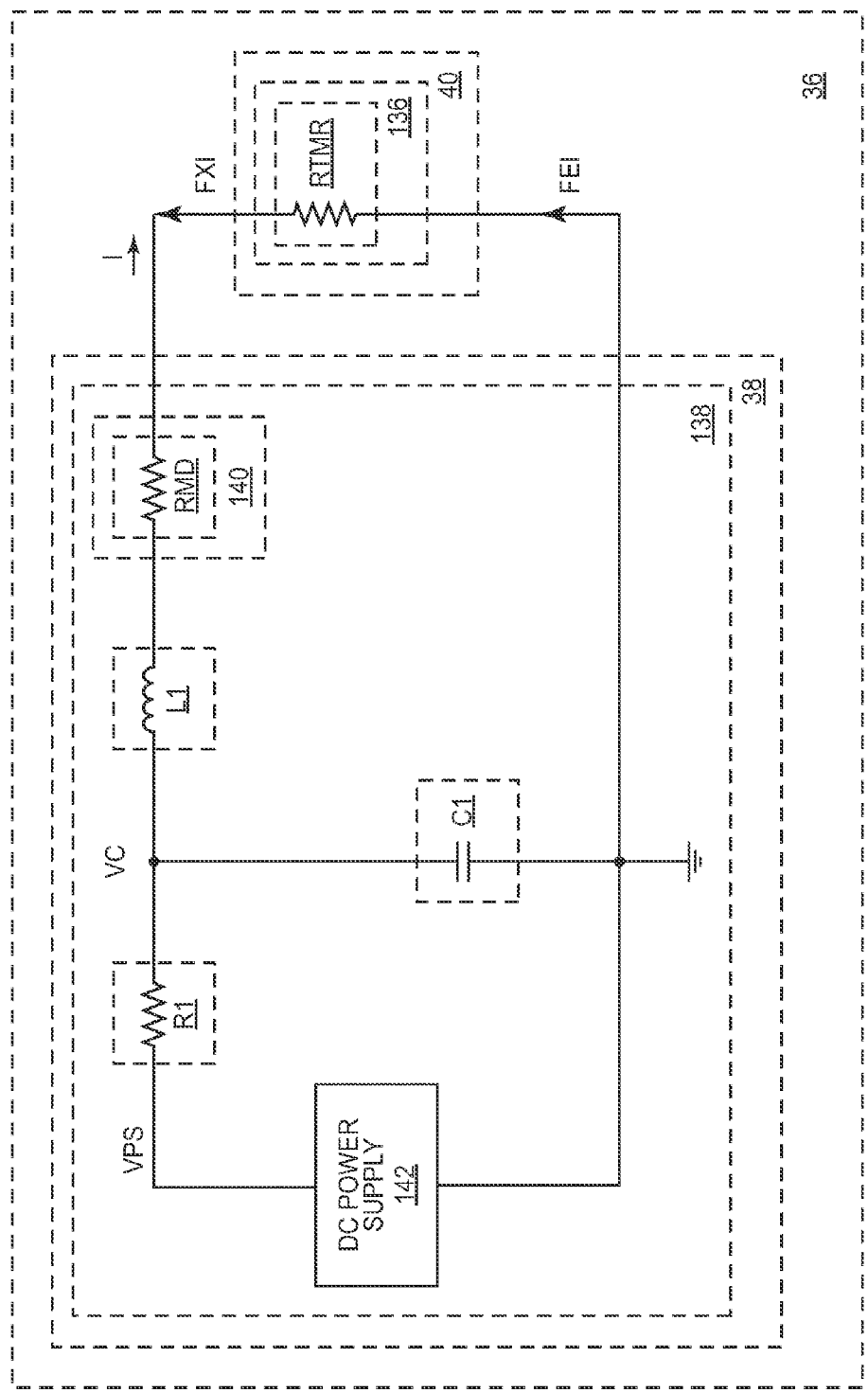

FIG. 23 shows details of portions of the control circuitry and portions of the ASTNO structure illustrated in FIG. 21 according to one embodiment of the control circuitry and the ASTNO structure.

Figure 24:
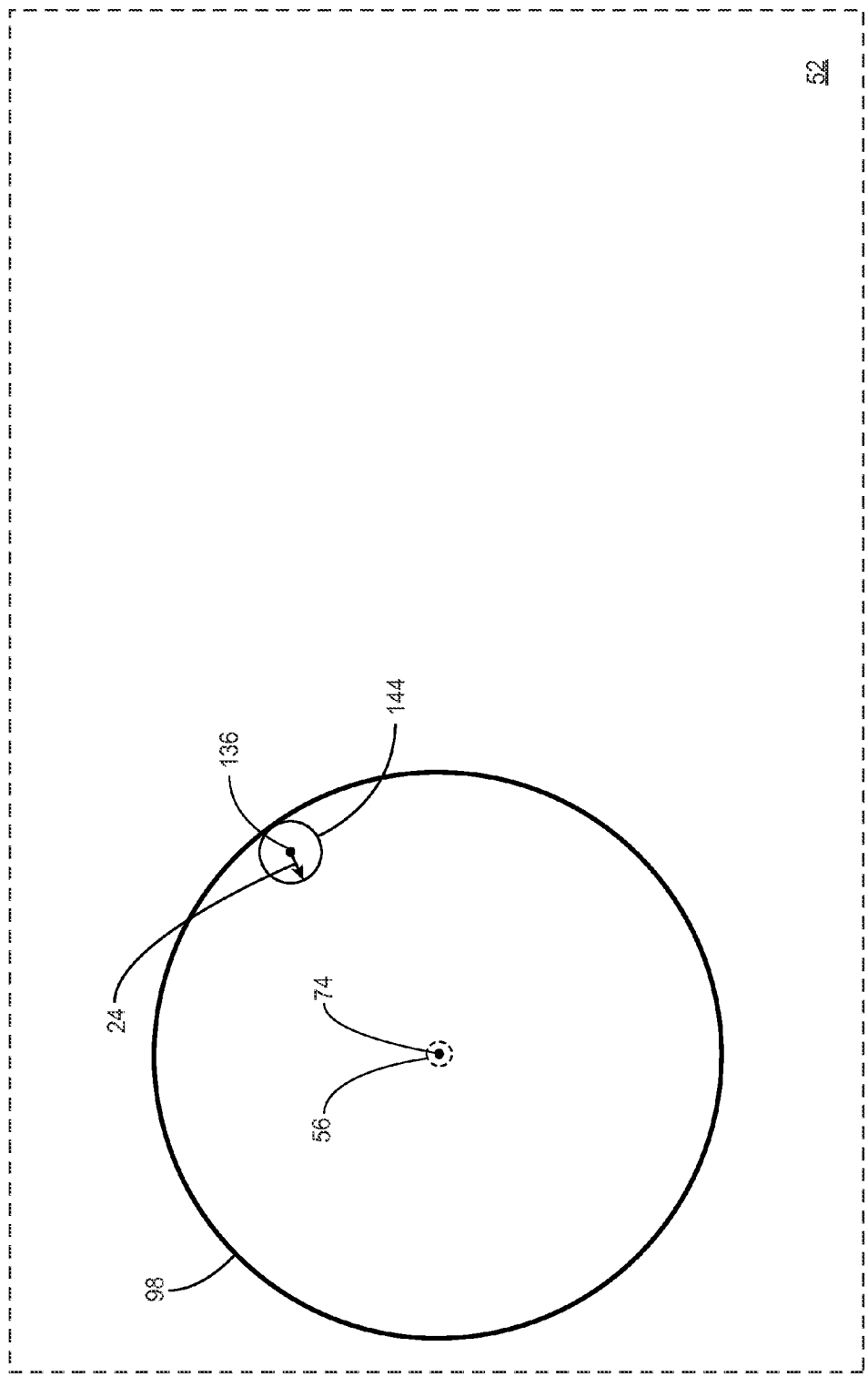

FIG. 24 shows the topwise cross-section of the ASTNO structure illustrated in FIG. 5 and FIG. 21 according to an alternate embodiment of the ASTNO structure.

Figure 25:
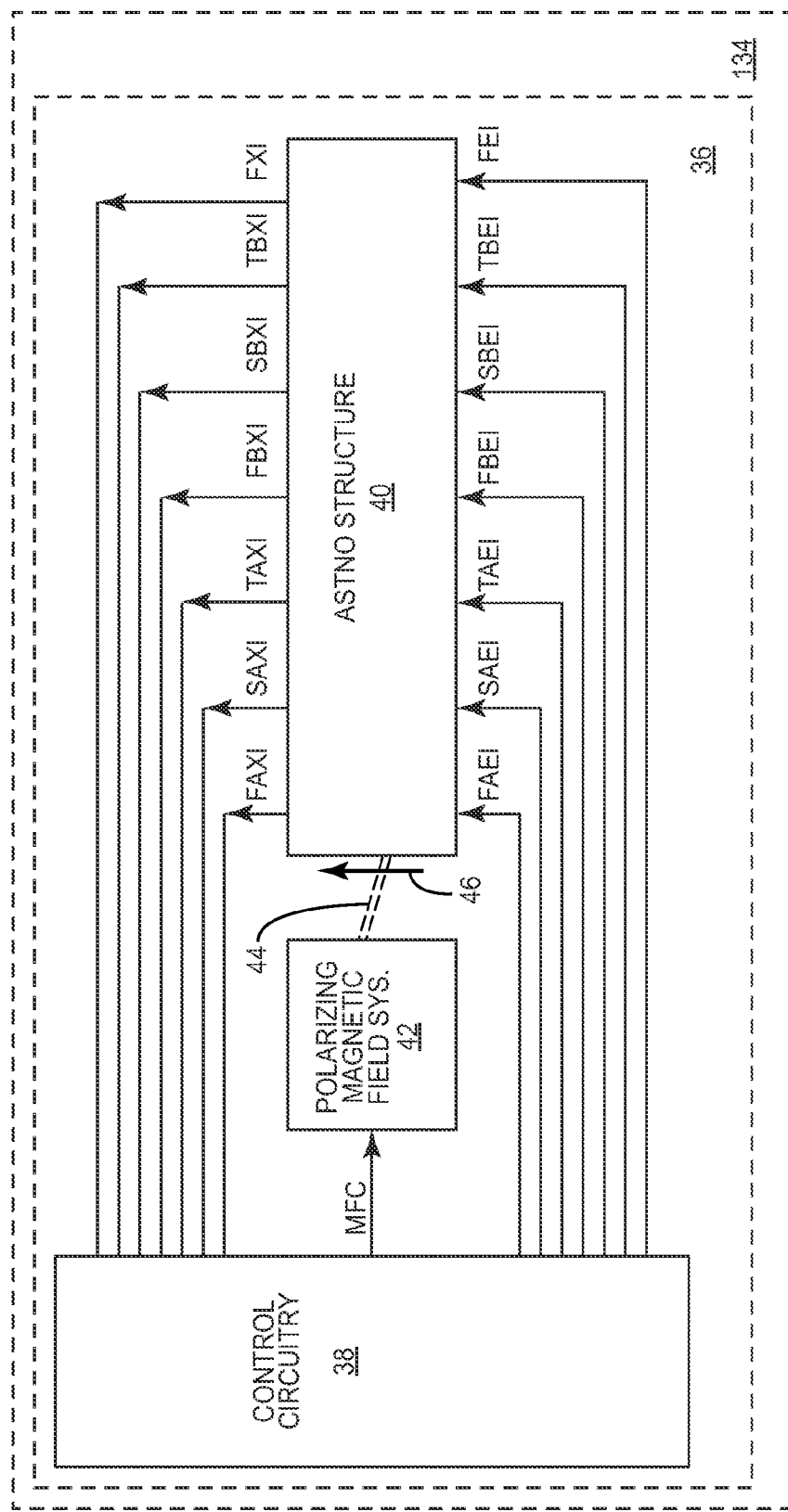

FIG. 25 shows details of the nano-oscillator magnetic wave propagation system according to another embodiment of the nano-oscillator magnetic wave propagation system.

FIG. 26 shows the topwise cross-section of the ASTNO structure illustrated in FIG. 5 and FIG. 25 according to an additional embodiment of the ASTNO structure.

FIG. 27 shows the topwise cross-section of the ASTNO structure illustrated in FIG. 5 and FIG. 25 according to a further embodiment of the ASTNO structure.

FIGS. 28A, 28B, 28C, and 28D show the topwise cross-section of the ASTNO structure illustrated in FIG. 5 according to one embodiment of the ASTNO structure.

Figure 29:
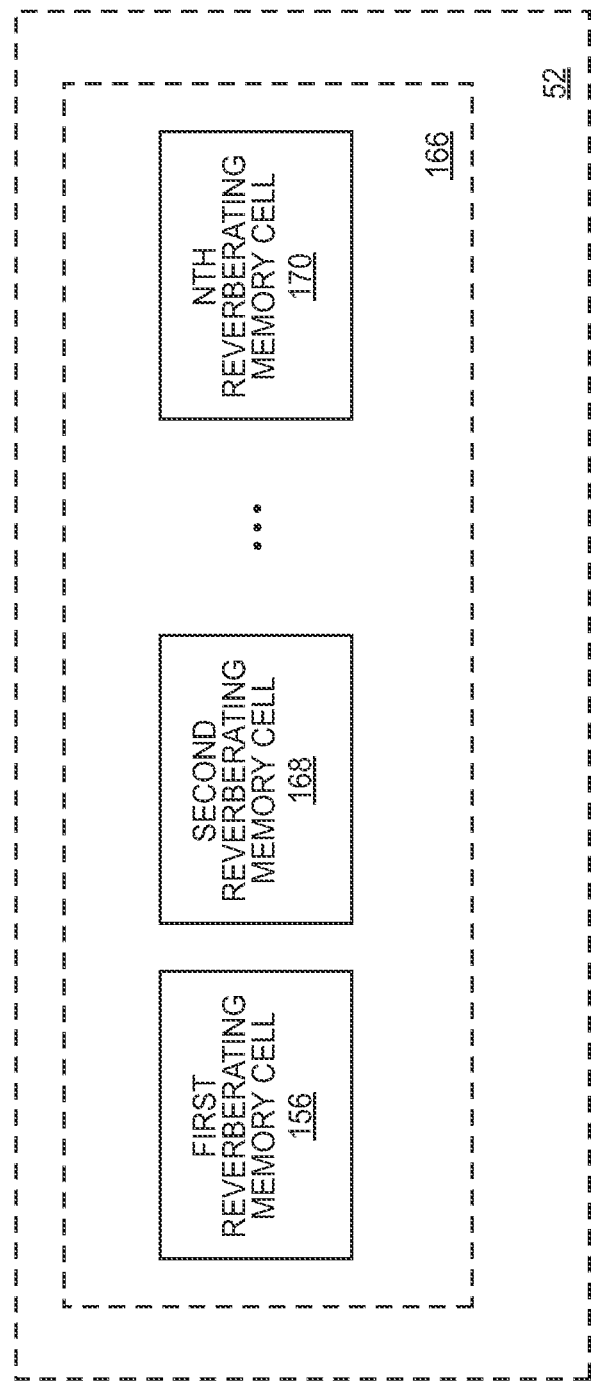

FIG. 29 shows the topwise cross-section of the ASTNO structure illustrated in FIG. 5 according to an alternate embodiment of the ASTNO structure.

Figure 30:
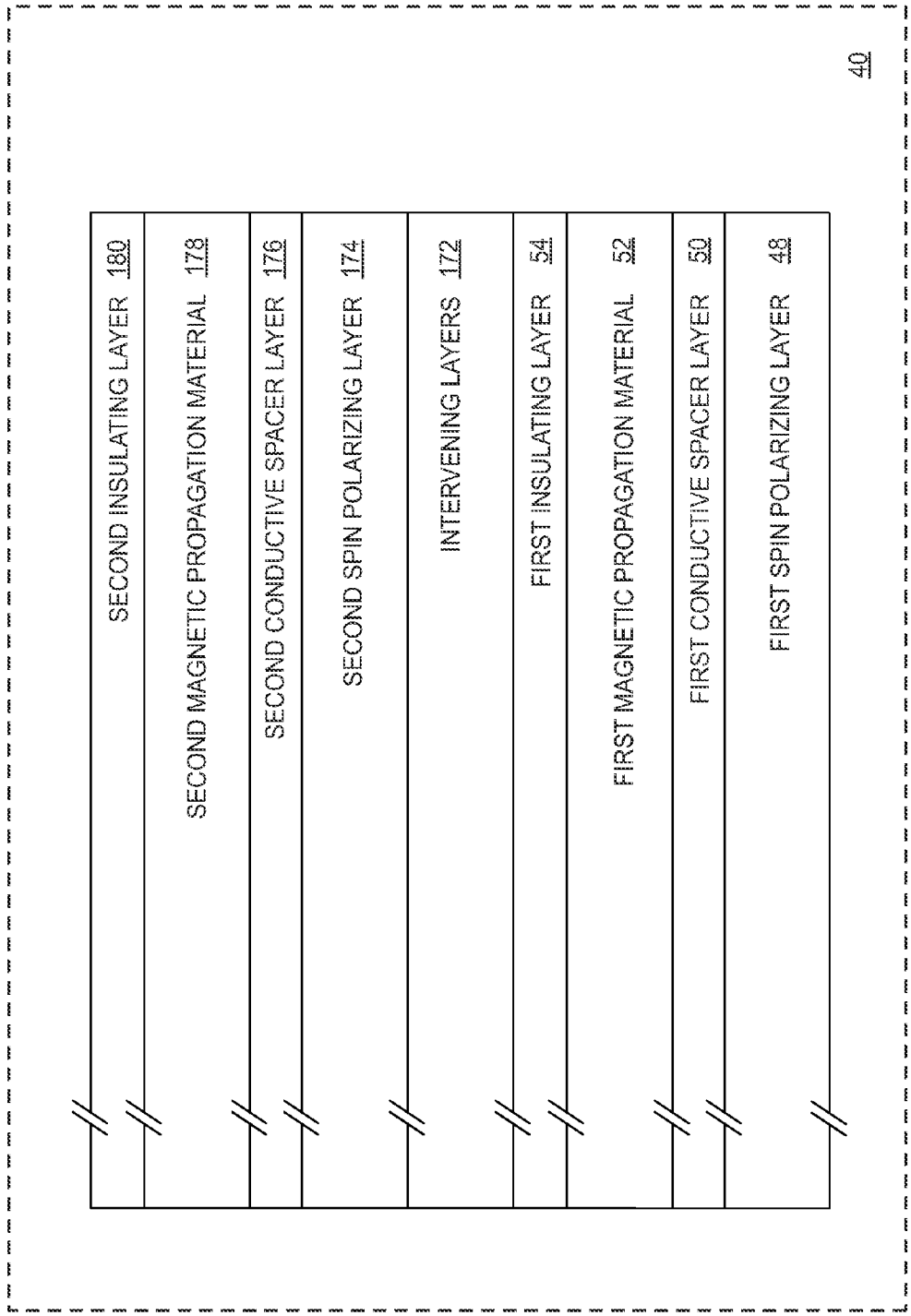

FIG. 30 shows the frontwise cross-section of the ASTNO structure illustrated in FIG. 5 according to an additional embodiment of the ASTNO structure.

Figure 31:
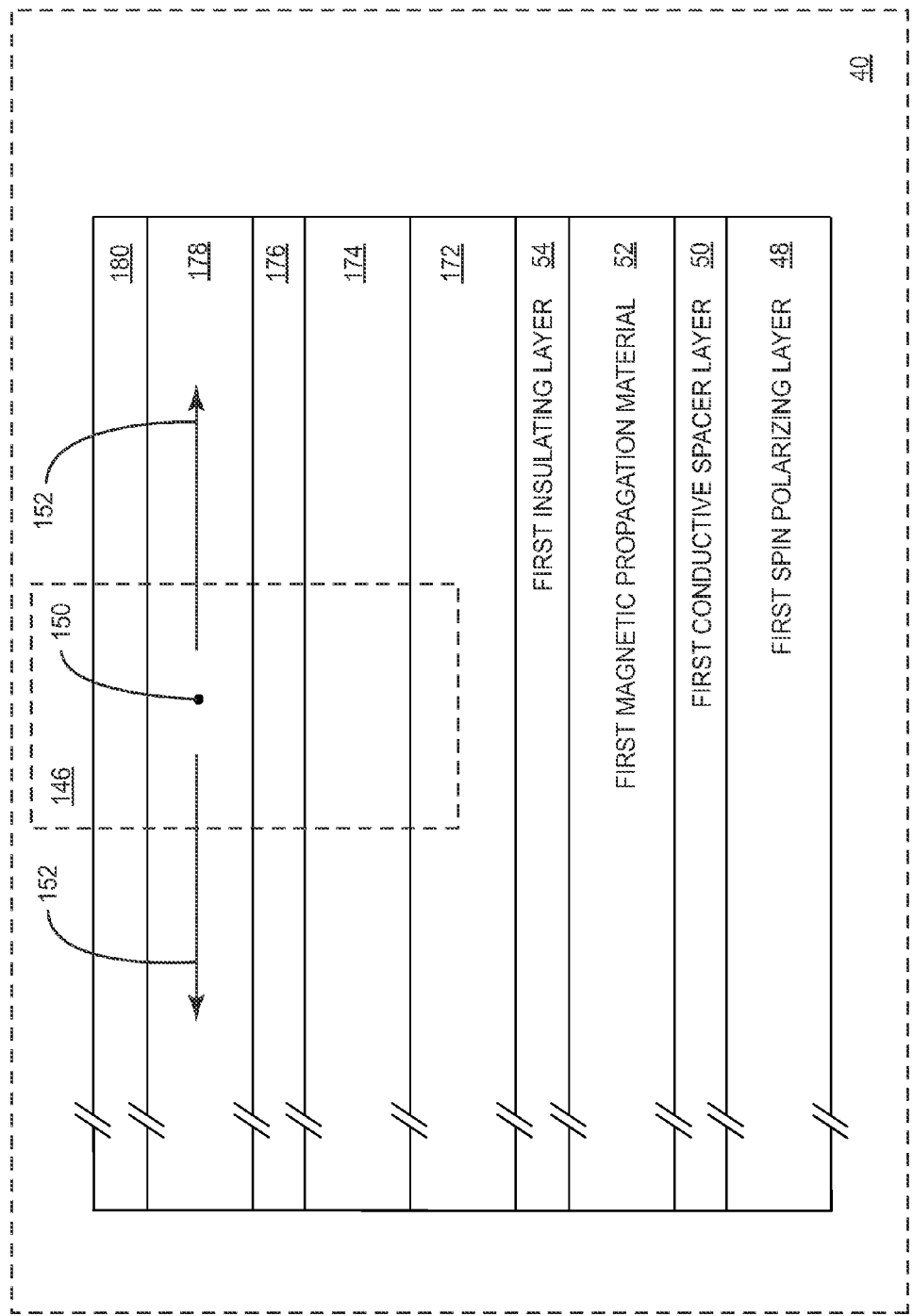

FIG. 31 shows details of the ASTNO structure illustrated in FIG. 30 according to one embodiment of the ASTNO structure.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to a nano-oscillator magnetic wave propagation system having a group of aggregated spin-torque nano-oscillators (ASTNOs), which share a magnetic propagation material. Each of the group of ASTNOs is disposed about an emanating point in the magnetic propagation material. During a non-wave propagation state of the nano-oscillator magnetic wave propagation system, the magnetic propagation material receives a polarizing magnetic field. During a wave propagation state of the nano-oscillator magnetic wave propagation system, each of the group of ASTNOs initiates spin waves through the magnetic propagation material, such that a portion of the spin waves initiated from each of the group of ASTNOs combine to produce an aggregation of spin waves emanating from the emanating point. The aggregation of spin waves may provide a sharper wave-front and a larger wave-front amplitude than wave-fronts and wave-front amplitudes of the individual spin waves initiated from each of the group of ASTNOs. The sharper wave-front and larger wave-front amplitude of the aggregation of spin waves may enhance detection of the spin waves.

In one embodiment of the nano-oscillator magnetic wave propagation system, the nano-oscillator magnetic wave propagation system is a spin-wave wave-front based system, which detects and responds to certain wave-fronts of spin waves propagating through the magnetic propagation material. Such a system may be used in a spin-wave based polychronous wave propagation system, which may provide polychronous activity that is analogous to polychronous activity in a brain. In an alternate embodiment of the nano-oscillator magnetic wave propagation system, the nano-oscillator magnetic wave propagation system is a spin-wave based communications system, which uses spin waves propagating through the magnetic propagation material to convey information. In an additional embodiment of the nano-oscillator magnetic wave propagation system, the nano-oscillator magnetic wave propagation system is a spin-wave based measurement system, which measures the effects of one or more physical entities upon spin waves propagating through the magnetic propagation material. Examples of the physical entities include radio frequency (RF) energy, light, vibration, sound waves, temperature, radiation, and the like. As such, the spin-wave based measurement system may be used as a sensor or transducer.

In another embodiment of the nano-oscillator magnetic wave propagation system, the nano-oscillator magnetic wave propagation system is an energy capturing system, which uses spin waves propagating through the magnetic propagation material to capture energy, direct energy, or both. In a further embodiment of the nano-oscillator magnetic wave propagation system, the nano-oscillator magnetic wave propagation system is a spin-wave locking system, which phase locks or frequency locks a spin-torque nano-oscillator (STNO) to spin waves propagating through the magnetic propagation material. In a supplemental embodiment of the nano-oscillator magnetic wave propagation system, the nano-oscillator magnetic wave propagation system is a data memory storage system, which uses the magnetic propagation material to store information, such that the spin waves propagating through the magnetic propagation material directly, indirectly, or both store and retrieve the information.

FIG. 4 shows details of a nano-oscillator magnetic wave propagation system 36 according to one embodiment of the nano-oscillator magnetic wave propagation system 36. The nano-oscillator magnetic wave propagation system 36 includes control circuitry 38, an ASTNO structure 40, and a polarizing magnetic field system 42. The control circuitry 38 provides a magnetic field configuration signal MFC to the polarizing magnetic field system 42, which has magnetic coupling 44 to the ASTNO structure 40 and provides a first polarizing magnetic field 46 to the ASTNO structure 40 via the magnetic coupling 44 based on the magnetic field configuration signal MFC.

In an alternate embodiment of the nano-oscillator magnetic wave propagation system 36, the polarizing magnetic field system 42 includes one or more permanent magnets to provide the first polarizing magnetic field 46 continuously. As such, the magnetic field configuration signal MFC is omitted. In an additional embodiment of the nano-oscillator magnetic wave propagation system 36, the first polarizing magnetic field 46 is omitted. As such, the polarizing magnetic field system 42, the magnetic coupling 44, and the magnetic field configuration signal MFC are omitted.

During operation, the control circuitry 38 selects one of a first wave propagation state and a non-wave propagation state. During the non-wave propagation state, the polarizing magnetic field system 42 provides the first polarizing magnetic field 46 based on the magnetic field configuration signal MFC. In one embodiment of the polarizing magnetic field system 42, during the first wave propagation state, the polarizing magnetic field system 42 does not provide the first polarizing magnetic field 46 based on the magnetic field configuration signal MFC. In an alternate embodiment of the polarizing magnetic field system 42, during the first wave propagation state, the polarizing magnetic field system 42 provides the first polarizing magnetic field 46 at about the same magnitude as during the non-wave propagation state based on the magnetic field configuration signal MFC. In an additional embodiment of the polarizing magnetic field system 42, during the first wave propagation state, the polarizing magnetic field system 42 provides the first polarizing magnetic field 46 at a reduced magnitude based on the magnetic field configuration signal MFC.

During the first wave propagation state, the control circuitry 38 provides a first alpha entering excitation current FAEI and a second alpha entering excitation current SAEI to the ASTNO structure 40. Additionally, during the first wave propagation state, the control circuitry 38 receives a first alpha exiting excitation current FAXI based on the first alpha entering excitation current FAEI and receives a second alpha exiting excitation current SAXI based on the second alpha entering excitation current SAEI. In general, during the first wave propagation state, the control circuitry 38 provides a first group of entering excitation currents, which includes the first alpha entering excitation current FAEI and the second alpha entering excitation current SAEI, and the control circuitry 38 receives a first group of exiting excitation currents, which includes the first alpha exiting excitation current FAXI and the second alpha exiting excitation current SAXI, The first group of exiting excitation currents is based on the first group of entering excitation currents. During the non-wave propagation state, the control circuitry 38 does not provide the first alpha entering excitation current FAEI and does not provide the second alpha entering excitation current SAEI. The directions of the excitation currents FAEI, FAXI, SAEI, SAXI illustrated in FIG. 4 are indicative of the direction of electron flow.

FIG. 5 shows the ASTNO structure 40 illustrated in FIG. 4 according to one embodiment of the ASTNO structure 40. The ASTNO structure 40 includes a first spin polarizing layer 48, a first conductive spacer layer 50 over the first spin polarizing layer 48, a first magnetic propagation material 52 over the first conductive spacer layer 50, and a first insulating layer 54 over the first magnetic propagation material 52. As such, there may be at least one intervening layer between the first spin polarizing layer 48 and the first conductive spacer layer 50. There may be at least one intervening layer between the first conductive spacer layer 50 and the first magnetic propagation material 52. There may be at least one intervening layer between the first magnetic propagation material 52 and the first insulating layer 54. The ASTNO structure 40 illustrated in FIG. 5 shows a location for a frontwise cross-section FWCS of the ASTNO structure 40 and a location for a topwise cross-section TWOS of the ASTNO structure 40. In one embodiment of the first spin polarizing layer 48, the first spin polarizing layer 48 is about ten nanometers thick. Alternate embodiments of the first spin polarizing layer 48 may be of any thickness. In one embodiment of the first magnetic propagation material 52, the first magnetic propagation material 52 is a thin-film ferromagnet. In one embodiment of the first magnetic propagation material 52, the first magnetic propagation material 52 is between about 0.5 nanometers thick and about five nanometers thick. In an exemplary embodiment of the first magnetic propagation material 52, the first magnetic propagation material 52 is about one nanometer thick. In one embodiment of the first magnetic propagation material 52, the first magnetic propagation material 52 is a combination of films. In alternate embodiments of the ASTNO structure 40, any or all of the layers 48, 50, 52, 54 may be omitted; additional layers (not shown) may be added, or both.

In an alternate embodiment of the ASTNO structure 40, the first conductive spacer layer 50 is directly over the first spin polarizing layer 48, the first magnetic propagation material 52 is directly over the first conductive spacer layer 50, and the first insulating layer 54 is directly over the first magnetic propagation material 52. As such, there are no intervening layers between the first spin polarizing layer 48 and the first conductive spacer layer 50. There are no intervening layers between the first conductive spacer layer 50 and the first magnetic propagation material 52. There are no intervening layers between the first magnetic propagation material 52 and the first insulating layer 54.

FIG. 6 shows the frontwise cross-section FWCS of the ASTNO structure 40 illustrated in FIG. 5 according to one embodiment of the ASTNO structure 40. The ASTNO structure 40 illustrated in FIG. 6 includes the first spin polarizing layer 48, the first conductive spacer layer 50, the first magnetic propagation material 52, the first insulating layer 54, and a first group 56 of ASTNOs, which includes a first alpha ASTNO 58 and a second alpha ASTNO 60. The first alpha ASTNO 58 and the second alpha ASTNO 60 share the first spin polarizing layer 48, the first conductive spacer layer 50, the first magnetic propagation material 52, and the first insulating layer 54. In general, all of the first group 56 of ASTNOs share the first spin polarizing layer 48, the first conductive spacer layer 50, the first magnetic propagation material 52, and the first insulating layer 54.

The first magnetic propagation material 52 is planar material having a first planar surface 62 and a second planar surface 64, which is about parallel to and opposite from the first planar surface 62. In alternate embodiments of the first magnetic propagation material 52, the first magnetic propagation material 52 is not planar material. A hole traverses the first insulating layer 54, thereby exposing a first point contact 66 on the first planar surface 62 and another hole traverses the first insulating layer 54, thereby exposing a second point contact 68 on the first planar surface 62. As such, the first magnetic propagation material 52 includes the first point contact 66 and the second point contact 68 on the first magnetic propagation material 52. The first alpha ASTNO 58 includes the first point contact 66 and the second alpha ASTNO 60 includes the second point contact 68. In general, the first group 56 of ASTNOs includes a first group of point contacts, which include the first point contact 66 and the second point contact 68. As such, the first magnetic propagation material 52 includes the first group of point contacts on the first magnetic propagation material 52.

Both the first spin polarizing layer 48 and the first magnetic propagation material 52 are magnetic materials, such as ferromagnetic materials. As such, the first spin polarizing layer 48 has a first net polarizing magnetic moment 70, which may be based on permanent magnetization of the first spin polarizing layer 48 or from external magnetization (not shown) of the first spin polarizing layer 48. The first magnetic propagation material 52 has small magnetic elements having magnetic moments 20. In general, the first magnetic propagation material 52 has a first group of magnetic moments 20.

In one embodiment of the first magnetic propagation material 52, during at least the non-wave propagation state, the first magnetic propagation material 52 receives the first polarizing magnetic field 46 provided by the polarizing magnetic field system 42 (FIG. 4). In the absence of other influences, the magnetic moments 20 of the first magnetic propagation material 52 may have a first magnetization direction 72, which may be approximately aligned with the first polarizing magnetic field 46. In general, during the non-wave propagation state, the magnetic moments 20 of the first magnetic propagation material 52 may be substantially oriented based on the first polarizing magnetic field 46.

In an alternate embodiment of the first magnetic propagation material 52, during at least the non-wave propagation state, the first polarizing magnetic field 46 is omitted. As such, the magnetic moments 20 of the first magnetic propagation material 52 may have the first magnetization direction 72, such that the magnetic moments 20 are approximately aligned with one another. In general, during the non-wave propagation state, the magnetic moments 20 of the first magnetic propagation material 52 may be substantially oriented based on magnetic anisotropy or other forces.

During the first wave propagation state, the first alpha ASTNO 58 receives the first alpha entering excitation current FAEI. The first alpha entering excitation current FAEI includes electrons, which are used as charge carriers. The first alpha entering excitation current FAEI is normally un-polarized, such that orientation of the spin of the charge carriers is random. However, by passing the first alpha entering excitation current FAEI through the first spin polarizing layer 48 and since the first spin polarizing layer 48 has the first net polarizing magnetic moment 70, the current inside the first spin polarizing layer 48 becomes spin-polarized to provide a first alpha spin-polarized excitation current FASI to the first conductive spacer layer 50. The first conductive spacer layer 50 substantially magnetically isolates the first magnetic propagation material 52 from the first spin polarizing layer 48, such that the first net polarizing magnetic moment 70 does not significantly magnetically influence the magnetic moments 20 of the small magnetic elements in the first magnetic propagation material 52.

The first alpha spin-polarized excitation current FASI is forwarded through the first conductive spacer layer 50 into the first magnetic propagation material 52. Polarization of the charge carriers in the first alpha spin-polarized excitation current FASI produces an excitation of the magnetic moments 20 of some of the small magnetic elements in the first magnetic propagation material 52. As such, the spin-transfer torque effect is exerted by the first alpha spin-polarized excitation current FASI on the first magnetic propagation material 52. Specifically, when the polarization of the charge carriers and magnetization of the film are not parallel, the spin-transfer torque will be exerted to alter the direction of the magnetic moments 20 of the small magnetic elements in the first magnetic propagation material 52. This spin-transfer torque is propagated to adjacent small magnetic elements in the first magnetic propagation material 52, thereby altering the directions of the magnetic moments 20 of the adjacent small magnetic elements in the first magnetic propagation material 52. In this regard, the propagation of the spin-transfer torque drives oscillations in the directions of the magnetic moments 20 of the small magnetic elements in the magnetic film 16. These oscillations are called spin waves 24 and propagate out from first alpha spin-polarized excitation current FASI. The first alpha spin-polarized excitation current FASI flows through the first magnetic propagation material 52 and through the first point contact 66 to exit as the first alpha exiting excitation current FAXI. In general, during the first wave propagation state, the spin waves 24 initiated from the first group 56 of ASTNOs propagate through the first magnetic propagation material 52 by magnetically coupling to nearby magnetic moments 20 in the first magnetic propagation material 52.

During the first wave propagation state, the second alpha ASTNO 60 receives the second alpha entering excitation current SAEI. The second alpha entering excitation current SAEI includes electrons, which are used as charge carriers. The second alpha entering excitation current SAEI is normally un-polarized, such that orientation of the spin of the charge carriers is random. However, by passing the second alpha entering excitation current SAEI through the first spin polarizing layer 48 and since the first spin polarizing layer 48 has the first net polarizing magnetic moment 70, the current inside the first spin polarizing layer 48 becomes spin-polarized to provide a second alpha spin-polarized excitation current SASI to the first conductive spacer layer 50.

The second alpha spin-polarized excitation current SASI is forwarded through the first conductive spacer layer 50 into the first magnetic propagation material 52. Polarization of the charge carriers in the second alpha spin-polarized excitation current SASI produces an excitation of the magnetic moments 20 of some of the small magnetic elements in the first magnetic propagation material 52. As such, the spin-transfer torque effect is exerted by the second alpha spin-polarized excitation current SASI on the first magnetic propagation material 52. As a result, spin-transfer torque is propagated to adjacent small magnetic elements in the first magnetic propagation material 52, thereby altering the directions of the magnetic moments 20 of the adjacent small magnetic elements in the first magnetic propagation material 52. In this regard, the propagation of the spin-transfer torque drives spin waves 24 that propagate out from second alpha spin-polarized excitation current SASI. The second alpha spin-polarized excitation current SASI flows through the first magnetic propagation material 52 and through the second point contact 68 to exit as second alpha exiting excitation current SAXI. The magnetic moments 20 of the small magnetic elements in the first magnetic propagation material 52 collectively have the first magnetization direction 72, which may be substantially based on the first polarizing magnetic field 46, on magnetic anisotropy, or on other forces.

In general, during the first wave propagation state, the first group 56 of ASTNOs has a first group of spin-polarized excitation currents, which include the first alpha spin-polarized excitation current FASI and the second alpha spin-polarized excitation current SASI. Each of the first group 56 of ASTNOs has a corresponding one of the first group of spin-polarized excitation currents. Each of the first group of spin-polarized excitation currents exerts spin-torque on a corresponding portion of the first group of magnetic moments 20. Further, each of the first group 56 of ASTNOs has a corresponding one of the first group of point contacts, such that the corresponding one of the first group of spin-polarized excitation currents provides a corresponding one of the first group of exiting excitation currents via a corresponding one of the first plurality of point contacts. The control circuitry 38 (FIG. 4) receives the first group of exiting excitation currents via the first group of point contacts.

In a first embodiment of the first group 56 of ASTNOs and the first magnetic propagation material 52, the spin waves 24 initiated from the first group 56 of ASTNOs propagate through the first magnetic propagation material 52 having a frequency between about 500 megahertz and about 200 gigahertz. In a second embodiment of the first group 56 of ASTNOs and the first magnetic propagation material 52, the spin waves 24 initiated from the first group 56 of ASTNOs propagate through the first magnetic propagation material 52 having a frequency between about one gigahertz and about 100 gigahertz. In one embodiment of the first group 56 of ASTNOs and the first magnetic propagation material 52, the spin waves 24 initiated from the first group 56 of ASTNOs have an effective propagation distance on the order of tens of micrometers. In one embodiment of the first group 56 of ASTNOs and the first magnetic propagation material 52, the spin waves 24 initiated from the first group 56 of ASTNOs propagate through the first magnetic propagation material 52 with a propagation velocity on the order of thousands of meters per second.

FIG. 7 shows further details of the ASTNO structure 40 illustrated in FIG. 6 according to one embodiment of the ASTNO structure 40. The ASTNO structure 40 illustrated in FIG. 7 is similar to the ASTNO structure 40 illustrated in FIG. 6, except the ASTNO structure 40 illustrated in FIG. 7 further includes a first emanating point 74 in the first magnetic propagation material 52, such that the first alpha ASTNO 58 and the second alpha ASTNO 60 are disposed about the first emanating point 74. As such, the first point contact 66 and the second point contact 68 are disposed about the first emanating point 74. In one embodiment of the ASTNO structure 40, the first emanating point 74 is a first centroid, such that the first alpha ASTNO 58 and the second alpha ASTNO 60 are about equidistantly located from the first emanating point 74. The first point contact 66 and the second point contact 68 may be about equidistantly located from the first emanating point 74, such that each of the first group of point contacts is about equidistantly located from the first emanating point 74. Additionally, the ASTNO structure 40 illustrated in FIG. 7 further shows a first aggregation 76 of spin waves emanating from the first emanating point 74. A portion of the spin waves 24 (FIG. 6) from the first alpha ASTNO 58 and a portion of the spin waves 24 (FIG. 6) from the second alpha ASTNO 60 combine to produce the first aggregation 76 of spin waves. The first aggregation 76 of spin waves propagates outward from the first emanating point 74 with a declining amplitude 26.

In one embodiment of the first group 56 of ASTNOs, the spin waves 24 (FIG. 6) from the first alpha ASTNO 58 and the spin waves 24 (FIG. 6) from the second alpha ASTNO 60 are initiated simultaneously and have corresponding wave-fronts and wave-front amplitudes. The spin waves 24 (FIG. 6) from the first alpha ASTNO 58 and the spin waves 24 (FIG. 6) from the second alpha ASTNO 60 combine to produce the first aggregation 76 of spin waves, such that the first aggregation 76 of spin waves has a wave-front and a wave-front amplitude. As such, the first aggregation 76 of spin waves may provide a sharper wave-front and a larger wave-front amplitude than wave-fronts and wave-front amplitudes of the spin waves 24 (FIG. 6) initiated from each of the first group 56 of ASTNOs. The sharper wave-front and larger wave-front amplitude of the first aggregation 76 of spin waves may enhance detection of the spin waves.

In general, each of the first group 56 of ASTNOs is disposed about the first emanating point 74 and each of the first group of point contacts is disposed about the first emanating point 74. In one embodiment of the ASTNO structure 40, the first emanating point 74 is the first centroid, such that each of the first group 56 of ASTNOs is about equidistantly located from the first emanating point 74 and each of the first group of point contacts is about equidistantly located from the first emanating point 74.

During the first wave propagation state, each of the first group of point contacts and a corresponding portion of the first magnetic propagation material 52 provide a corresponding one of the first group 56 of ASTNOs. Further, each of the first group 56 of ASTNOs initiates spin waves 24 (FIG. 6) through the first magnetic propagation material 52, such that a portion of the spin waves 24 (FIG. 6) from each of the first group 56 of ASTNOs combine to produce the first aggregation 76 of spin waves emanating from the first emanating point 74. In one embodiment of the first magnetic propagation material 52, the first magnetic propagation material 52 is planar material, such that the first aggregation 76 of spin waves propagates predominantly in two dimensions. Further, in one embodiment of the ASTNO structure 40, during the first wave propagation state, each of the first group 56 of ASTNOs about simultaneously initiates spin waves 24 (FIG. 6) through the first magnetic propagation material 52.

FIG. 8 shows a frontwise cross-section of the ASTNO structure 40 illustrated in FIG. 4 according to an alternate embodiment of the ASTNO structure 40. The ASTNO structure 40 illustrated in FIG. 8 is similar to the ASTNO structure 40 illustrated in FIG. 7, except the ASTNO structure 40 illustrated in FIG. 7 is a planar structure, whereas the ASTNO structure 40 illustrated in FIG. 8 is a spherical structure. In this regard, the first spin polarizing layer 48, the first conductive spacer layer 50, and the first insulating layer 54 of the ASTNO structure 40 illustrated in FIG. 7 are replaced with a spherical spin polarizing layer 78, a spherical conductive spacer layer 80, and a spherical insulating layer 82, respectively, in the ASTNO structure 40 illustrated in FIG. 8.

The first magnetic propagation material 52 illustrated in FIG. 7 is planar material, whereas the first magnetic propagation material 52 illustrated in FIG. 8 is spherical material. As such, directions of the first polarizing magnetic field 46 and the first magnetization direction 72 illustrated in FIG. 8 change to follow curvature of the first magnetic propagation material 52, whereas the directions of the first polarizing magnetic field 46 and the first magnetization direction 72 illustrated in FIG. 7 are about constant throughout the first magnetic propagation material 52. Similarly, propagation of the first aggregation 76 of spin waves illustrated in FIG. 8 changes to follow curvature of the first magnetic propagation material 52, whereas the propagation of the first aggregation 76 of spin waves illustrated in FIG. 7 is predominantly in two dimensions. As such, the first magnetic propagation material 52 is bulk material, such that the first aggregation 76 of spin waves propagates in three dimensions. Other embodiments of the first magnetic propagation material 52 may propagate in alternate three dimensional patterns.

The first spin polarizing layer 48 illustrated in FIG. 7 is planar material, whereas the spherical spin polarizing layer 78 illustrated in FIG. 8 is spherical material. As such, the direction of the first net polarizing magnetic moment 70 illustrated in FIG. 8 changes to follow curvature of the spherical spin polarizing layer 78, whereas the direction of the first net polarizing magnetic moment 70 illustrated in FIG. 7 is about constant throughout the first spin polarizing layer 48.

FIGS. 9A, 9B, 9C, and 9D show the topwise cross-section TWOS of the ASTNO structure 40 illustrated in FIG. 5 according to an additional embodiment of the ASTNO structure 40. The topwise cross-section TWOS of the ASTNO structure 40 is taken inside the first magnetic propagation material 52. Further, the topwise cross-section TWOS illustrated in FIGS. 9A, 9B, 9C, and 9D includes portions of the first group 56 of ASTNOs and shows portions of the first alpha ASTNO 58, the second alpha ASTNO 60, and a third alpha ASTNO 84 in the first magnetic propagation material 52. Additionally, the topwise cross-section TWOS of the ASTNO structure 40 shows the first emanating point 74, a first intersection point 86, a second intersection point 88, and a third intersection point 90 in the first magnetic propagation material 52. The first emanating point 74 illustrated in FIGS. 9A, 9B, 9C, and 9D is the first centroid.

Each of the alpha ASTNOs 58, 60, 84 is located at a corresponding vertex of a first equilateral triangle (not shown). Additionally, each of the intersection points 86, 88, 90 is located at a corresponding vertex of a second equilateral triangle (not shown). The first emanating point 74 provides a centroid of the first equilateral triangle and a centroid of the second equilateral triangle, which is rotated from the first equilateral triangle by 60 degrees. As such, the vertices of the first equilateral triangle and the second equilateral triangle provide vertices for a regular hexagon (not shown). Alternate embodiments (not shown) of the first group 56 of ASTNOs may include any number of ASTNOs 58, 60, 84 associated with any number of intersection points 86, 88, 90. Further, the ASTNOs 58, 60, 84 may be located at the vertices of a polygon having any number of sides and the intersection points 86, 88, 90 may be located at the vertices of a polygon having any number of sides.

Figure 9B:
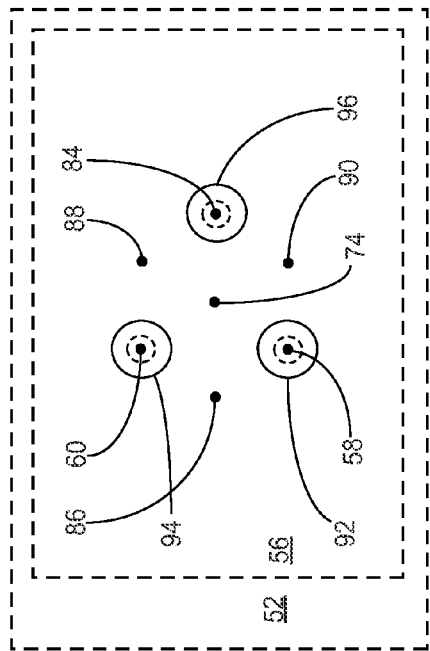

The first alpha ASTNO 58, the second alpha ASTNO 60, and the third alpha ASTNO 84 are excited simultaneously and begin emanating spin waves 24 (FIG. 6). As such, FIG. 9B shows a first spin-wave wave-front 92 of the spin waves 24

(FIG. 6) emanating from the first alpha ASTNO 58, a second spin-wave wave-front 94 of the spin waves 24 (FIG. 6) emanating from the second alpha ASTNO 60, and a third spin-wave wave-front 96 of the spin waves 24 (FIG. 6) emanating from the third alpha ASTNO 84. The first spin-wave wave-front 92 has a first wave-front amplitude (not shown). The second spin-wave wave-front 94 has a second wave-front amplitude (not shown). The third spin-wave wave-front 96 has a third wave-front amplitude (not shown).

Figure 9D:
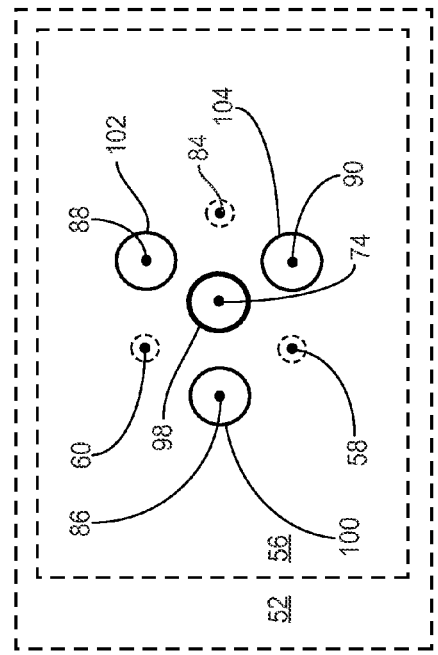
Figure 9A:
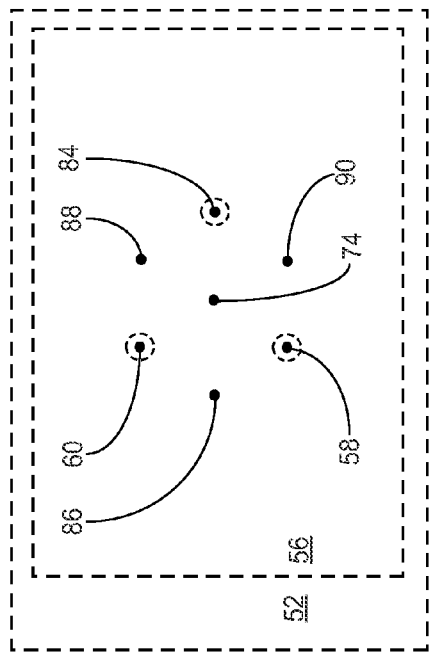
Figure 9C:
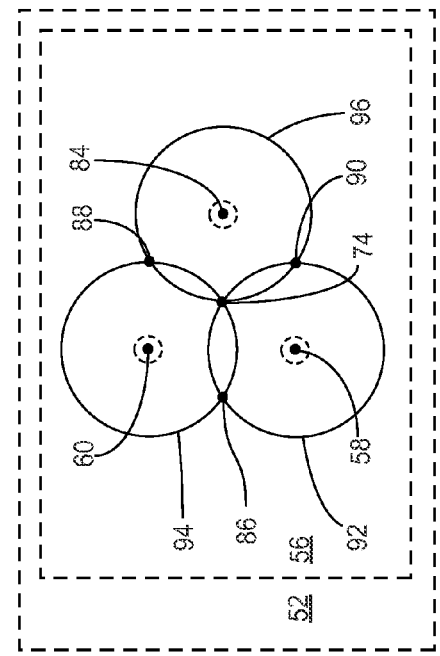

FIG. 9C shows the spin-wave wave-fronts 92, 94, 96 illustrated in FIG. 9B at a later time, such that the first spin-wave wave-front 92 has reached the first emanating point 74, the first intersection point 86, and the third intersection point 90; the second spin-wave wave-front 94 has reached the first emanating point 74, the first intersection point 86, and the second intersection point 88; and the third spin-wave wave-front 96 has reached the first emanating point 74, the third intersection point 90, and the second intersection point 88. As such, a portion of the spin waves 24 (FIG. 6) from the first alpha ASTNO 58, a portion of the spin waves 24 (FIG. 6) from the second alpha ASTNO 60, and a portion of the spin waves 24 from the third alpha ASTNO 84 combine to provide the first aggregation 76 (FIG. 7) of spin waves emanating from the first emanating point 74.

A portion of the spin waves 24 (FIG. 6) from the first alpha ASTNO 58 and a portion of the spin waves 24 (FIG. 6) from the second alpha ASTNO 60 combine to provide a first partial aggregation of spin waves emanating from the first intersection point 86. A portion of the spin waves 24 (FIG. 6) from the second alpha ASTNO 60 and a portion of the spin waves 24 from the third alpha ASTNO 84 combine to provide a second partial aggregation of spin waves emanating from the second intersection point 88. A portion of the spin waves 24 from the third alpha ASTNO 84 and a portion of the spin waves 24 (FIG. 6) from the first alpha ASTNO 58 combine to provide a third partial aggregation of spin waves emanating from the third intersection point 90.

FIG. 9D shows a first aggregated spin-wave wave-front 98 of the first aggregation 76 (FIG. 7) of spin waves emanating from the first emanating point 74 and a first partially aggregated spin-wave wave-front 100 of the first partial aggregation of spin waves emanating from the first intersection point 86. FIG. 9D further shows a second partially aggregated spin-wave wave-front 102 of the second partial aggregation of spin waves emanating from the second intersection point 88 and a third partially aggregated spin-wave wave-front 104 of the third partial aggregation of spin waves emanating from the third intersection point 90. The first spin-wave wave-front 92, the second spin-wave wave-front 94, and the third spin-wave wave-front 96 are present but are not shown in FIG. 9D for clarity. The spin-wave wave-fronts 98, 100, 102, 104 illustrated in FIG. 9D may be formed from outgoing interference patterns of energy from individual spin waves 24 (FIG. 6) as governed by Schrödinger equation. As such, the spin-wave wave-fronts 98, 100, 102, 104 may not behave like other types of wave-fronts, such as water waves, which may be governed by a wave equation.

The first aggregated spin-wave wave-front 98 has a first aggregated wave-front amplitude (not shown). The first partially aggregated spin-wave wave-front 100 has a first partially aggregated wave-front amplitude (not shown). The second partially aggregated spin-wave wave-front 102 has a second partially aggregated wave-front amplitude (not shown). The third partially aggregated spin-wave wave-front 104 has a third partially aggregated wave-front amplitude (not shown).

The first partially aggregated spin-wave wave-front 100 is provided by spin waves from two ASTNOs, namely the first alpha ASTNO 58 and the second alpha ASTNO 60. Similarly, the second partially aggregated spin-wave wave-front 102 is provided by spin waves from two ASTNOs and the third partially aggregated spin-wave wave-front 104 is provided by spin waves from two ASTNOs. However, the first aggregated spin-wave wave-front 98 is provided by spin waves from three ASTNOs, namely the first alpha ASTNO 58, the second alpha ASTNO 60, and the third alpha ASTNO 84. Further, each of the first spin-wave wave-front 92, the second spin-wave wave-front 94, and the third spin-wave wave-front 96 is provided by spin waves from only one ASTNO, namely the first alpha ASTNO 58, the second alpha ASTNO 60, and the third alpha ASTNO 84, respectively.

In this regard, the first partially aggregated wave-front amplitude may be greater than any or all of the first wave-front amplitude, the second wave-front amplitude, and the third wave-front amplitude. The second partially aggregated wave-front amplitude may be greater than any or all of the first wave-front amplitude, the second wave-front amplitude, and the third wave-front amplitude. The third partially aggregated wave-front amplitude may be greater than any or all of the first wave-front amplitude, the second wave-front amplitude, and the third wave-front amplitude. The first aggregated wave-front amplitude may be greater than any or all of the first wave-front amplitude, the second wave-front amplitude, and the third wave-front amplitude. Further, the first aggregated wave-front amplitude may be greater than any or all of the first partially aggregated wave-front amplitude, the second partially aggregated wave-front amplitude, and the third partially aggregated wave-front amplitude.

The larger amplitudes may improve detection of any or all of the first aggregated spin-wave wave-front 98, the first partially aggregated spin-wave wave-front 100, the second partially aggregated spin-wave wave-front 102, and the third partially aggregated spin-wave wave-front 104. In one embodiment of the first group 56 (FIG. 6) of ASTNOs, the first aggregated spin-wave wave-front 98 is detected and none of the first spin-wave wave-front 92, the second spin-wave wave-front 94, the third spin-wave wave-front 96, the first partially aggregated spin-wave wave-front 100, the second partially aggregated spin-wave wave-front 102, and the third partially aggregated spin-wave wave-front 104 are detected. In an alternate embodiment of the first group 56 (FIG. 6) of ASTNOs, the first aggregated spin-wave wave-front 98, the first partially aggregated spin-wave wave-front 100, the second partially aggregated spin-wave wave-front 102, and the third partially aggregated spin-wave wave-front 104 are detected and none of the first spin-wave wave-front 92, the second spin-wave wave-front 94, and the third spin-wave wave-front 96, are detected. In an additional embodiment of the first group 56 (FIG. 6) of ASTNOs, all of the first aggregated spin-wave wave-front 98, the first partially aggregated spin-wave wave-front 100, the second partially aggregated spin-wave wave-front 102, the third partially aggregated spin-wave wave-front 104, the first spin-wave wave-front 92, the second spin-wave wave-front 94, and the third spin-wave wave-front 96, are detected.

Additionally, the first partially aggregated spin-wave wave-front 100 may have a sharper wave-front than wave-fronts of any or all of the first spin-wave wave-front 92, the second spin-wave wave-front 94, and the third spin-wave wave-front 96. The second partially aggregated spin-wave wave-front 102 may have a sharper wave-front than wave-fronts of any or all of the first spin-wave wave-front 92, the second spin-wave wave-front 94, and the third spin-wave wave-front 96. The third partially aggregated spin-wave wave-front 104 may have a sharper wave-front than wave-fronts of any or all of the first spin-wave wave-front 92, the second spin-wave wave-front 94, and the third spin-wave wave-front 96. The first aggregated spin-wave wave-front 98 may have a sharper wave-front than wave-fronts of any or all of the first spin-wave wave-front 92, the second spin-wave wave-front 94, and the third spin-wave wave-front 96. Further, the first aggregated spin-wave wave-front 98 may have a sharper wave-front than wave-fronts of any or all of the first partially aggregated spin-wave wave-front 100, the second partially aggregated spin-wave wave-front 102, and the third partially aggregated spin-wave wave-front 104. The sharper wave-fronts may improve timing repeatability, timing resolution, reliability, or any combination thereof of detection of any or all of the first aggregated spin-wave wave-front 98, the first partially aggregated spin-wave wave-front 100, the second partially aggregated spin-wave wave-front 102, and the third partially aggregated spin-wave wave-front 104.

In general, the spin waves 24 (FIG. 6) from each of the first group 56 (FIG. 6) of ASTNOs have a corresponding spin-wave wave-front with a corresponding wave-front amplitude. As previously mentioned, a portion of the spin waves 24 (FIG. 6) from each of the first group 56 (FIG. 6) of ASTNOs combine to produce the first aggregation 76 (FIG. 7) of spin waves. The first aggregation 76 (FIG. 7) of spin waves has the first aggregated spin-wave wave-front 98, which has the first aggregated wave-front amplitude. In one embodiment of the first group 56 (FIG. 6) of ASTNOs, the first aggregated wave-front amplitude is greater than each corresponding wave-front amplitude. Additionally, in one embodiment of the first group 56 (FIG. 6) of ASTNOs, the first aggregated spin-wave wave-front 98 is detected and none of the corresponding spin-wave wave-fronts are detected.

A portion of the spin waves 24 (FIG. 6) from each of the first group 56 (FIG. 6) of ASTNOs combine to produce a group of partially aggregated spin waves. Each of the group of partially aggregated spin waves has a corresponding partially aggregated spin-wave wave-front with a corresponding partially aggregated wave-front amplitude. In one embodiment of the first group 56 (FIG. 6) of ASTNOs, the first aggregated wave-front amplitude is greater than each corresponding partially aggregated wave-front amplitude. Further, in one embodiment of the first group 56 (FIG. 6) of ASTNOs, each corresponding partially aggregated wave-front amplitude is greater than each corresponding wave-front amplitude. Additionally, in one embodiment of the first group 56 (FIG. 6) of ASTNOs, the first aggregated spin-wave wave-front 98 is detected, none of the corresponding partially aggregated spin-wave wave-fronts are detected, and none of the corresponding spin-wave wave-fronts are detected. In an alternate embodiment of the first group 56 (FIG. 6) of ASTNOs, all of the first aggregated spin-wave wave-front 98 and the corresponding partially aggregated spin-wave wave-fronts are detected, and none of the corresponding spin-wave wave-fronts are detected.

A distinction between "amplitudes" of wave-fronts and "sharpness" of wave-fronts is presented according to one embodiment of the present disclosure. The "amplitudes" of wave-fronts may relate to constructive interference that leads to particular propagation patterns, whereas "sharpness" of the wave-fronts may refer to spin wave packets that propagate in time, as would a pulse or spike of electromagnetic (EM) radiation in an EM system. The amplitude of wave-fronts may be based on the locations/geometry of the ASTNOs 58, 60, 84 in the first magnetic propagation material 52. The sharpness of wave-fronts may be based on how the ASTNOs 58, 60, 84 are excited electrically to produce spin waves 24 (FIG. 6), such as with current spikes. Alternatively, the ASTNOs 58, 60, 84 may be electrically excited with different current profiles, such as amplitude modulation (AM), frequency modulation (FM), phase modulation (PM), or the like.

From a mathematical point of view, spin wave activity propagates similarly to EM radiation. As such, spin wave antennas may be formed using similar principles to EM antennas by using the characteristics associated with the amplitudes of wave-fronts. EM antenna systems may combine EM sources strategically located to focus EM energy in specific directions. In this regard, spin wave antennas may be formed by selectively locating STNOs 116 (FIG. 12), ASTNOs 58, 60, 84, or any combination thereof, to focus spin waves 24 (FIG. 6) or aggregations 76 (FIG. 7) of spin waves, or both. For example, the STNO 116 (FIG. 12) may be used as an isotropic spin wave antenna, since it propagates spin waves 24 (FIG. 6) uniformly in all directions from the STNO 116 (FIG. 12) in the first magnetic propagation material 52. However, the ASTNOs 58, 60, 84 illustrated in FIGS. 9A, 9B, 9C, 9D may be used as an anisotropic spin wave antenna, which has a specific radiation pattern in the shape of an equilateral hexagon. The ASTNOs 58, 60 illustrated in FIG. 6 may be used as an anisotropic spin wave antenna, which has a specific radiation pattern roughly in the shape of an equilateral cross. Embodiments of the present disclosure that relate to amplitudes of wave-fronts and embodiments of the present disclosure that relate to sharpness of wave-fronts may be combined in any manner to produce new embodiments of the present disclosure.

FIG. 10 shows details of the nano-oscillator magnetic wave propagation system 36 according to an additional embodiment of the nano-oscillator magnetic wave propagation system 36. The nano-oscillator magnetic wave propagation system 36 illustrated in FIG. 10 is similar to the nano-oscillator magnetic wave propagation system 36 illustrated in FIG. 4, except the nano-oscillator magnetic wave propagation system 36 illustrated in FIG. 10 further includes a third alpha entering excitation current TAEI and a third alpha exiting excitation current TAXI. The ASTNO structure 40 illustrated in FIG. 10 includes the topwise cross-section TWOS of the ASTNO structure 40 illustrated in FIGS. 9A, 9B, 9C, and 9D. During the first wave propagation state, the control circuitry 38 provides the first alpha entering excitation current FAEI to the first alpha ASTNO 58 and receives the first alpha exiting excitation current FAXI from the first alpha ASTNO 58. The control circuitry 38 provides the second alpha entering excitation current SAEI to the second alpha ASTNO 60 and receives the second alpha exiting excitation current SAXI from the second alpha ASTNO 60. The control circuitry 38 provides the third alpha entering excitation current TAEI to the third alpha ASTNO 84 and receives the third alpha exiting excitation current TAXI from the third alpha ASTNO 84. During the non-wave propagation state, the control circuitry 38 does not provide the first alpha entering excitation current FAEI, the second alpha entering excitation current SAEI, and the third alpha exiting excitation current TAXI. The directions of the excitation currents FAEI, FAXI, SAEI, SAXI, TAEI, TAXI illustrated in FIG. 10 are indicative of the direction of electron flow. High current densities in the first magnetic propagation material 52 (FIGS. 9A, 9B, 9C, 9D) may be needed to create spin waves 24 (FIG. 6) capable of propagating over useful distances. As such, magnitudes of the excitation currents FAEI, FAXI, SAEI, SAXI, TAEI, TAXI may need to be relatively large, on the order of milliamps.

FIG. 11 shows the frontwise cross-section FWCS of the ASTNO structure 40 illustrated in FIG. 5 according to an alternate embodiment of the ASTNO structure 40. The ASTNO structure 40 illustrated in FIG. 11 is similar to the ASTNO structure 40 illustrated in FIG. 6, except the ASTNO structure 40 illustrated in FIG. 11 has a first spin-wave detector 106 instead of the first group 56 of ASTNOs. As such, the ASTNO structure 40 illustrated in FIG. 11 includes the first spin polarizing layer 48, the first conductive spacer layer 50 over the first spin polarizing layer 48, the first magnetic propagation material 52 over the first conductive spacer layer 50, the first insulating layer 54, over the first magnetic propagation material 52, and a first tunnel magnetoresistance (TMR) layer 108 over the first insulating layer 54. The first TMR layer 108 is etched away, leaving only a portion of the first TMR layer 108 inside the first spin-wave detector 106. Alternate embodiments of the first TMR layer 108 may extend outside of the first spin-wave detector 106. Further, the first spin-wave detector 106 includes a portion of the first spin polarizing layer 48, a portion of the first conductive spacer layer 50, a portion of the first magnetic propagation material 52, and a portion of the first insulating layer 54.

A hole traverses the first insulating layer 54, thereby exposing a first detector point contact 110 on the first planar surface 62. The first spin-wave detector 106 further includes a first magnetic tunnel junction (MTJ) insulator 112 over the first detector point contact 110. The first TMR layer 108 completely covers the first MTJ insulator 112. As such, the first MTJ insulator 112 is inside the first spin-wave detector 106. The first TMR layer 108 has a first net magnetic moment 114. As such, the first TMR layer 108 is a magnetic material, such as a ferromagnetic material. As such, the first net magnetic moment 114 may be based on permanent magnetization of the first TMR layer 108 or from external magnetization (not shown) of the first TMR layer 108. In general, the first spin-wave detector 106 may be used to detect spin waves 24 (FIG. 6), aggregations of spin waves, such as the first aggregation 76 of spin waves, or both. As such, the first spin-wave detector 106 uses TMR to detect the spin waves or aggregations of spin waves.

TMR is a magnetoresistive effect that occurs in MTJs. An MTJ is a device having two magnets separated by a thin insulator. When the insulator is thin enough, electrons can tunnel from one magnet to the other. However, when magnetizations of the magnets are parallel to one another, the tunneling of the electrons is generally easier than when magnetizations of the magnets are not parallel to one another. The first magnetic propagation material 52 and the first TMR layer 108 provide the two magnets of the MTJ, and the first MTJ insulator 112 provides the thin insulator of the MTJ.

A first TMR is the electrical resistance between the top of the first TMR layer 108 and the bottom of the first magnetic propagation material 52 through the first MTJ insulator 112. When the first magnetization direction 72, which is indicative of magnetic moments 20 inside the first spin-wave detector 106 during the non-wave propagation state, and the first net magnetic moment 114 are about parallel to one another, the first TMR is relatively low. As the first magnetization direction 72 and the first net magnetic moment 114 become less parallel to one another, the first TMR increases. In one embodiment of the first TMR layer 108, the first net magnetic moment 114 is about parallel to the first planar surface 62. During the non-wave propagation state, in one embodiment of the first magnetic propagation material 52, the first magnetization direction 72 is about perpendicular to the first planar surface 62. During the first wave propagation state, when spin waves 24 (FIG. 6) or aggregations 76 of spin waves pass through the first spin-wave detector 106, the magnetic moments 20 inside of the first spin-wave detector 106 precess to become more aligned with the first net magnetic moment 114, thereby decreasing the first TMR. In another embodiment of the first TMR layer 108, the first net magnetic moment 114 is about perpendicular to the first planar surface 62. During the non-wave propagation state, in one embodiment of the first magnetic propagation material 52, the first magnetization direction 72 is about perpendicular to the first planar surface 62. During the first wave propagation state, when spin waves 24 (FIG. 6) or aggregations 76 of spin waves pass through the first spin-wave detector 106, the magnetic moments 20 inside of the first spin-wave detector 106 precess to become less aligned with the first net magnetic moment 114, thereby increasing the first TMR. The first net magnetic moment 114 may also be perpendicular to the first planar surface 62 but initially aligned antiparallel to the magnetization direction 72 of the first magnetic propagation material 52. In this case during the first wave propagation state, when spin waves 24 (FIG. 6) or aggregations 76 of spin waves pass through the first spin-wave detector 106, the magnetic moments 20 inside of the first spin-wave detector 106 precess to become more aligned with the first net magnetic moment 114, thereby decreasing the first TMR. In this regard, the first TMR is indicative of spin waves 24 (FIG. 6) or aggregations of spin waves, such as the first aggregation 76 (FIG. 7) of spin waves, passing through the first spin-wave detector 106. In general, the first TMR is based on spin waves 24 (FIG. 6) or aggregations of spin waves, such as the first aggregation 76 (FIG. 7) of spin waves, passing through the first spin-wave detector 106.

During the first wave propagation state, the first spin-wave detector 106 receives a first entering current FEI. The first entering current FEI includes electrons, which are used as charge carriers. The first entering current FEI is normally un-polarized, such that orientation of the spin of the charge carriers is random. However, by passing the first entering current FEI through the first spin polarizing layer 48 and since the first spin polarizing layer 48 has the first net polarizing magnetic moment 70, the current inside the first spin polarizing layer 48 becomes spin-polarized to provide a first spin-polarized current FSI to the first conductive spacer layer 50. The first conductive spacer layer 50 substantially magnetically isolates the first magnetic propagation material 52 from the first spin polarizing layer 48, such that the first net polarizing magnetic moment 70 does not significantly magnetically influence the magnetic moments 20 of the small magnetic elements in the first magnetic propagation material 52.

The first spin-polarized current FSI is forwarded through the first conductive spacer layer 50, through the first magnetic propagation material 52, through the first detector point contact 110, through the first MTJ insulator 112, and through the first TMR layer 108 to exit as a first exiting current FXI. In one embodiment of the first spin-wave detector 106, the first TMR is determined by measuring a voltage drop between the first spin-polarized current FSI entering the first magnetic propagation material 52 and the first exiting current FXI exiting the first TMR layer 108. In an alternate embodiment of the first spin-wave detector 106, an approximation of the first TMR is determined by measuring a voltage drop between the first entering current FEI entering the first spin polarizing layer 48 and the first exiting current FXI exiting the first TMR layer 108. Specifically, the first TMR is about equal to the measured voltage drop divided by a TMR current, which is based on the first entering current FEI, the first spin-polarized current FSI, the first exiting current FXI, or any combination thereof.

In an alternate embodiment of the first spin-wave detector 106, the first TMR layer 108 and the first MTJ insulator 112 are omitted, thereby providing a spin-wave detector having a structure that is similar to the first alpha ASTNO 58 (FIG. 6) or the second alpha ASTNO 60 (FIG. 6). Detection of the first aggregation 76 of spin waves are based on detecting a resistance change in the first magnetic propagation material 52 via the first detector point contact 110 instead of relying on a TMR effect, which may produce a larger change in resistance for a given spin-wave amplitude than the resistance change in the first magnetic propagation material 52 without the first TMR layer 108 and the first MTJ insulator 112. The resistance change may be determined by measuring a change in the voltage drop between the first spin-polarized current FSI entering the first magnetic propagation material 52 and the first exiting current FXI exiting the first magnetic propagation material 52.

FIG. 12 shows the frontwise cross-section FWCS of the ASTNO structure 40 illustrated in FIG. 5 according to another embodiment of the ASTNO structure 40. The ASTNO structure 40 illustrated in FIG. 12 is similar to the ASTNO structure 40 illustrated in FIG. 11, except in the ASTNO structure 40 illustrated in FIG. 12 the first spin-wave detector 106 is used as a first STNO 116. As such, polarization of the charge carriers in the first spin-polarized current FSI produces an excitation of the magnetic moments 20 of some of the small magnetic elements in the first magnetic propagation material 52. As such, the spin-transfer torque effect is exerted by the first spin-polarized current FSI on the first magnetic propagation material 52. Specifically, when the polarization of the charge carriers and magnetization of the film are not parallel, the spin-transfer torque will be exerted to alter the direction of the magnetic moments 20 of the small magnetic elements in the first magnetic propagation material 52. This spin-transfer torque is propagated to adjacent small magnetic elements in the first magnetic propagation material 52, thereby altering the directions of the magnetic moments 20 of the adjacent small magnetic elements in the first magnetic propagation material 52. In this regard, the propagation of the spin-transfer torque drives oscillations in the directions of the magnetic moments 20 of the small magnetic elements in the magnetic film 16. These oscillations are called spin waves 24 and propagate out from the first spin-polarized current FSI.

In one embodiment of the first STNO 116, the first STNO 116 is used as an STNO only. In an alternate embodiment of the first STNO 116, the first STNO 116 is used as both an STNO and a spin-wave detector. When used as an STNO, high current densities (on order of or greater than about $10^5$ amperes per square centimeter) in the first magnetic propagation material 52 may be needed to create spin waves 24 capable of propagating over useful distances. As such, magnitudes of the first currents FEI, FSI, FXI may need to be relatively large. Conversely, when the first STNO 116 is used as a spin-wave detector, magnitudes of the first currents FEI, FSI, FXI may need to be relatively small to prevent creation of the spin waves 24.

FIG. 13 shows details of the nano-oscillator magnetic wave propagation system 36 according to another embodiment of the nano-oscillator magnetic wave propagation system 36. The nano-oscillator magnetic wave propagation system 36 illustrated in FIG. 13 is similar to the nano-oscillator magnetic wave propagation system 36 illustrated in FIG. 10, except the nano-oscillator magnetic wave propagation system 36 illustrated in FIG. 10 further includes the first entering current FEI and the first exiting current FXI. The ASTNO structure 40 shown in FIG. 13 illustrates the frontwise cross-section FWCS of the ASTNO structure 40 illustrated in FIGS. 11 and 12.

During the first wave propagation state, the control circuitry 38 provides the first alpha entering excitation current FAEI to the ASTNO structure 40 and receives the first alpha exiting excitation current FAXI from the ASTNO structure 40. The control circuitry 38 provides the second alpha entering excitation current SAEI to the ASTNO structure 40 and receives the second alpha exiting excitation current SAXI from the ASTNO structure 40. The control circuitry 38 provides the third alpha entering excitation current TAEI to the ASTNO structure 40 and receives the third alpha exiting excitation current TAXI from the ASTNO structure. The control circuitry 38 provides the first entering current FEI to the first spin-wave detector 106 (FIG. 11) and receives the first exiting current FXI from the first spin-wave detector 106 (FIG. 11). During the non-wave propagation state, the control circuitry 38 does not provide the first alpha entering excitation current FAEI, the second alpha entering excitation current SAEI, the third alpha exiting excitation current TAXI, and the first entering current FEI. The directions of the currents FAEI, FAXI, SAEI, SAXI, TAEI, TAXI, FEI, FXI illustrated in FIG. 13 are indicative of the direction of electron flow.

FIG. 14 shows details of the nano-oscillator magnetic wave propagation system 36 according to one embodiment of the nano-oscillator magnetic wave propagation system 36. The nano-oscillator magnetic wave propagation system 36 illustrated in FIG. 14 is similar to the nano-oscillator magnetic wave propagation system 36 illustrated in FIG. 13, except the nano-oscillator magnetic wave propagation system 36 illustrated in FIG. 14 is used as a spin-wave based measurement system 118.

FIG. 15 shows the topwise cross-section TWOS of the ASTNO structure 40 illustrated in FIG. 5 and FIG. 14 according to one embodiment of the ASTNO structure 40. The topwise cross-section TWOS illustrated in FIG. 15 includes portions of the first group 56 of ASTNOs and includes a portion of the first spin-wave detector 106 illustrated in FIG. 11 in the first magnetic propagation material 52. As such, the first group 56 of ASTNOs and the first spin-wave detector 106 share the first magnetic propagation material 52. The spin-wave based measurement system 118 is used to measure the effects of a physical entity 120 upon the first aggregation 76 of spin waves propagating through the first magnetic propagation material 52. The physical entity 120 may include radio frequency (RF) energy, light, vibration, sound waves, temperature, radiation, the like, or any combination thereof. As such, the spin-wave based measurement system 118 may be used as a sensor or transducer.

During the first wave propagation state, the first group 56 of ASTNOs produces the first aggregation 76 of spin waves emanating from the first emanating point 74. The first aggregation 76 of spin waves propagates through the first magnetic propagation material 52, such that a portion of the first aggregation 76 of spin waves is received by the first spin-wave detector 106. The physical entity 120 impinges upon the first magnetic propagation material 52. The spin-wave based measurement system 118 provides measured effects of the physical entity 120 by measuring the effects of the physical entity 120 upon the portion of the first aggregation 76 of spin waves that are received by the first spin-wave detector 106. In this regard, the measured effects are based on detection of the portion of the first aggregation 76 of spin waves that are received by the first spin-wave detector 106. Specifically, the first TMR may vary based on the effects of the physical entity 120 upon the first aggregation 76 of spin waves and the measured effects may be based on the first TMR.

FIG. 16 shows details of the nano-oscillator magnetic wave propagation system 36 according to an alternate embodiment of the nano-oscillator magnetic wave propagation system 36. The nano-oscillator magnetic wave propagation system 36 illustrated in FIG. 16 is similar to the nano-oscillator magnetic wave propagation system 36 illustrated in FIG. 13, except the nano-oscillator magnetic wave propagation system 36 illustrated in FIG. 16 is used as a spin-wave locking system 122.

FIG. 17 shows the topwise cross-section TWOS of the ASTNO structure 40 illustrated in FIG. 5 and FIG. 16 according to an alternate embodiment of the ASTNO structure 40. The topwise cross-section TWOS illustrated in FIG. 17 includes portions of the first group 56 of ASTNOs and includes a portion of the first STNO 116 illustrated in FIG. 12 in the first magnetic propagation material 52, such that the first spin-wave detector 106 is the first STNO 116. As such, the first group 56 of ASTNOs and the first STNO 116 share the first magnetic propagation material 52.

During the first wave propagation state, the first group 56 of ASTNOs produces the first aggregation 76 of spin waves emanating from the first emanating point 74. The first aggregation 76 of spin waves propagates through the first magnetic propagation material 52, such that a portion of the first aggregation 76 of spin waves is received by the first STNO 116. Further, the first STNO 116 initiates spin waves 24 through the first magnetic propagation material 52. In general, the first STNO 116 locks to the portion of the first aggregation 76 of spin waves are that received by the first STNO 116. In one embodiment of the first STNO 116, the first STNO 116 phase locks to the portion of the first aggregation 76 of spin waves that are received by the first STNO 116. In an alternate embodiment of the first STNO 116, the first STNO 116 frequency locks to the portion of the first aggregation 76 of spin waves that are received by the first STNO 116.

FIG. 18 shows details of the nano-oscillator magnetic wave propagation system 36 according to an additional embodiment of the nano-oscillator magnetic wave propagation system 36. The nano-oscillator magnetic wave propagation system 36 illustrated in FIG. 18 is similar to the nano-oscillator magnetic wave propagation system 36 illustrated in FIG. 13, except the nano-oscillator magnetic wave propagation system 36 illustrated in FIG. 18 is used as spin-wave based communications system 124.

FIG. 19 shows the topwise cross-section TWOS of the ASTNO structure 40 illustrated in FIG. 5 and FIG. 18 according to an additional embodiment of the ASTNO structure 40. The topwise cross-section TWOS illustrated in FIG. 19 includes portions of the first group 56 of ASTNOs and includes a portion of the first spin-wave detector 106 illustrated in FIG. 11 in the first magnetic propagation material 52. As such, the first group 56 of ASTNOs and the first spin-wave detector 106 share the first magnetic propagation material 52. The spin-wave based measurement system 118 uses a first aggregation 126 of modulated spin waves propagating through the first magnetic propagation material 52 (FIG. 19) to convey information from the first group 56 of ASTNOs to the first spin-wave detector 106.

During the first wave propagation state, the first group 56 of ASTNOs produces the first aggregation (FIG. 7) 76 of spin waves emanating from the first emanating point 74, such that the first aggregation 76 (FIG. 7) of spin waves is the first aggregation 126 of modulated spin waves. Modulation of the first aggregation 126 of modulated spin waves is based on the information to be conveyed from the first group 56 of ASTNOs to the first spin-wave detector 106. The first aggregation 126 of modulated spin waves propagate through the first magnetic propagation material 52, such that a portion of the first aggregation 126 of modulated spin waves are received by the first spin-wave detector 106. The first TMR of the first spin-wave detector 106 may vary based on modulation of the first aggregation 126 of modulated spin waves.

FIG. 20 shows details of the control circuitry 38 illustrated in FIG. 18 according to one embodiment of the control circuitry 38. The control circuitry 38 includes excitation current modulation circuitry 128, current modulation detection circuitry 130, and communications control circuitry 132. The communications control circuitry 132 provides a baseband transmit signal BBTX to the excitation current modulation circuitry 128 based on the information to be conveyed from the first group 56 of ASTNOs to the first spin-wave detector 106. The excitation current modulation circuitry 128 provides and applies modulation to the excitation currents FAEI, FAXI, SAEI, SAXI, TAEI, TAXI, based on the information to be conveyed from the first group 56 of ASTNOs to the first spin-wave detector 106, such that the first group 56 of ASTNOs provides the first aggregation 126 of modulated spin waves based on the modulation to the excitation currents FAEI, FAXI, SAEI, SAXI, TAEI, TAXI.

The current modulation detection circuitry 130 provides the first entering current FEI and the first exiting current FXI, such that the first entering current FEI and the first exiting current FXI are based on the first TMR. Since the first TMR of the first spin-wave detector 106 may vary based on modulation of the first aggregation 126 of modulated spin waves and since the first entering current FEI and the first exiting current FXI are based on the first TMR, the current modulation detection circuitry 130 may detect the modulation of the first aggregation 126 of modulated spin waves. As such, the current modulation detection circuitry 130 may extract the conveyed information from the detected modulation and provide the conveyed information to the communications control circuitry 132 via a baseband receive signal BBRX.

In one embodiment of the first spin-wave detector 106 (FIGS. 11 and 19) and in an alternate embodiment of the current modulation detection circuitry 130, the current modulation detection circuitry 130 provides the first entering current FEI and the first exiting current FXI, such that the first entering current FEI and the first exiting current FXI are based on resistance of the first magnetic propagation material 52 (FIG. 11). As such, the current modulation detection circuitry 130 may detect the first aggregation 126 of modulated spin waves based on the resistance change of the first magnetic propagation material 52 (FIG. 11). Specifically, the current modulation detection circuitry 130 may detect the modulation of the first aggregation 126 of modulated spin waves based on the resistance change of the first magnetic propagation material 52 (FIG. 11). In an alternate embodiment of the first spin-wave detector 106 (FIG. 11), the first TMR layer 108 (FIG. 11) and the first MTJ insulator 112 (FIG. 11) are omitted, thereby providing a spin-wave detector having a structure that is similar to the first alpha ASTNO 58 (FIG. 6) or the second alpha ASTNO 60 (FIG. 6).

FIG. 21 shows details of the nano-oscillator magnetic wave propagation system 36 according to another embodiment of the nano-oscillator magnetic wave propagation system 36. The nano-oscillator magnetic wave propagation system 36 illustrated in FIG. 21 is similar to the nano-oscillator magnetic wave propagation system 36 illustrated in FIG. 13, except the nano-oscillator magnetic wave propagation system 36 illustrated in FIG. 21 is used as a spin-wave wave-front based system 134.

FIG. 22 shows the topwise cross-section TWOS of the ASTNO structure 40 illustrated in FIG. 5 and FIG. 21 according to one embodiment of the ASTNO structure 40. The topwise cross-section TWOS illustrated in FIG. 22 includes portions of the first group 56 of ASTNOs and includes a portion of a first spin-wave wave-front detector 136 in the first magnetic propagation material 52. The first spin-wave wave-front detector 136 illustrated in FIG. 22 may have similar construction to the first spin-wave detector 106 illustrated in FIG. 11. As such, the first group 56 of ASTNOs and the first spin-wave wave-front detector 136 share the first magnetic propagation material 52. The spin-wave wave-front based system 134 detects and responds to wave-fronts of spin waves 24 (FIG. 6); aggregations of spin waves, such as the first aggregation 76 of spin waves; or both, propagating through the first magnetic propagation material 52.

During the first wave propagation state, the first group 56 of ASTNOs initiates the first aggregation 76 of spin waves emanating from the first emanating point 74. The first aggregation 76 of spin waves propagate through the first magnetic propagation material 52, such that a portion of the first aggregation 76 of spin waves are received by the first spin-wave wave-front detector 136. The first aggregation 76 of spin waves has the first aggregated spin-wave wave-front 98, such that a portion of the first aggregated spin-wave wave-front 98 is received by the first spin-wave wave-front detector 136. The first spin-wave wave-front detector 136 has a first wave-front TMR, which may behave in a similar manner to the first TMR of the first spin-wave detector 106 (FIG. 11). As such, the first wave-front TMR may change as a result of the portion of the first aggregation 76 of spin waves being received by the first spin-wave wave-front detector 136. As a result, the nano-oscillator magnetic wave propagation system 36 may detect the portion of the first aggregated spin-wave wave-front 98 being received by the first spin-wave wave-front detector 136 based on the first wave-front TMR.

FIG. 23 shows details of portions of the control circuitry 38 and portions of the ASTNO structure 40 illustrated in FIG. 21 according to one embodiment of the control circuitry 38 and the ASTNO structure 40. The ASTNO structure 40 includes the first spin-wave wave-front detector 136 and the control circuitry 38 includes wave-front detection circuitry 138. The wave-front detection circuitry 138 includes a memristic device 140, a DC power supply 142, a first inductive element L1, a first capacitive element C1, and a first resistive element R1. The first wave-front TMR of the first spin-wave wave-front detector 136 is represented as a first TMR resistive element RTMR. The memristic device 140 is represented as a memristic device resistive element RMD. The first capacitive element C1 is coupled across a series coupling of the DC power supply 142 and the first resistive element R1. The first capacitive element C1 is further coupled across a series coupling of the first TMR resistive element RTMR, the memristic device resistive element RMD, and the first inductive element L1. The first capacitive element C1 has a capacitor voltage VC and the DC power supply 142 has a DC supply voltage VPS. The first inductive element L1 has a current I. The polarity of the current I is shown as the polarity of conventional DC current, which is opposite of the polarity of electron flow. In this regard, applying Kirchhoff's current law at the junction of the first resistive element R1, the first capacitive element C1, and the first inductive element L1 yields EQ. 1, as shown below. Further, applying Ohm's law to the series combination of the first inductive element L1, the memristic device resistive element RMD, and the first TMR resistive element RTMR yields EQ. 2, as shown below.

$$((VPS-VC)/(R1))=(C1)(d(VC)/dt)+I.$$ EQ. 1

$$(VC)=(L1)(dI/dt)+(RMD)I+(RTMR)I.$$ EQ. 2

The memristic device 140, which may be described as a memory resistor or memristor, is a passive two-terminal device that maintains a functional, nonlinear relationship between charges, current, and voltage. The memristic device 140 implements a time-varying function of net charge history. In the control circuitry 38 illustrated in FIG. 23, the memristic device 140 will operate in one of a low resistance state and a high resistance state. During the high resistance state, the memristic device resistive element RMD has a first resistance value, and during the low resistance state, the memristic device resistive element RMD has a second resistance value, which is less than the first resistance value. When the first spin-wave wave-front detector 136 is not in the process of detecting a wave-front, the memristic device 140 is in the high resistance state. As such, the current I is relatively low, such that the first capacitive element C1 charges up, thereby approaching the DC supply voltage VPS.

When the first aggregation 76 (FIG. 22) of spin waves reaches the first spin-wave wave-front detector 136, resistance of the first TMR resistive element RTMR may drop due to some of the magnetic moments 22 (FIG. 11) in the first magnetic propagation material 52 (FIG. 22) becoming more aligned with the first net magnetic moment 114 (FIG. 11). Since the first inductive element L1 will prevent the current I from changing instantaneously, the voltage across the first TMR resistive element RTMR will drop, thereby shifting voltage to the series combination of the first inductive element L1 and the memristic device 140. If the drop in the resistance of the first TMR resistive element RTMR exceeds a first threshold, the memristic device 140 will switch from the high resistance state to the low resistance state, thereby discharging the first capacitive element C1. When the capacitor voltage VC drops below a second threshold, the memristic device 140 will switch from the low resistance state to the high resistance state, thereby allowing the first capacitive element C1 to re-charge. Detection of the portion of the first aggregated spin-wave wave-front 98 being received by the first spin-wave wave-front detector 136 is based on the memristic device 140 switching from the high resistance state to the low resistance state.

The first threshold of the first TMR resistive element RTMR may be selected, such that the memristic device 140 responds to the first aggregated wave-front amplitude of the first aggregated spin-wave wave-front 98, but does not respond to the partially aggregated wave-front amplitudes of the partially aggregated spin-wave wave-fronts 100, 102, 104 (FIG. 9D) or to the wave-front amplitudes of the spin-wave wave-fronts 92, 94, 96 (FIG. 9B).

Devices that may be used as the memristic device 140 may include any or all of a number of active circuits that produce appropriate bistable functionality, such as a tunnel diode, a memristor, a neon bulb, a thyristor, a gas discharge tube, amplifiers, Schmitt triggers, transistor circuits, or the like. High current densities in the first magnetic propagation material 52 (FIG. 22) may be needed to create spin waves 24 (FIG. 6). To prevent creation of spin waves 24 (FIG. 6), magnitudes of the first entering current FEI and the first exiting current FXI may need to be kept relatively small.

Alternate embodiments of the first spin-wave wave-front detector 136 do not include the first TMR resistive element RTMR and alternate embodiments of the wave-front detection circuitry 138 do not include the memristic device 140. Since the first spin-wave wave-front detector 136 may be similar to the first spin-wave detector 106 (FIG. 11), in such embodiments, the first aggregated spin-wave wave-front 98 is detected by detecting resistance changes in the first magnetic propagation material 52 (FIG. 11). In another embodiment of the first spin-wave wave-front detector 136, the first spin-wave wave-front detector 136 is similar to the first spin-wave detector 106 (FIG. 11), except the first TMR layer 108 (FIG. 11) and the first MTJ insulator 112 (FIG. 11) are omitted.

FIG. 24 shows the topwise cross-section TWOS of the ASTNO structure 40 illustrated in FIG. 5 and FIG. 21 according to an alternate embodiment of the ASTNO structure 40. The topwise cross-section TWOS illustrated in FIG. 24 includes portions of the first group 56 of ASTNOs and includes a portion of the first spin-wave wave-front detector 136 in the first magnetic propagation material 52. The portions of the first group 56 of ASTNOs and the portion of the first spin-wave wave-front detector 136 illustrated in FIG. 24 are similar to the portions of the first group 56 of ASTNOs and the portion of the first spin-wave wave-front detector 136 illustrated in FIG. 22. However, in the first spin-wave wave-front detector 136 illustrated in FIG. 24, the magnitudes of the first entering current FEI and the first exiting current FXI are large enough, such that when the first spin-wave wave-front detector 136 detects the first aggregated spin-wave wave-front 98, the first spin-wave wave-front detector 136 initiates spin waves 24 having a first transponder wave-front 144. As such, the first spin-wave wave-front detector 136 illustrated in FIG. 24 functions as an STNO-based transponder.

FIG. 25 shows details of the nano-oscillator magnetic wave propagation system 36 according to another embodiment of the nano-oscillator magnetic wave propagation system 36. The nano-oscillator magnetic wave propagation system 36 illustrated in FIG. 25 is similar to the nano-oscillator magnetic wave propagation system 36 illustrated in FIG. 21, except the nano-oscillator magnetic wave propagation system 36 illustrated in FIG. 25 provides the additional excitation signals needed for a second group of ASTNOs.

During the first wave propagation state, the control circuitry 38 further provides a first beta entering excitation current FBEI to the ASTNO structure 40 and further receives a first beta exiting excitation current FBXI from the ASTNO structure 40. The control circuitry 38 further provides a second beta entering excitation current SBEI to the ASTNO structure 40 and further receives a second beta exiting excitation current SBXI from the ASTNO structure 40. The control circuitry 38 further provides a third beta entering excitation current TBEI to the ASTNO structure 40 and further receives third beta exiting excitation current TBXI from the ASTNO structure 40. During the non-wave propagation state, the control circuitry 38 does not provide the currents FAEI, FAXI, SAEI, SAXI, TAEI, TAXI, FBEI, FBXI, SBEI, SBXI, TBEI, TBXI, FEI, FXI. The directions of the currents FAEI, FAXI, SAEI, SAXI, TAEI, TAXI, FBEI, FBXI, SBEI, SBXI, TBEI, TBXI, FEI, FXI illustrated in FIG. 25 are indicative of the direction of electron flow.

FIG. 26 shows the topwise cross-section TWOS of the ASTNO structure 40 illustrated in FIG. 5 and FIG. 25 according to an additional embodiment of the ASTNO structure 40. The topwise cross-section TWOS illustrated in FIG. 26 includes portions of the first group 56 of ASTNOs and includes a portion of the first spin-wave wave-front detector 136 in the first magnetic propagation material 52. The portions of the first group 56 of ASTNOs and the portion of the first spin-wave wave-front detector 136 illustrated in FIG. 26 are similar to the portions of the first group 56 of ASTNOs and the portion of the first spin-wave wave-front detector 136 illustrated in FIG. 22. However, the ASTNO structure 40 illustrated in FIG. 26 further includes a portion of a second group 146 of ASTNOs in the first magnetic propagation material 52. The first spin-wave wave-front detector 136 and the second group 146 of ASTNOs are combined to form a first ASTNO-based transponder 148. Each of the second group 146 of ASTNOs is disposed about a second emanating point 150 in the first magnetic propagation material 52. Further, the first spin-wave wave-front detector 136 may be located at or near the second emanating point 150.

In one embodiment of the ASTNO structure 40, the ASTNO structure 40 has a second group of point contacts on the first magnetic propagation material 52. Each of the second group of point contacts is disposed about the second emanating point 150 in the first magnetic propagation material 52. During the first wave propagation state, each of the second group of point contacts and a corresponding portion of the first magnetic propagation material 52 provide the second group 146 of ASTNOs.

During the first wave propagation state, the first group 56 of ASTNOs initiates the first aggregation 76 (FIG. 22) of spin waves emanating from the first emanating point 74. The first aggregation 76 (FIG. 22) of spin waves has the first aggregated spin-wave wave-front 98. When the first spin-wave wave-front detector 136 detects the first aggregated spin-wave wave-front 98, the control circuitry 38 (FIG. 25) causes each of the second group 146 of ASTNOs to initiate spin waves 24 (FIG. 6) through the first magnetic propagation material 52, such that a portion of the spin waves from each of the second group 146 of ASTNOs combine to produce a second aggregation 152 of spin waves emanating from the second emanating point 150. The second aggregation 152 of spin waves has a second aggregated spin-wave wave-front 154.

FIG. 27 shows the topwise cross-section TWOS of the ASTNO structure 40 illustrated in FIG. 5 and FIG. 25 according to a further embodiment of the ASTNO structure 40. The topwise cross-section TWOS illustrated in FIG. 27 includes portions of the first group 56 of ASTNOs and includes a portion of the first spin-wave wave-front detector 136 in the first magnetic propagation material 52. The portions of the first group 56 of ASTNOs and the portion of the first spin-wave wave-front detector 136 illustrated in FIG. 27 are similar to the portions of the first group 56 of ASTNOs and the portion of the first spin-wave wave-front detector 136 illustrated in FIG. 22. However, the ASTNO structure 40 illustrated in FIG. 27 further includes a portion of the second group 146 of ASTNOs in the first magnetic propagation material 52. Each of the second group 146 of ASTNOs is disposed about the second emanating point 150 in the first magnetic propagation material 52. The first spin-wave wave-front detector 136 is located between the first emanating point 74 and the second emanating point 150.

During the first wave propagation state, the first group 56 of ASTNOs initiates the first aggregation 76 (FIG. 22) of spin waves emanating from the first emanating point 74. The first aggregation 76 (FIG. 22) of spin waves has the first aggregated spin-wave wave-front 98. Additionally, each of the second group 146 of ASTNOs initiates spin waves 24 (FIG. 6) through the first magnetic propagation material 52, such that a portion of the spin waves from each of the second group 146 of ASTNOs combines to produce the second aggregation 152 (FIG. 26) of spin waves emanating from the second emanating point 150. The second aggregation 152 (FIG. 26) of spin waves has the second aggregated spin-wave wave-front 154, which has a second aggregated wave-front amplitude. When the first aggregated spin-wave wave-front 98 and the second aggregated spin-wave wave-front 154 reach the first spin-wave wave-front detector 136 simultaneously, the first spin-wave wave-front detector 136 detects the arrival of the first aggregated spin-wave wave-front 98 and the second aggregated spin-wave wave-front 154.

A portion of the first aggregated spin-wave wave-front 98 and a portion of the second aggregated spin-wave wave-front 154 may combine to form a combined wave-front having an aggregated amplitude that is larger than either the first aggregated wave-front amplitude or the second aggregated wave-front amplitude. In this regard, the first spin-wave wave-front detector 136 may detect only the aggregated amplitude of the simultaneous arrival of two aggregated spin-wave wave-fronts 98, 154. Unless the locations of the first emanating point 74, the second emanating point 150, and the first spin-wave wave-front detector 136 combined with the initiations of the first aggregation 76 (FIG. 22) of spin waves and the second aggregation 152 (FIG. 26) of spin waves happen to coincide, the aggregated spin-wave wave-front 98 and the second aggregated spin-wave wave-front 154 will not reach the first spin-wave wave-front detector 136 simultaneously. In this regard, locations of spin-wave detectors, locations of groups of ASTNOs, relative timing of initiations of aggregations of spin waves from the groups of ASTNOs may provide a complex system of causes and effects, which may be used for many different purposes. Such a system is called a polychronous wave propagation system. As such, the spin-wave wave-front based system 134 illustrated in FIG. 27 is a spin-wave based polychronous wave propagation system.

A polychronous wave propagation system is based on relative timing between two or more propagated waves through a wave propagation medium. The relative timing may be associated with interference patterns of energy between the propagated waves. Operational behavior of the polychronous wave propagation system is based on the relative timing of the propagated waves and distances between initiators that transmit the propagated waves and responders that receive the propagated waves. The operational behavior may include arithmetical computations, memory storage, Boolean functions, frequency-based computations, or the like. The polychronous wave propagation system relies on time delays between the propagated waves that result from propagation velocities of the propagated waves through the wave propagation medium. By incorporating the time delays into the system, operational capacity may be greatly enhanced.

The propagated wave may be a pulsed wave lasting just a few cycles. Further, a responder and an initiator may be combined to form a transponder, which may receive two or more propagated waves and initiate a response transmission of a propagated wave based on the relative timing between the received propagated waves. The response transmission may be initiated based on simultaneous reception of the received propagated waves. In general, the relative timing may be associated with interference patterns of energy between the received propagated waves. The transponder may include a controllable oscillator block, which may be controlled based on the responder section of the transponder and may provide a controlled signal upon which the response transmission is based. The controllable oscillator block may oscillate at a controllable frequency, which may be based on frequencies of received pulsed propagated waves. The initiated transmission may be a pulsed propagated wave that may be at the frequency of the controllable oscillator block.

Further information regarding the spin-wave based polychronous wave propagation system illustrated in FIG. 27 is presented. In researching theories of the brain, certain operational fundamentals; such as memory registration and recall, associative memory, and pattern recognition; suggest much greater complexity than what the basic underlying physical structure provides. For example, a human brain can store more information than would be expected given the number of synapses in the human brain. Therefore, human brain memory is more than just synaptic memory. Other factors come into play in conjunction with the synapses to store all of the information. Since the brain operates in an autonomous asynchronous environment, one theory is that time delays may be important.

For example, if two neurons fire at a common post synaptic target, their spikes travel along axons to the target, and if their spikes arrive simultaneously at the target, a stronger response may be evoked than if their spikes arrive separately. However, axons have propagation velocities that introduce conduction delays; therefore, both the distances from the neurons to the target and the firing times of the neuron spikes determine when the spikes arrive at their target. The propagation velocity may be about one millimeter per millisecond for myelinated fibers and about one-hundred micrometers per millisecond for non-myelinated fibers. Specifically, if a conduction path from a first neuron to the target is about ten millimeters long and a conduction path from a second neuron to the target is about two millimeters long, the first neuron will have to fire about eight milliseconds before the second neuron fires in order for both spikes to arrive simultaneously.

In general, neurons in spiking networks with conduction delays may fire with certain time-locked asynchronous patterns so that their spikes may arrive at targets simultaneously. The additional dimension of time delays in a brain may significantly increase a brain's capacity to represent and process information. Such an activity may be called polychrony. Polychrony may be derived from poly, meaning many, and chronos, meaning time or clock. With an appropriate type of spike-timing dependent synaptic plasticity, spiking networks may self-organize and generate such polychronous activity, which may have relevance to memory, binding and gamma rhythms, mechanisms of attention, pattern recognition, and the like. Polychronous activity in the brain depends on specificity of synaptic connections, geometry and dimensions of axonal fibers, activity-dependent propagation velocities, dynamics of various neurotransmitters, spike-generation mechanisms of neurons, and other biological factors.

Applying polychronous techniques to physical systems, electronic systems, or both may significantly increase the capacities, the functionalities, or both of such systems. Such systems may operate at much higher frequencies than a brain, which may operate in a frequency range up to about 100 hertz. For example, networks having time delays can encompass greater functionalities than comparable networks without time delays. A dynamic system having a given number of state variables may be represented by a differential equation that has a solution space of the same dimension as the number of state variables. However, when asynchronous time delays are added to the dynamic system, a differential-delay equation that is representative of the dynamic system with delays has an infinite dimensional solution space. In this regard, the spin-wave based polychronous wave propagation system illustrated in FIG. 27 may provide polychronous activity that is analogous to polychronous activity in a brain.

FIGS. 28A, 28B, 28C, and 28D show the topwise cross-section TWOS of the ASTNO structure 40 illustrated in FIG. 5 according to one embodiment of the ASTNO structure 40. The topwise cross-section TWOS of the ASTNO structure 40 is taken inside the first magnetic propagation material 52. As such, the ASTNO structure 40 includes a first reverberating memory cell 156, which has the first ASTNO-based transponder 148, a second ASTNO-based transponder 158, and a third ASTNO-based transponder 160. The topwise cross-section TWOS illustrated in FIGS. 28A, 28B, 28C, and 28D includes portions of the ASTNO-based transponders 148, 158, 160 in the first magnetic propagation material 52. Each of the ASTNO-based transponders 148, 158, 160 is located at a corresponding vertex of an equilateral right triangle. As such, any pair of the ASTNO-based transponders 148, 158, 160 are separated from one another by a separation distance 162. The second ASTNO-based transponder 158 and the third ASTNO-based transponder 160 may be similar to the first ASTNO-based transponder 148. Alternate embodiments of the first reverberating memory cell 156 may include any number of ASTNO-based transponders 148, 158, 160.

Figure 28A:
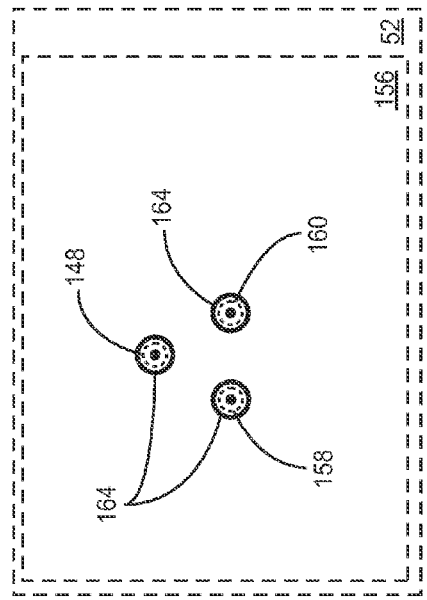
Figure 28B:
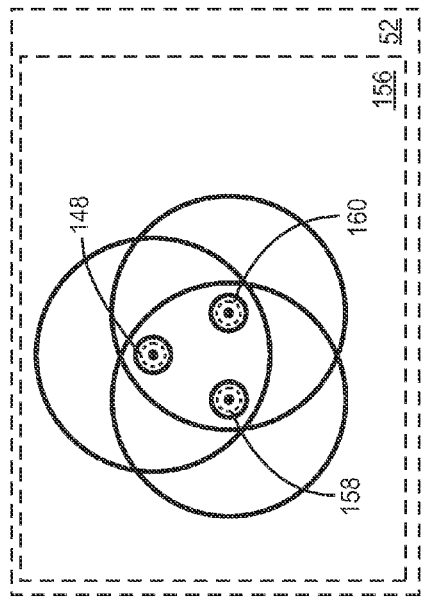
Figure 28C:
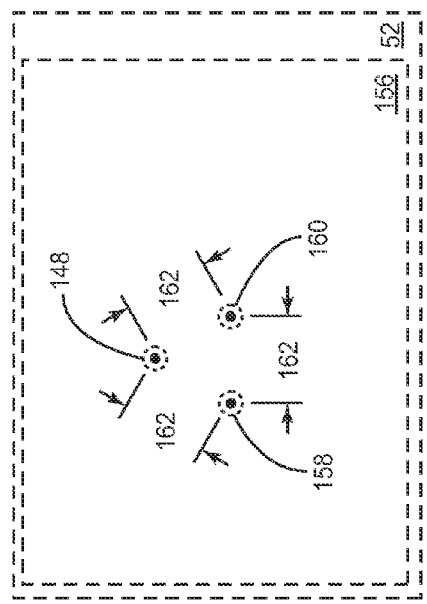
Figure 28D:
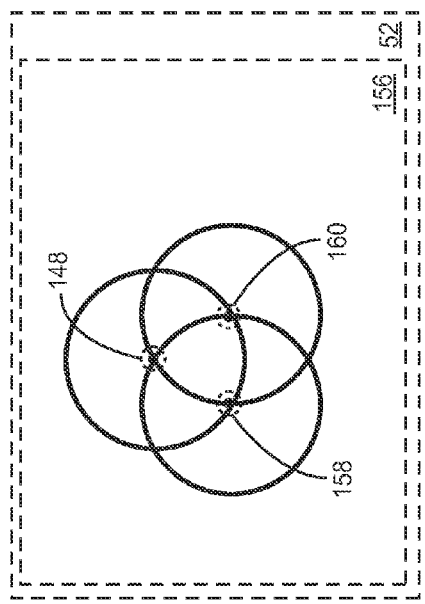

FIG. 28A shows placements of the ASTNO-based transponders 148, 158, 160 in the first magnetic propagation material 52. Aggregations of spin waves are initiated simultaneously from each of the ASTNO-based transponders 148, 158, 160. The aggregations of spin waves have simultaneous aggregated wave-fronts 164 as illustrated in FIG. 28B. Each of the simultaneous aggregated wave-fronts 164 reaches two of the ASTNO-based transponders 148, 158, 160 simultaneously, as illustrated in FIG. 28C. The simultaneous reception of two of the simultaneous aggregated wave-fronts 164 triggers each of the ASTNO-based transponders 148, 158, 160 to simultaneously re-initiate aggregations of spin waves, as illustrated in FIG. 28D. In this regard, the ASTNO-based transponders 148, 158, 160 may continuously re-initiate aggregations of spin waves to form a reverberating memory cell.

A reverberation rate of the first reverberating memory cell 156 is based on the propagation velocity of the aggregations of spin waves and the separation distance 162. As the separation distance 162 decreases, the reverberation rate increases. As such, the first reverberating memory cell 156 may function as a spin wave oscillator having an oscillation frequency at the reverberation rate.

FIG. 29 shows the topwise cross-section TWOS of the ASTNO structure 40 illustrated in FIG. 5 according to an alternate embodiment of the ASTNO structure 40. The topwise cross-section TWOS of the ASTNO structure 40 is taken inside the first magnetic propagation material 52. As such, the ASTNO structure 40 includes a reverberating memory cell array 166, which has the first reverberating memory cell 156, a second reverberating memory cell 168, and up to and including an $N^{TH}$ reverberating memory cell 170. The topwise cross-section TWOS illustrated in FIG. 29 includes portions of the reverberating memory cells 156, 168, 170 in the first magnetic propagation material 52. The second reverberating memory cell 168 and up to and including the $N^{TH}$ reverberating memory cell 170 may be similar to the first reverberating memory cell 156.

In one embodiment of the reverberating memory cell array 166, the reverberating memory cells 156, 168, 170 are used for information storage. In an alternate embodiment of the reverberating memory cell array 166, the reverberating memory cells 156, 168, 170 are used as spin wave oscillators, such that each spin wave oscillator has a corresponding oscillation frequency.

In an additional embodiment of the reverberating memory cell array 166, the reverberating memory cells 156, 168, 170 are used as spin wave oscillators, such that at least some of the reverberating memory cells 156, 168, 170 have different separation distances 162 (FIG. 28A) from one another. As such, at least some of the reverberating memory cells 156, 168, 170 have different oscillation frequencies from one another. In this regard, the reverberating memory cell array 166 may combine the functionality of spin wave oscillators with the functionality of a spin-wave locking system to provide a controllable oscillator block having multiple operating frequency regions. Each frequency region may have a basin of attraction and may be associated with a corresponding spin wave oscillator. As such, the frequency region may be based on the oscillation frequency of the spin wave oscillator, which may tend to lock on to externally applied spin waves having frequencies within the basin of attraction. Controllable oscillator blocks may be used to reproduce certain neural behaviors associated with brain functions. By reproducing processing methods of the human brain, electronic circuitry and computer systems may be able to perform tasks, such as pattern recognition, more efficiently and effectively.

FIG. 30 shows the frontwise cross-section FWCS of the ASTNO structure 40 illustrated in FIG. 5 according to an additional embodiment of the ASTNO structure 40. The ASTNO structure 40 illustrated in FIG. 30 is similar to the ASTNO structure 40 illustrated in FIG. 5 except the ASTNO structure 40 illustrated in FIG. 30 further includes intervening layers 172 over the first insulating layer 54, a second spin polarizing layer 174 over the intervening layers 172, a second conductive spacer layer 176 over the second spin polarizing layer 174, a second magnetic propagation material 178 over the second conductive spacer layer 176, and a second insulating layer 180 over the second magnetic propagation material 178. By including additional layers 172, 174, 176, 178, 180, a nano-oscillator magnetic wave propagation system 36 (FIG. 4) having increased capabilities may be provided. Spin waves may be initiated in the first magnetic propagation material 52, the second magnetic propagation material 178, or both. In this regard, capacity is increased and spin waves in the second magnetic propagation material 178 do not interfere with spin waves in the first magnetic propagation material 52, and vice versa. In alternate embodiments of the ASTNO structure 40, any or all of the layers 48, 50, 52, 54, 172, 174, 176, 178, 180 may be omitted; additional layers (not shown) may be added, or both.

FIG. 31 shows details of the ASTNO structure 40 illustrated in FIG. 30 according to one embodiment of the ASTNO structure 40. The ASTNO structure 40 illustrated in FIG. 31 includes the second group 146 of ASTNOs, such that all of the second group 146 of ASTNOs share the second spin polarizing layer 174, the second conductive spacer layer 176, the second magnetic propagation material 178, and the second insulating layer 180. Each of the second group 146 of ASTNOs is disposed about the second emanating point 150. In one embodiment of the ASTNO structure 40, the second emanating point 150 is the second centroid, such that each of the second group 146 of ASTNOs is about equidistantly located from the second emanating point 150.

In one embodiment of the ASTNO structure 40, the ASTNO structure 40 has a second group of point contacts on the second magnetic propagation material 178. Each of the second group of point contacts is disposed about the second emanating point 150 in the second magnetic propagation material 178.

In a first embodiment of the ASTNO structure 40, during the first wave propagation state, each of the second group of point contacts and a corresponding portion of the second magnetic propagation material 178 provide the second group 146 of ASTNOs. Further, during the first wave propagation state, each of the second group 146 of ASTNOs initiates spin waves 24 (FIG. 6) through the second magnetic propagation material 178, such that a portion of the spin waves 24 (FIG. 6) from each of the second group 146 of ASTNOs combine to produce the second aggregation 152 of spin waves emanating from the second emanating point 150. During the first wave propagation state, each of the second group 146 of ASTNOs may about simultaneously initiate spin waves 24 (FIG. 6) through the second magnetic propagation material 178.

In a first embodiment of the control circuitry 38 (FIG. 4), during operation, the control circuitry 38 (FIG. 4) selects one of the first wave propagation state, a second wave propagation state, and the non-wave propagation state. In a second embodiment of the control circuitry 38 (FIG. 4), during operation, the control circuitry 38 (FIG. 4) selects one of the first wave propagation state, the second wave propagation state, both the first and the second wave propagation states, and the non-wave propagation state.

During the second wave propagation state, each of the second group of point contacts and a corresponding portion of the second magnetic propagation material 178 provide the second group 146 of ASTNOs. Further, during the second wave propagation state, each of the second group 146 of ASTNOs initiates spin waves 24 (FIG. 6) through the second magnetic propagation material 178, such that a portion of the spin waves 24 (FIG. 6) from each of the second group 146 of ASTNOs combine to produce the second aggregation 152 of spin waves emanating from the second emanating point 150. During the second wave propagation state, each of the second group 146 of ASTNOs may about simultaneously initiate spin waves 24 (FIG. 6) through the second magnetic propagation material 178.

Mathematical modeling of the nano-oscillator magnetic wave propagation system 36 is presented. The mathematical modeling may be based on the Landau-Lifshitz-Gilbert equation in thin film ferromagnetic films with an additional positive damping term corresponding to torque from a polarized current to a magnetic film. Let M denote the magnetization vector in the thin film, then if an external magnetic field is applied, the spin-magnetic moments will initially precess around the direction of the applied field, and eventually align with the field as the result of damping. An applied polarized current of a certain polarity will cause a negative damping, and if the applied current exceeds a certain threshold ($j > j_{crit}$), then a spin-wave excitation will be created. This is described by the equation:

$$\frac{\partial M}{\partial t} = -|\gamma|\mu_0 M \times H_{\text{eff}} - \alpha \frac{|\gamma|\mu_0}{M_S} M \times (M \times H_{\text{eff}}) + \beta(x)(M \times M \times m_p),$$ (Eq. 3)

where the precession (first term) and damping (second term) are controlled by the effective field $H_{\text{eff}}$, being the sum of the applied field, the demagnetizing field, and the exchange field, $$H_{\text{eff}} = H_0 z - M_z z + \frac{D}{|\gamma|\mu_0 M_S \hbar} \nabla^2 M.$$ (Eq. 4)

and the spin-torque (third term) is controlled by the spin polarization direction of the applied current, $m_p$. $M_s$ is the saturation magnetization of the free layer. No variations in the z-component are considered since the model is described in two dimensions. The free layer may be thin compared with the exchange length so that it is reasonable to neglect variations of the magnetization in the z direction. The function $\beta(x)$ is a Heaviside function defining the contact sizes and locations. Furthermore, the function $\beta$ depends on the current intensity, the layer thickness and the spin polarization. We define dimensionless parameters $$m = \frac{M}{M_S} = (m_x, m_y, m_z), \tau = \frac{\omega_M}{2\pi} t, x' = \frac{x}{l_{ex}}$$

where $\omega_M = 2\pi\gamma\mu_0 M_s$ is the Larmor frequency for an applied field $M_s$ and $l_{ex}$ is the exchange length. Equation 3 can be rewritten as $$\frac{\partial m}{\partial \tau} = -(h - m_z) m \times z - m \times \nabla^2 m) +$$ (Eq. 5)
$$\alpha(h - m_z) m \times (m \times z) - \alpha m \times (m \times \nabla^2 m) + \beta'(x') m \times (m \times m_p)$$

Where $h = H_0/M_s$, $m_z = M_z/M_s$ and $\beta'(x') = \beta(x)/(|\gamma|\mu_0)$. Since the magnetization vector $m = M/M_s$ lies on the unit sphere we consider the components of m as:

$$m = m_x + i m_y, m_z = \sqrt{1 - |m|^2}$$

With these notations the Landau-Lifshitz equation takes the form of a nonlinear Schrödinger equation:

$$\frac{\partial m}{\partial \tau} = -m\nabla^2 m_z + (m_z + i\alpha)\nabla^2 m -$$ (Eq. 6)
$$(m_z - h)m - i\alpha(h - m_z)m_z m + \alpha(|\nabla m_z| + |\nabla^2 m|)m +$$
$$i\beta'(x')[(m_z m)m_{pz} + (m_x m_y - (m_z^2 + m_y^2))m_{px}) +$$
$$(m_x m_y - (m_z^2 + m_y^2))m_{px}]$$
$$\frac{\partial m_z}{\partial \tau} = -[m(m^* \nabla^2 m) + \alpha(h - m_z)|m|^2 +$$
$$\alpha[\nabla^2 m_z + (|\nabla m_z|^2 + |\nabla m_z|^2)m_z]$$
$$\beta'(x')[|m|^2 m_{pz} - (m_x m_z)m_{px} + (m_y m_z)m_{py}],$$

where $\nabla^2$ denotes the 2-dimensional Laplacian. To have an overall idea of the dimensionless parameters, a permalloy film with a saturation magnetization of about 640 KA/m is considered. Thus, the Larmor frequency, $\omega_M$, is about $2\pi \cdot 23$ GHz, the exchange length, $l_{ex}$, is about 6 nanometers, and the dimensionless damping, $\alpha$, is of order $10^{-2}$. In one embodiment of the ASTNO structure 40 (FIG. 5), the spin-wave wave-fronts 98, 100, 102, 104 illustrated in FIG. 9D are governed by the nonlinear Schrödinger equation illustrated above.

Applying a small parameter perturbation analysis ($m = a\tilde{m}$ for a $\ll 1$) and linearizing Eq. 6, provides:

$$\iota \frac{\partial \tilde{m}}{\partial t} = (1 + \iota\alpha)\nabla^2 \tilde{m} - (h - 1)\tilde{m} - \iota\alpha(h - 1)\tilde{m}.$$ (Eq. 7)

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A nano-oscillator magnetic wave propagation system comprising:
   control circuitry adapted to during a first wave propagation state, receive a first plurality of exiting excitation currents via a first plurality of point contacts; and
   an aggregated spin-torque nano-oscillator (ASTNO) structure comprising a first magnetic propagation material, wherein:
      each of the first plurality of point contacts is on the first magnetic propagation material and is disposed about a first emanating point in the first magnetic propagation material; and
      during the first wave propagation state, each of the first plurality of point contacts and a corresponding portion of the first magnetic propagation material provide a corresponding one of a first plurality of ASTNOs adapted to initiate spin waves through the first magnetic propagation material, such that a portion of the spin waves from each of the first plurality of ASTNOs combine to produce a first aggregation of spin waves emanating from the first emanating point.

2. The nano-oscillator magnetic wave propagation system of claim 1 wherein during the first wave propagation state, each of the first plurality of ASTNOs is further adapted to simultaneously initiate the spin waves though the first magnetic propagation material.

3. The nano-oscillator magnetic wave propagation system of claim 2 wherein:
   the spin waves from each of the first plurality of ASTNOs have a corresponding spin-wave wave-front with a corresponding wave-front amplitude; and
   the first aggregation of spin waves has a first aggregated spin-wave wave-front with a first aggregated wave-front amplitude, which is greater than each corresponding wave-front amplitude.

4. The nano-oscillator magnetic wave propagation system of claim 3 wherein:
   a portion of the spin waves from each of the first plurality of ASTNOs combine to produce a plurality of partially aggregated spin waves, such that each of the plurality of partially aggregated spin waves has a corresponding partially aggregated spin-wave wave-front with a corresponding partially aggregated wave-front amplitude; and
   the first aggregated wave-front amplitude is greater than each corresponding partially aggregated wave-front amplitude.

5. The nano-oscillator magnetic wave propagation system of claim 4 wherein:
   the first aggregated spin-wave wave-front is detected;
   none of the corresponding spin-wave wave-fronts are detected; and
   none of the corresponding partially aggregated spin-wave wave-fronts are detected.

6. The nano-oscillator magnetic wave propagation system of claim 1 wherein:
   the control circuitry is further adapted to select between the first wave propagation state and a non-wave propagation state;
   the first magnetic propagation material has a first plurality of magnetic moments;
   during the non-wave propagation state, the first magnetic propagation material is adapted to receive a first polarizing magnetic field;
   during the non-wave propagation state, the first plurality of magnetic moments are substantially oriented based on the first polarizing magnetic field; and
   during the first wave propagation state, the spin waves initiated from the first plurality of ASTNOs propagate through the first magnetic propagation material by magnetically coupling to nearby magnetic moments in the first magnetic propagation material.

7. The nano-oscillator magnetic wave propagation system of claim 1 wherein each of the first plurality of point contacts is about equidistantly located from the first emanating point in the first magnetic propagation material, such that the first emanating point is a first centroid.

8. The nano-oscillator magnetic wave propagation system of claim 1 wherein:
   the first magnetic propagation material has a first plurality of magnetic moments;
   during the first wave propagation state, the first plurality of ASTNOs is adapted to have a first plurality of spin-polarized excitation currents;
   each of the first plurality of ASTNOs has a corresponding one of the first plurality of spin-polarized excitation currents;
   each of the first plurality of spin-polarized excitation currents exerts spin-torque on a corresponding portion of the first plurality of magnetic moments; and
   each of the first plurality of spin-polarized excitation currents provides a corresponding one of the first plurality of exiting excitation currents via a corresponding one of the first plurality of point contacts.

9. The nano-oscillator magnetic wave propagation system of claim 1 wherein:
   during the first wave propagation state, the first plurality of ASTNOs is adapted to have a first plurality of spin-polarized excitation currents;
   each of the first plurality of ASTNOs has a corresponding one of the first plurality of spin-polarized excitation currents; and
   each of the first plurality of spin-polarized excitation currents provides a corresponding one of the first plurality of exiting excitation currents via a corresponding one of the first plurality of point contacts.

10. The nano-oscillator magnetic wave propagation system of claim 1 wherein the first magnetic propagation material is bulk material, such that the first aggregation of spin waves propagates in three dimensions.

11. The nano-oscillator magnetic wave propagation system of claim 1 wherein the first magnetic propagation material is planar material having a first planar surface and a second planar surface, which is about parallel to and opposite from the first planar surface, such that the first aggregation of spin waves propagate predominantly in two dimensions.

12. The nano-oscillator magnetic wave propagation system of claim 1 further comprising a first spin-wave detector wherein:
   the first spin-wave detector and the first plurality of ASTNOs share the first magnetic propagation material; and
   during the first wave propagation state, the first spin-wave detector is adapted to receive a portion of the first aggregation of spin waves.

13. The nano-oscillator magnetic wave propagation system of claim 12 wherein:
   the nano-oscillator magnetic wave propagation system is a spin-wave based communications system adapted to during the first wave propagation state, convey information from the first plurality of ASTNOs to the first spin-wave detector; and the first aggregation of spin waves is a first aggregation of modulated spin waves, such that modulation of the first aggregation of modulated spin waves is based on the information.

14. The nano-oscillator magnetic wave propagation system of claim 12 wherein:
the nano-oscillator magnetic wave propagation system is a spin-wave based measurement system, which is adapted to measure effects of a physical entity upon the portion of the first aggregation of spin waves to provide measured effects; and
the measured effects are based on detection of the portion of the first aggregation of spin waves by the first spin-wave detector.

15. The nano-oscillator magnetic wave propagation system of claim 12 wherein:
the nano-oscillator magnetic wave propagation system is a spin-wave locking system;
the first spin-wave detector is a first spin-torque nano-oscillator (STNO); and
the first STNO is adapted to during the first wave propagation state:
initiate spin waves through the first magnetic propagation material; and
lock to the portion of the first aggregation of spin waves.

16. The nano-oscillator magnetic wave propagation system of claim 1 further comprising a first spin-wave wave-front detector wherein:
the nano-oscillator magnetic wave propagation system is a spin-wave wave-front based system;
the first spin-wave wave-front detector and the first plurality of ASTNOs share the first magnetic propagation material;
the first aggregation of spin waves has a first aggregated spin-wave wave-front;
during the first wave propagation state, the first spin-wave wave-front detector is adapted to receive a portion of the first aggregated spin-wave wave-front; and
during the first wave propagation state, the nano-oscillator magnetic wave propagation system is adapted to detect the portion of the first aggregated spin-wave wave-front.

17. The nano-oscillator magnetic wave propagation system of claim 16 further comprising a memristic device wherein:
the memristic device is adapted to operate in one of a high resistance state and a low resistance state; and
detection of the first aggregated spin-wave wave-front is based on the memristic device switching from the high resistance state to the low resistance state.

18. The nano-oscillator magnetic wave propagation system of claim 16 wherein the nano-oscillator magnetic wave propagation system is a spin-wave based polychronous wave propagation system, which is adapted to provide polychronous activity that is analogous to polychronous activity in a brain.

19. The nano-oscillator magnetic wave propagation system of claim 1 wherein the ASTNO structure further has a second plurality of point contacts on the first magnetic propagation material, such that:
each of the second plurality of point contacts is disposed about a second emanating point in the first magnetic propagation material; and
during the first wave propagation state, each of the second plurality of point contacts and a corresponding portion of the first magnetic propagation material provide a second plurality of ASTNOs adapted to initiate spin waves through the first magnetic propagation material, such that a portion of the spin waves from each of the second plurality of ASTNOs combine to produce a second aggregation of spin waves emanating from the second emanating point.

20. The nano-oscillator magnetic wave propagation system of claim 19 further comprising a first spin-wave wave-front detector wherein:
the nano-oscillator magnetic wave propagation system is a spin-wave wave-front based system;
the first spin-wave wave-front detector, the first plurality of ASTNOs, and the second plurality of ASTNOs share the first magnetic propagation material;
the first aggregation of spin waves has a first aggregated spin-wave wave-front, which has a first aggregated wave-front amplitude;
the second aggregation of spin waves has a second aggregated spin-wave wave-front, which has a second aggregated wave-front amplitude;
during the first wave propagation state, the first spin-wave wave-front detector is adapted to simultaneously receive a portion of the first aggregated spin-wave wave-front and a portion of the second aggregated spin-wave wave-front;
the portion of the first aggregated spin-wave wave-front and the portion of the second aggregated spin-wave wave-front combine to form a combined wave-front having an aggregated amplitude;
the aggregated amplitude is larger than the first aggregated wave-front amplitude;
the aggregated amplitude is larger than the second aggregated wave-front amplitude and
during the first wave propagation state, the nano-oscillator magnetic wave propagation system is adapted to detect the combined wave-front.

21. The nano-oscillator magnetic wave propagation system of claim 1 wherein the ASTNO structure further comprises a second magnetic propagation material and has a second plurality of point contacts on the second magnetic propagation material, such that:
each of the second plurality of point contacts is disposed about a second emanating point in the second magnetic propagation material; and
during the first wave propagation state, each of the second plurality of point contacts and a corresponding portion of the second magnetic propagation material provide a corresponding one of a second plurality of ASTNOs adapted to initiate spin waves through the second magnetic propagation material, such that a portion of the spin waves from each of the second plurality of ASTNOs combine to produce a second aggregation of spin waves emanating from the second emanating point.

22. A method comprising:
providing a first magnetic propagation material, wherein:
a first plurality of point contacts is on the first magnetic propagation material; and
each of the first plurality of point contacts is disposed about a first emanating point in the first magnetic propagation material;
selecting one of a first wave propagation state and a non-wave propagation state; and
during the first wave propagation state:
receiving a first plurality of exiting excitation currents via the first plurality of point contacts;
providing a first plurality of ASTNOs; and
initiating spin waves through the first magnetic propagation material from each of the first plurality of ASTNOs, such that a portion of the spin waves from each of the first plurality of ASTNOs combine to produce a first aggregation of spin waves emanating from the first emanating point.

* * * * *